United States Patent [19]

Lan et al.

[11] Patent Number: 5,787,099
[45] Date of Patent: Jul. 28, 1998

[54] SYSTEM AND METHOD FOR ENCODING AND DECODING DATA USING NUMERICAL COMPUTATIONS IN GALOIS FIELDS

[75] Inventors: Steven Lan, Fremont; David H. Miller, Sacramento; Richard W. Koralek, Palo Alto, all of Calif.

[73] Assignee: Adaptec, Inc., Milpitas, Calif.

[21] Appl. No.: 542,277

[22] Filed: Oct. 12, 1995

[51] Int. Cl.$^6$ ..................................................... H03M 13/00
[52] U.S. Cl. ........................................ 371/37.07; 371/37.11; 371/37.12
[58] Field of Search .................... 371/37.1, 37.5, 371/37.2, 37.6, 37.7, 38.1, 39.1, 37.8, 37.01, 37.07, 37.08, 37.09, 37.11, 37.12, 43.5

[56] References Cited

U.S. PATENT DOCUMENTS

| | | | |
|---|---|---|---|
| Re. 34,088 | 10/1992 | Tsang et al. | 371/37.8 |
| 3,568,148 | 3/1971 | Clark | 340/146.1 |
| 4,410,989 | 10/1983 | Berlekamp | 371/40 |
| 4,413,339 | 11/1983 | Riggle et al. | 371/38 |
| 4,504,948 | 3/1985 | Patel | 371/38 |
| 4,633,470 | 12/1986 | Welch et al. | 371/37 |
| 4,763,332 | 8/1988 | Glover | 371/37 |
| 4,777,635 | 10/1988 | Glover | 371/40 |
| 4,782,490 | 11/1988 | Tenengolts | 371/40.1 |
| 4,821,268 | 4/1989 | Berlekamp | 371/37 |
| 4,833,678 | 5/1989 | Cohen | 371/37 |
| 4,839,896 | 6/1989 | Glover et al. | 371/37 |
| 4,843,607 | 6/1989 | Tong | 371/37 |
| 4,847,801 | 7/1989 | Tong | 364/746.1 |
| 4,890,287 | 12/1989 | Johnson et al. | 371/37.2 |
| 4,979,173 | 12/1990 | Geldman et al. | 371/39.1 |
| 5,107,503 | 4/1992 | Riggle et al. | 371/37.1 |
| 5,168,509 | 12/1992 | Nakamura et al. | 371/37.5 |
| 5,170,399 | 12/1992 | Cameron et al. | 371/37.1 |
| 5,241,546 | 8/1993 | Peterson et al. | 371/39.1 |
| 5,325,373 | 6/1994 | Iwamura et al. | 371/37.1 |
| 5,422,895 | 6/1995 | Nguyen et al. | 371/37.5 |

Primary Examiner—Reba I. Elmore
Assistant Examiner—Thomas E. Brown
Attorney, Agent, or Firm—Skjerven, Morrill, MacPherson, Franklin & Friel; Edward C. Kwok

[57] ABSTRACT

An integrated circuit for error correction takes advantage of a novel data representation ("tower representation") for a selected finite Galois field. Using this representation, novel circuits which utilize the hierarchical structures in the subfields of the selected finite Galois field can be constructed. In one embodiment, GF(256) multipliers, GF(256) multiplicative inverse circuits, GF(256) logarithm circuits can be constructed out of GF(16) multipliers, GF(16) multiplicative inverse circuits and other GF(16) components. These GF(16) components, in turn, can be constructed from still simpler GF(4) components. In that embodiment, a user-programmable burstlimiter is provided. In that embodiment also, a novel quadratic equation solver is provided.

19 Claims, 47 Drawing Sheets

SYSTEM AND METHOD FOR ENCODING AND DECODING DATA USING NUMERICAL COMPUTATIONS IN GALOIS FIELDS

BACKGROUND OF THE INVENTION

1. Field of the Invention

This invention relates to electronic circuits for ensuring data integrity in data storage or data communication applications; in particular, this invention relates to electronic circuits for numerical computation in Galois fields useful in such applications.

2. Discussion of the Related Art

Error correction and error detection codes have been used extensively in data communication and data storage applications. In a data communication application, data is encoded prior to transmission, and decoded at the receiver. In a data storage application, data is encoded when stored in a storage device, e.g. a disk drive, and decoded when retrieved from the storage device. For the present discussion, it is unnecessary to distinguish between these applications. Hence, although the remainder of this description describes a data storage-retrieval system, the principles discussed herein are equally applicable to a data communication application.

In a typical application of error detection and correction codes, data symbols are stored in blocks. Each such block includes a selected number of special symbols, called check symbols. A symbol may consist of a single bit or multiple bits. The check symbols in each block represent redundant information concerning the data stored in the block. When decoding the blocked data, the check symbols are used to detect both the presence and the locations of errors and, in some instances, correct these errors. The theory and applications of error correction codes are described extensively in the literature. For example, the texts (i) "Error-Correcting Codes", Second Edition, by W. Wesley Peterson and E. J. Weldon, published by the MIT Press, Cambridge, Mass. (1972), and (ii) "Practical Error Correction Design for Engineers", revised second edition, by N. Glover and T. Dudley, Cirrus Logic, Colorado, publisher (1991), are well-known to those skilled in the art.

In a typical application of error correction codes, the input data is divided into fixed-length blocks ("code words"). Each code word consists of n symbols, of which a fixed number k are data symbols, and the remaining (n–k) symbols are check symbols. (For convenience, in this description, such a code is referred to as an (n, k) code). As mentioned above, the check symbols represent redundant information about the code word and can be used to provide error correction and detection capabilities. Conceptually, each data or check symbol of such a code word represents a coefficient of a polynomial of order (n–1). In the error correcting and detecting codes of this application, the check symbols are the coefficients of the remainder polynomial generated by dividing the order (n–1) polynomial by an order (n–k) "generator" polynomial over a Galois field[1]. For an order (n–1) polynomial divided by an order (n–k) polynomial, the remainder polynomial is of order (n–k–1). Typically, in a data storage application, both the data symbols and the check symbols are stored.

[1] For a discussion of Galois fields, the reader is directed to § 6.5 in the aforementioned text "Error-Correcting Codes" by W. Peterson and E. Weldon Jr.

During decoding, both data symbols and check symbols are read from the storage medium, and one or more "syndromes" are computed from the code word (i.e. the data and the check symbols) retrieved. A syndrome is a characteristic value computed from a remainder polynomial, which is obtained by dividing the code word retrieved by the generator polynomial. Ideally, if no error is encountered during the decoding process, all computed syndromes are zero.[2] A non-zero syndrome indicates that one or more errors exist in the code word. Depending on the nature of the generator polynomial and the type of error to be detected and corrected, the encountered error may or may not be correctable.

[2] In some applications, e.g. in certain cyclic redundancy check schemes, a non-zero characteristic number results when no error is encountered. Without loss of generality, a syndrome of zero is assumed when no detectable error is encountered.

A well-known class of error correcting codes is the Reed-Solomon codes, which are characterized by the generator polynomial $G(X)$, given by:

$$G(X)=(X+\alpha^j)(X+\alpha^{j+1})(X+\alpha^{j+2}) \ldots (X+\alpha^{j+i-1})(X+\alpha^{j+i})$$

where $\alpha$ is a basis element of $GF(2^m)$ and, i and j are integers.

Because errors often occur in bursts, a technique, called "interleaving", is often used to spread the consecutive error bits or symbols into different "interleaves", which can each be corrected individually. Interleaving is achieved by creating a code word of length nw from w code words of length n. In one method for forming the new code word, the first w symbols of the new code word are provided by the first symbols of the w code words taken in a predetermined order. In the same predetermined order, the next symbol in each of the w code words is selected to be the next symbol in the new code word. This process is repeated until the last symbol of each of the w code words is selected in the predetermined order into the new code word. Another method to create a w-way interleaved code is to replace a generator polynomial $G(X)$ of an (n, k) code by the generator polynomial $G(X^w)$. This technique is applicable, for example to the Reed-Solomon codes mentioned above. Using this new generator polynomial $G(X^w)$, the resulting (nw, kw) code has the error correcting and detecting capability of the original (n, k) code in each of the w interleaves so formed.

An error detection and correction system requires extensive calculation in finite Galois fields. In the prior art, such calculation is carried out by essentially unstructured customized random logic circuits consisting of logic gates and linear feedback shift registers. These logic circuits are complicated and relatively slow.

SUMMARY OF THE INVENTION

In accordance with the present invention, an error correcting code integrated circuit using a novel data representation for calculating error detecting and correcting codes and a method for providing such an integrated circuit are provided. The novel data representation includes a hierarchical data structure such that a value in a $GF(q^2)$ finite Galois field, can be represented by two values in a $GF(q)$ finite Galois field. Consequently, logic circuits for arithmetic and logic operations in $GF(q^2)$ can be constructed out of logic circuits for logic circuits for arithmetic and logic operations in $GF(q)$. According to the present invention, novel logic circuits for multiplication, calculating multiplicative inverses, and calculating logarithms are provided, exploiting the hierarchical structure of the novel data representation.

In accordance with another aspect of the present invention, a quadratic equation solver circuit is provided.

Using this quadratic equation solver, uncorrectable errors are detected by testing the most significant bit of a characteristic value of the quadratic equation.

In accordance of another aspect of the present invention, in an interleaved implementation, additional "overall" syndromes are provided by summing (i.e. bit-wise exclusive-OR) corresponding syndromes of all the interleaves.

In accordance with an other aspect of the present invention, a burstlimiting circuit is provided which utilizes a user-programmable burstlength.

The present invention is better understood upon consideration of the detailed description below and the accompanying drawings.

BRIEF DESCRIPTION OF THE DRAWINGS

FIG. 5 shows a logic circuit for implementing register 206a.

DETAILED DESCRIPTION OF THE PREFERRED EMBODIMENTS

Figure 1A:
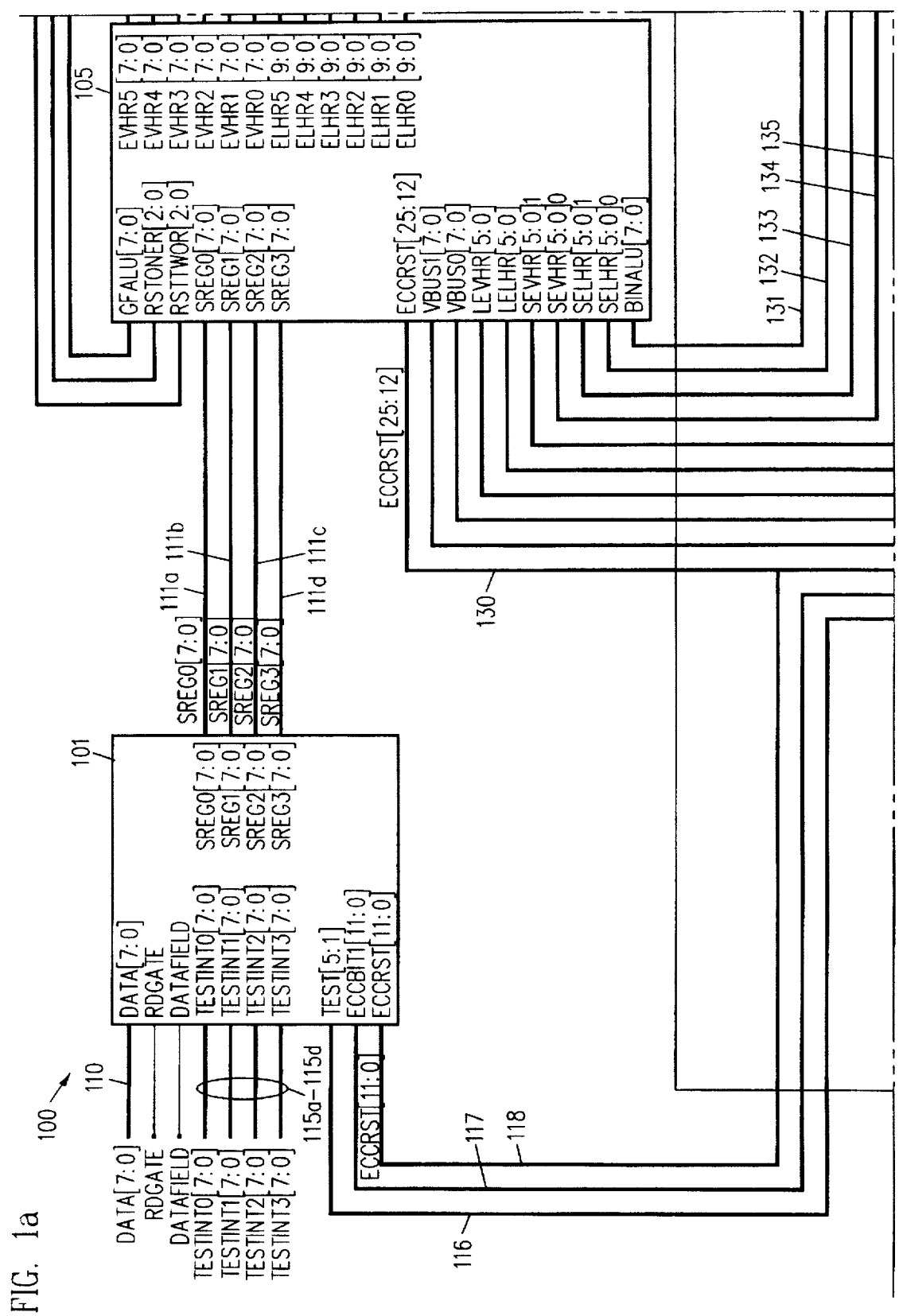
FIG. 1 is a block diagram of an integrated circuit 100, which is an embodiment of the present invention.
Figure 1B:
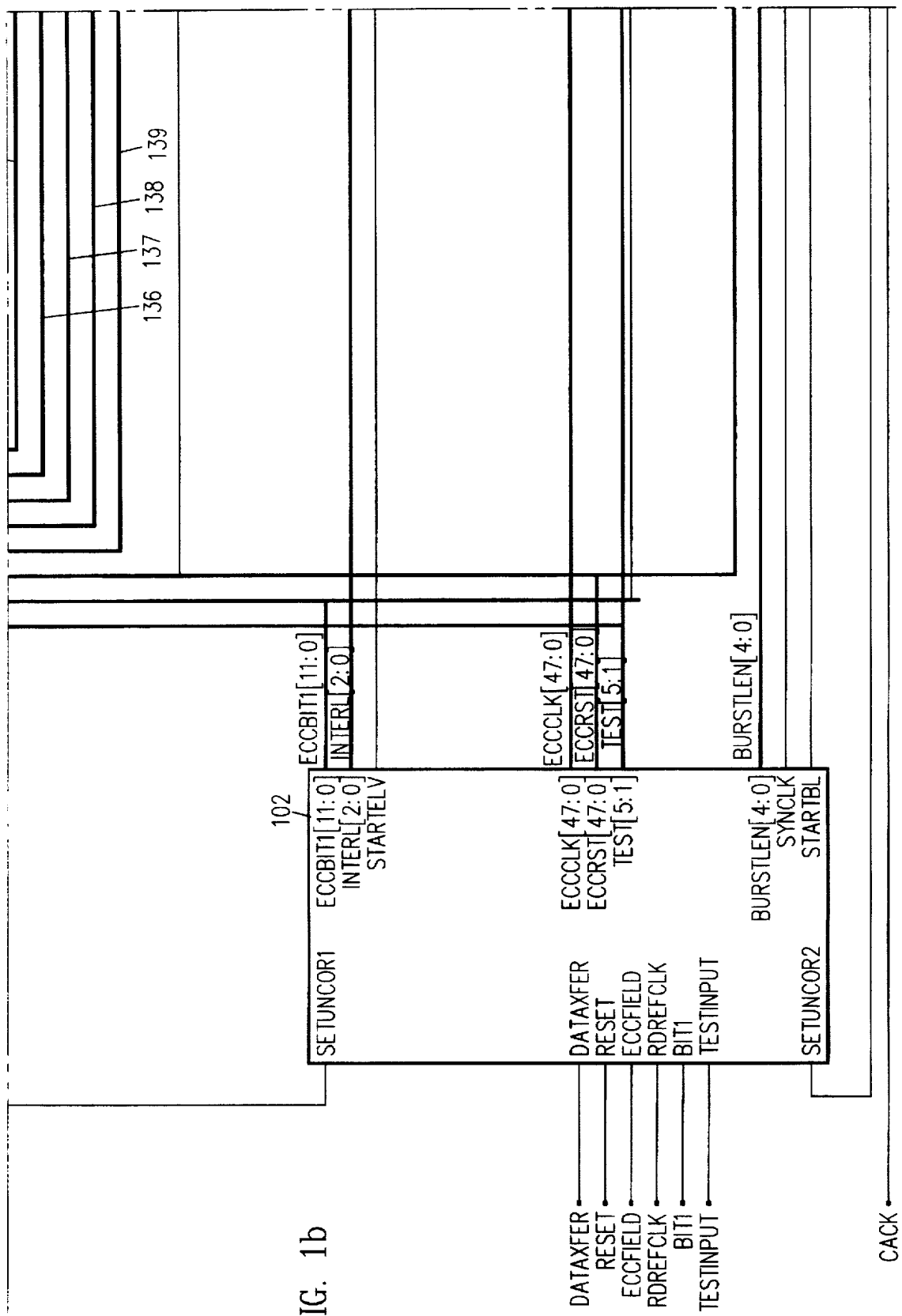
Figure 1C:
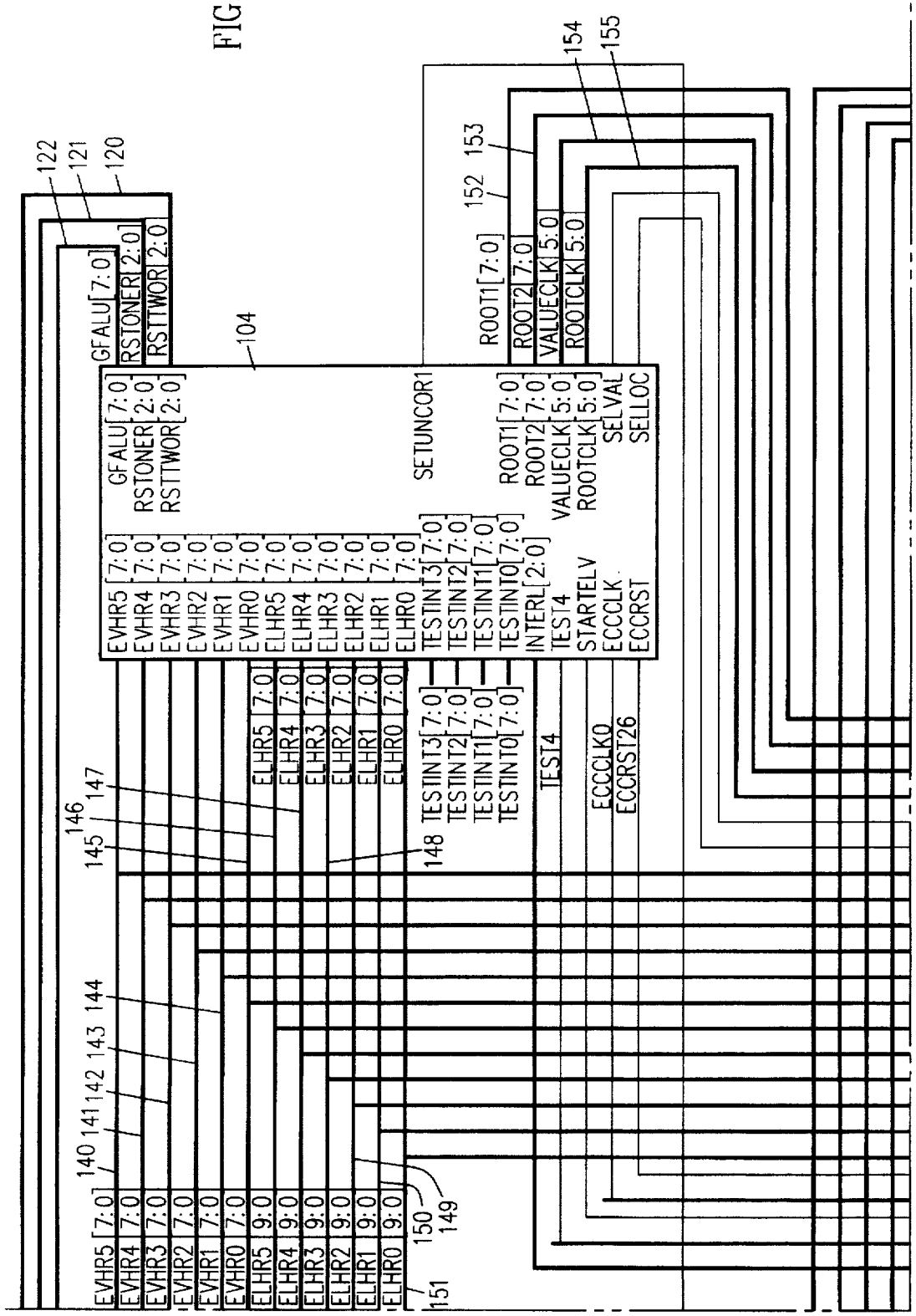
Figure 1D:
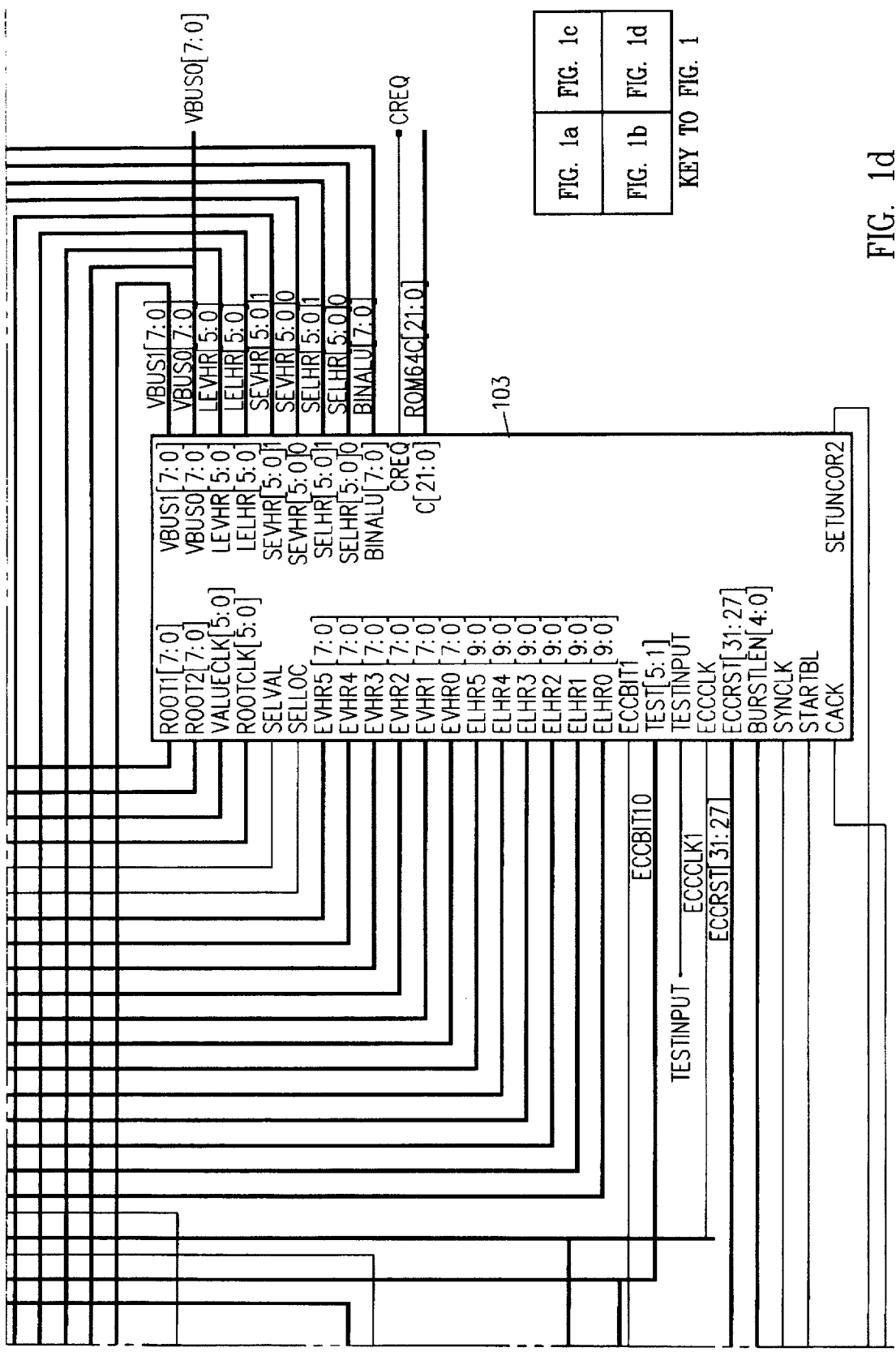
Figure 2A:
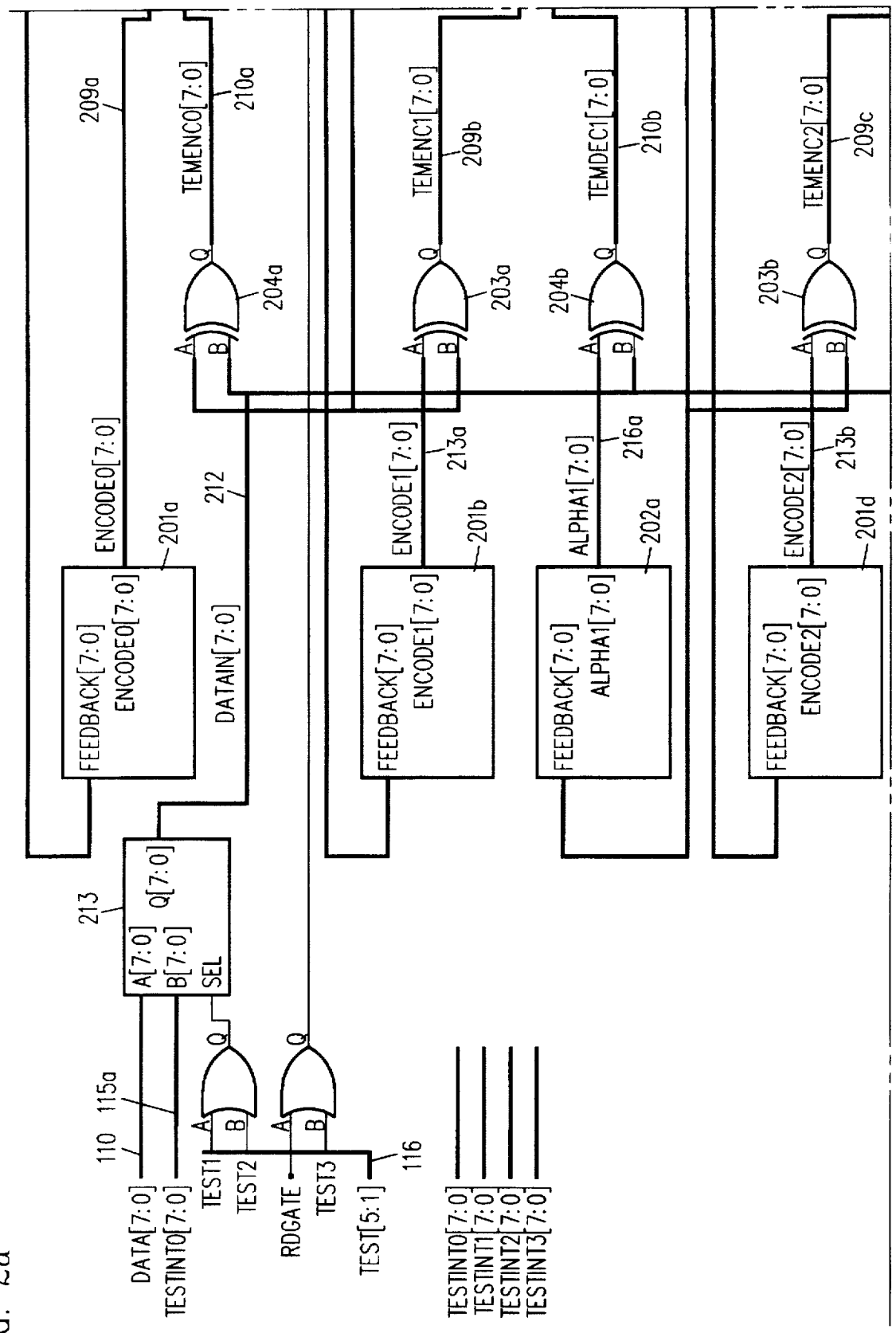
FIG. 2 is a block diagram of encoder/decoder 101 in integrated circuit 100 of FIG. 1.
Figure 2B:
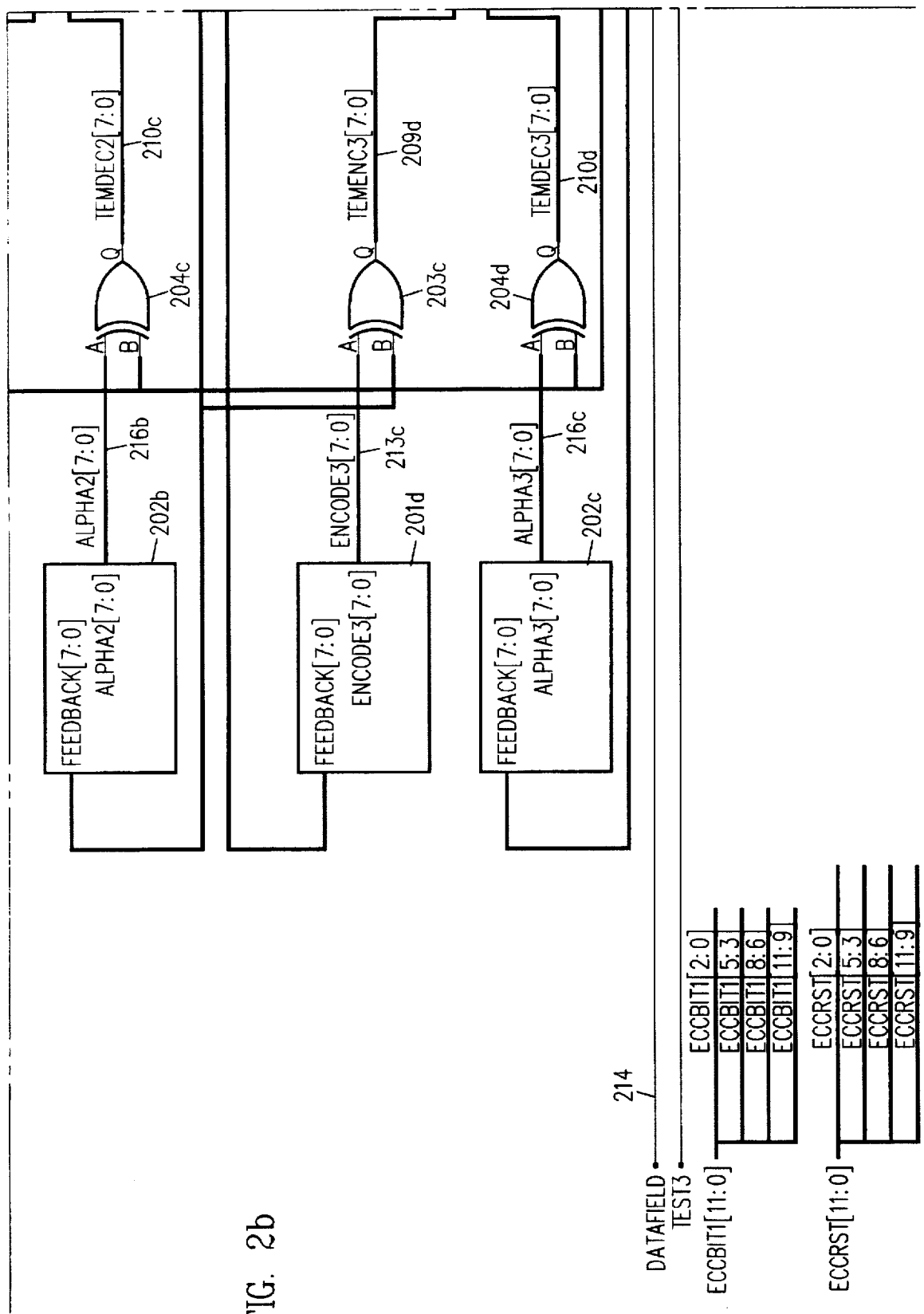
Figure 2C:
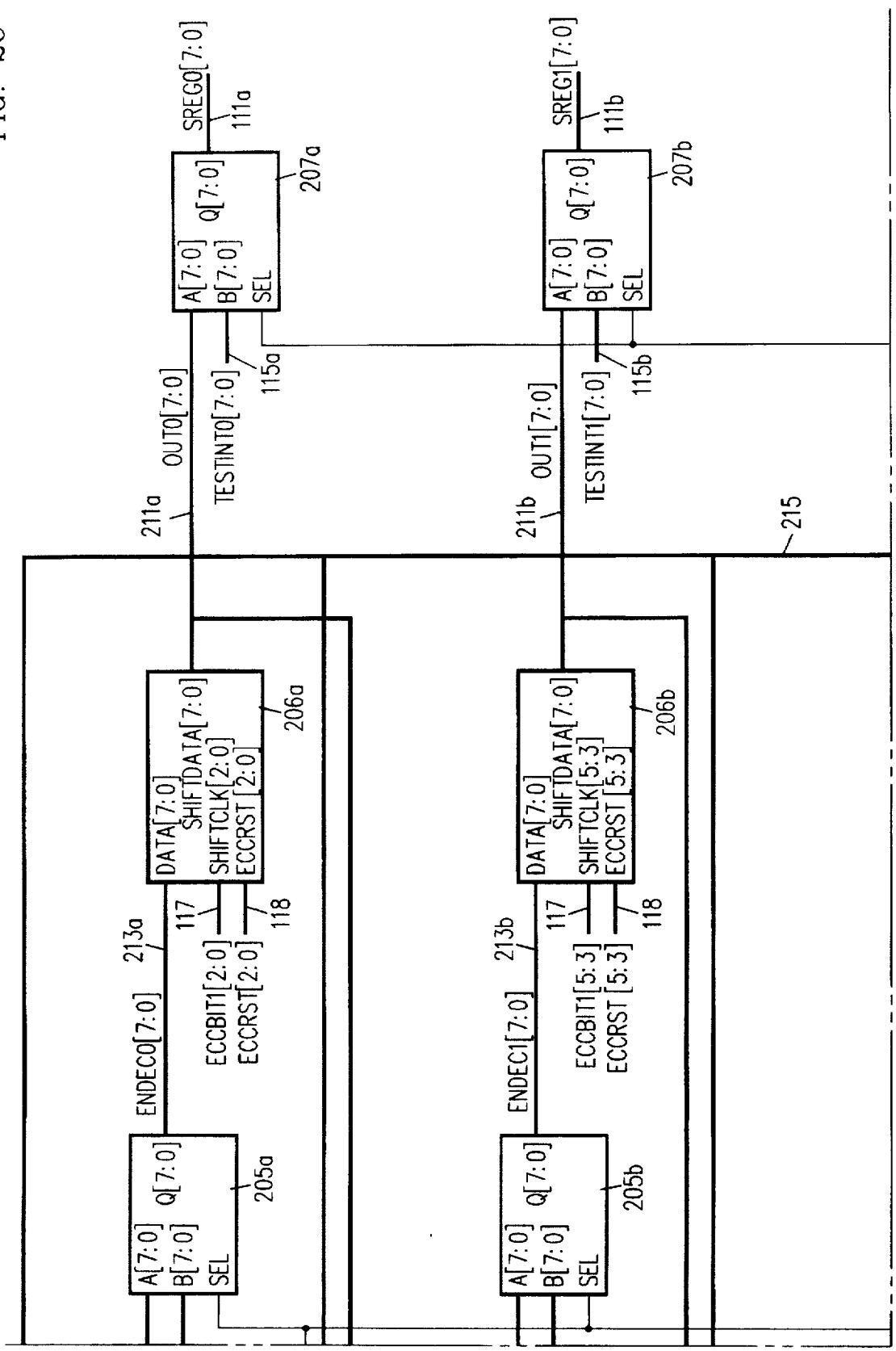
Figure 2D:
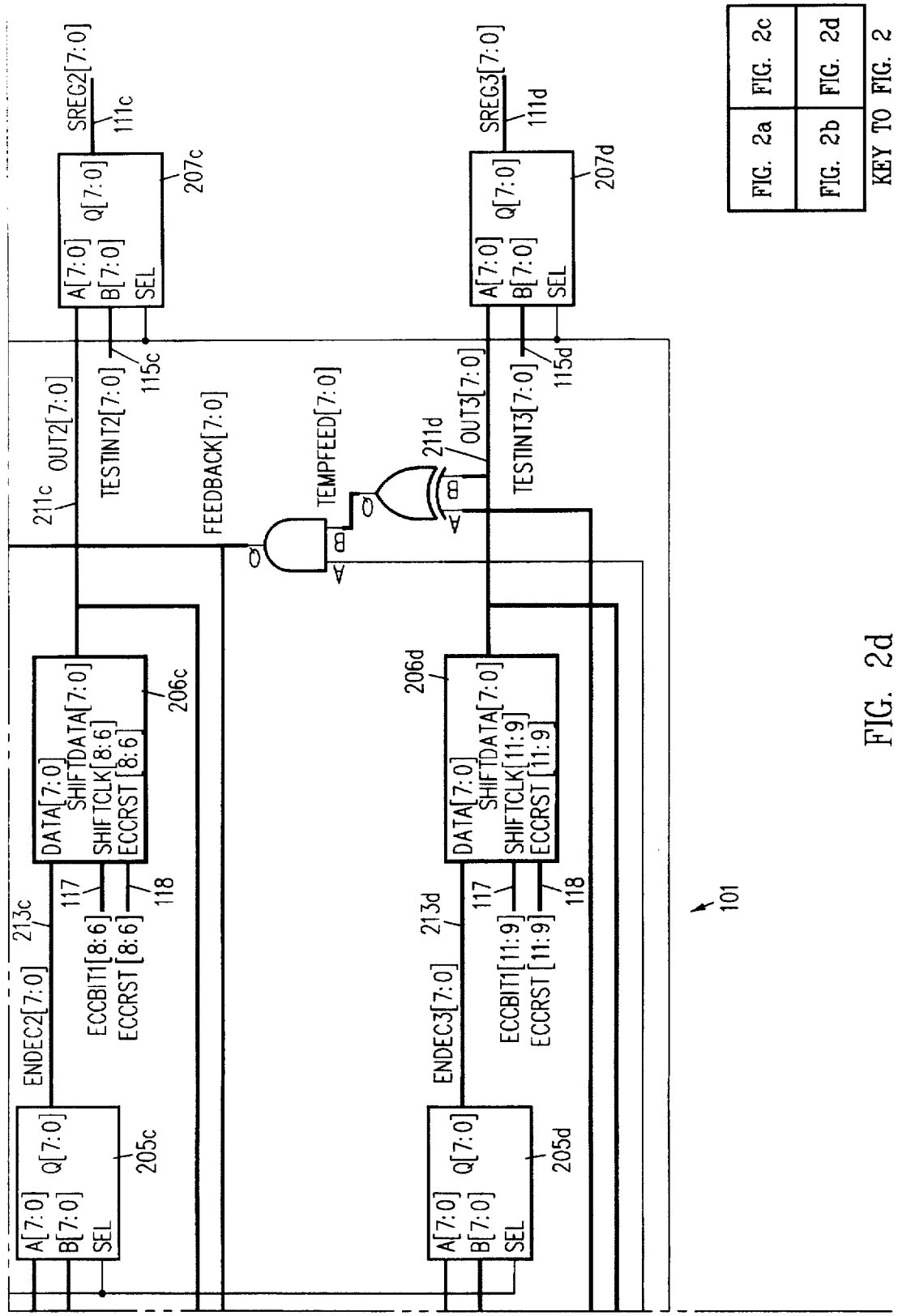
Figure 3A:
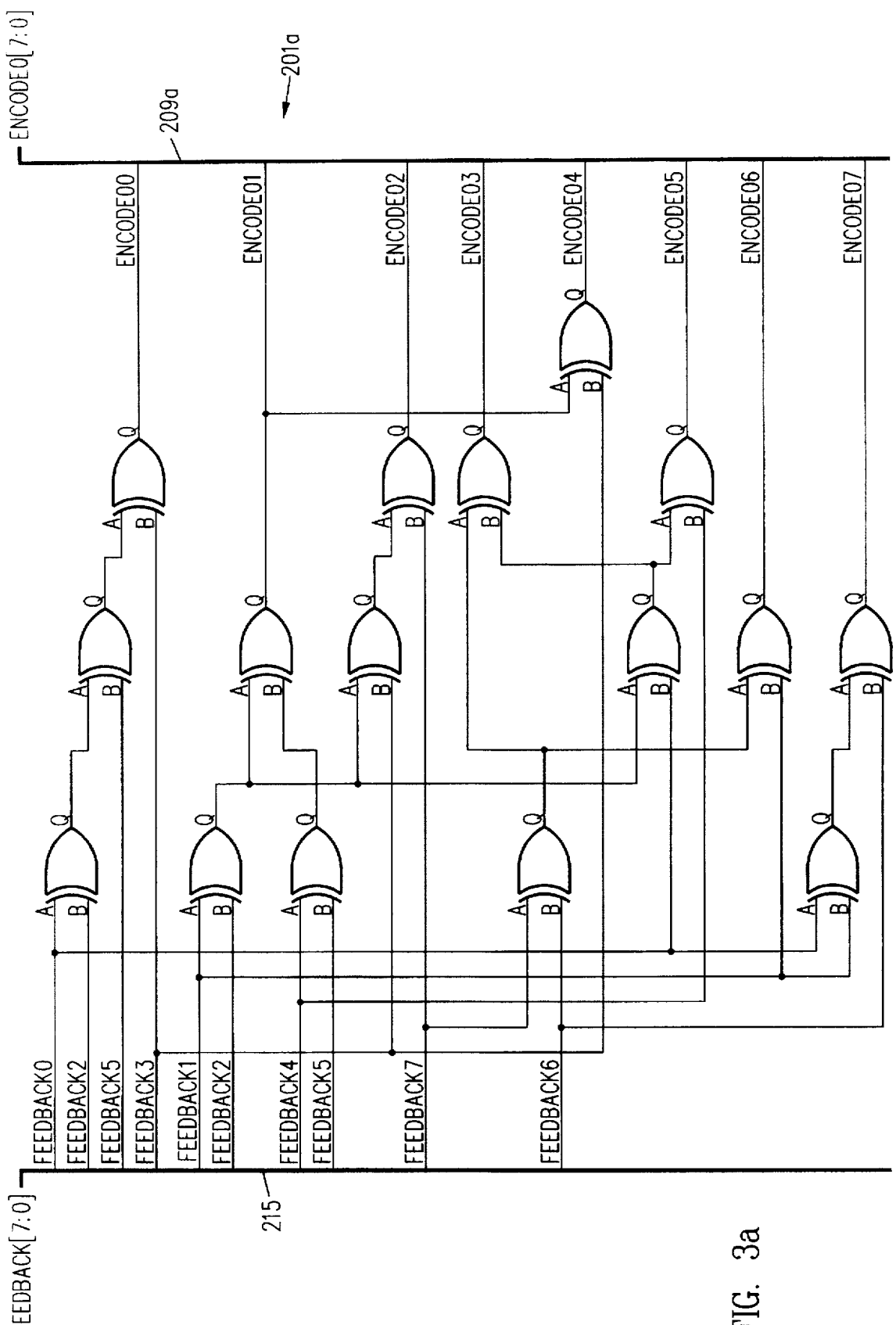
FIGS. 3a–3d provides, for this embodiment, the logic circuits implementing encoders 201a–201d, respectively.
Figure 3B:
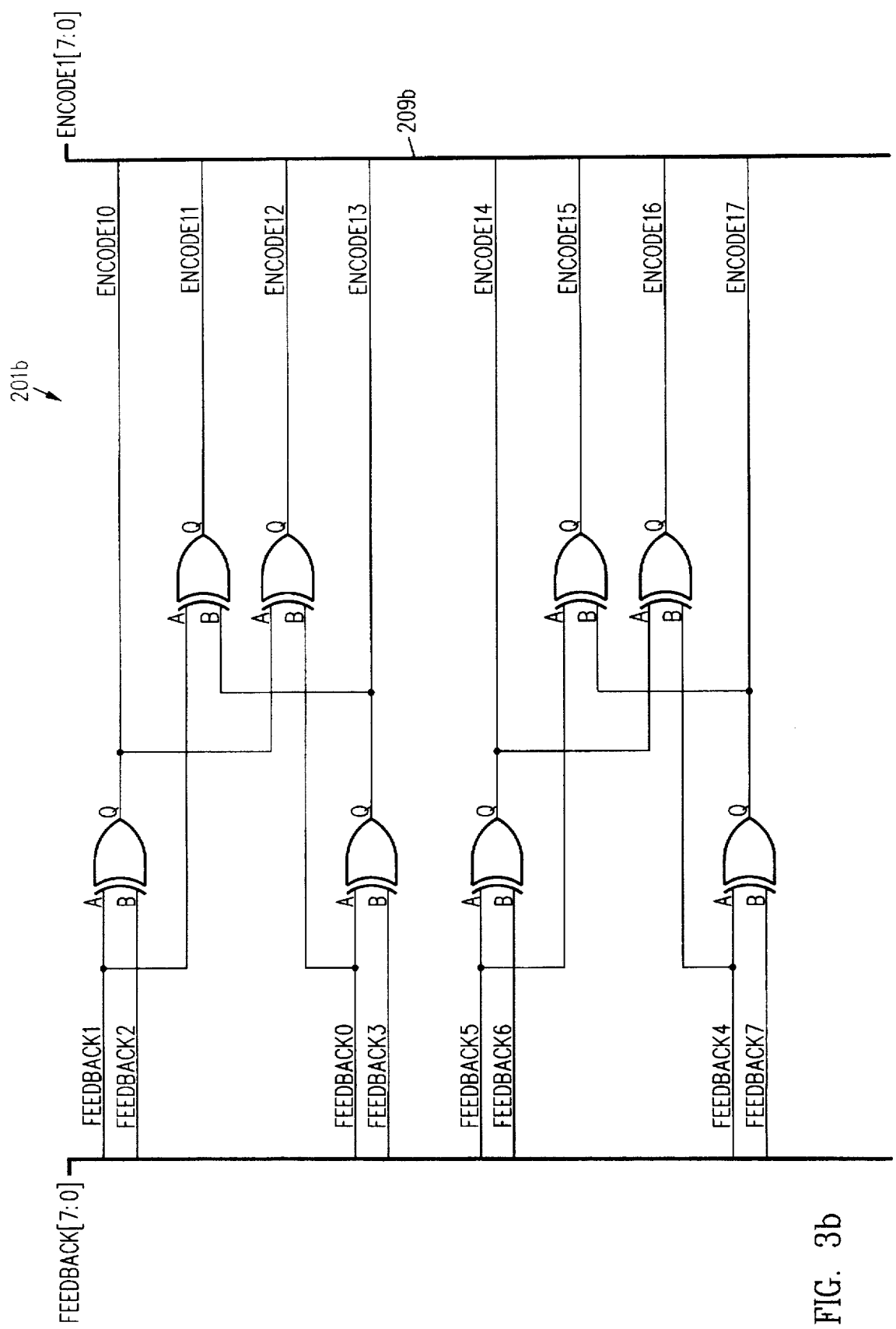
Figure 3C:
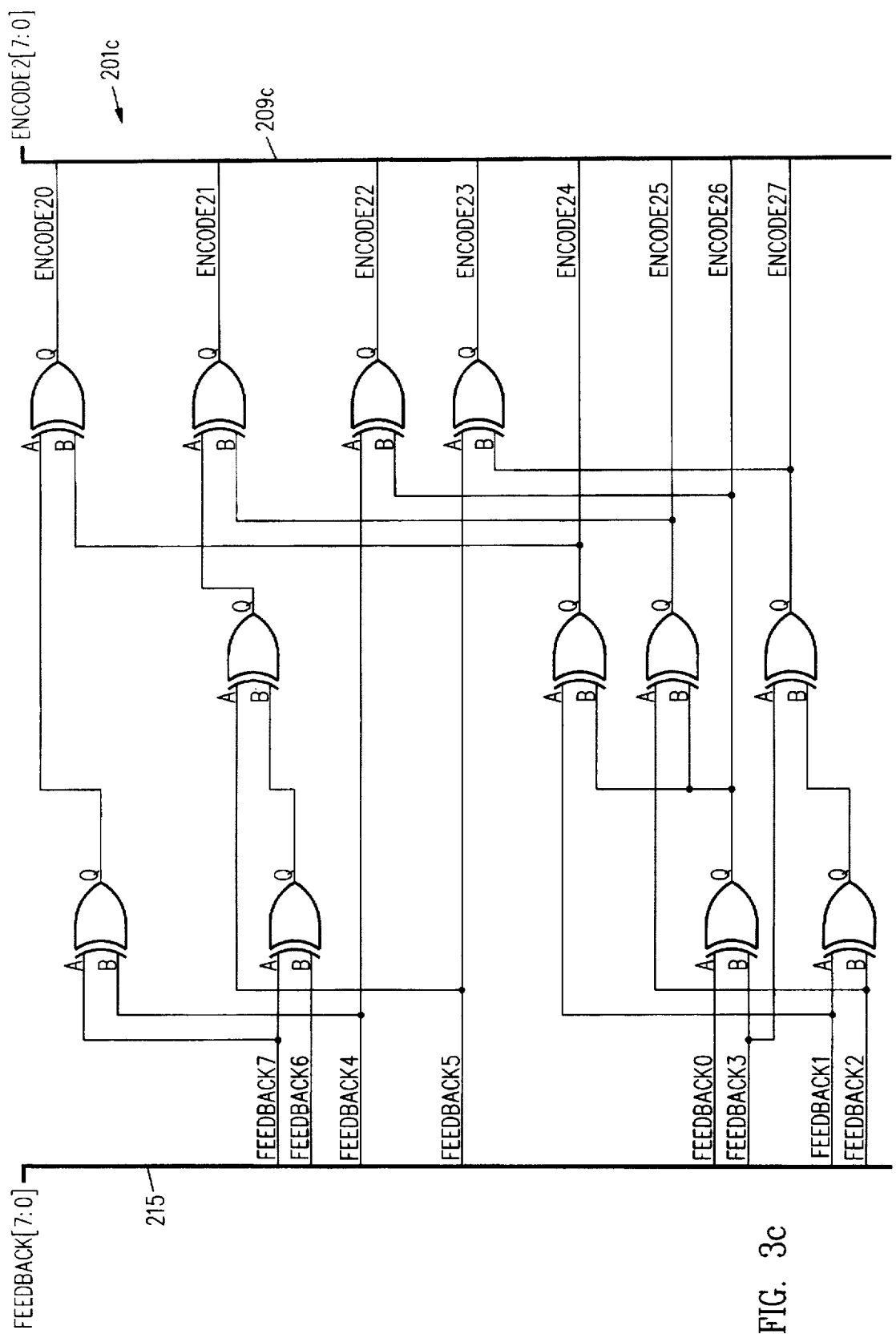
Figure 3D:
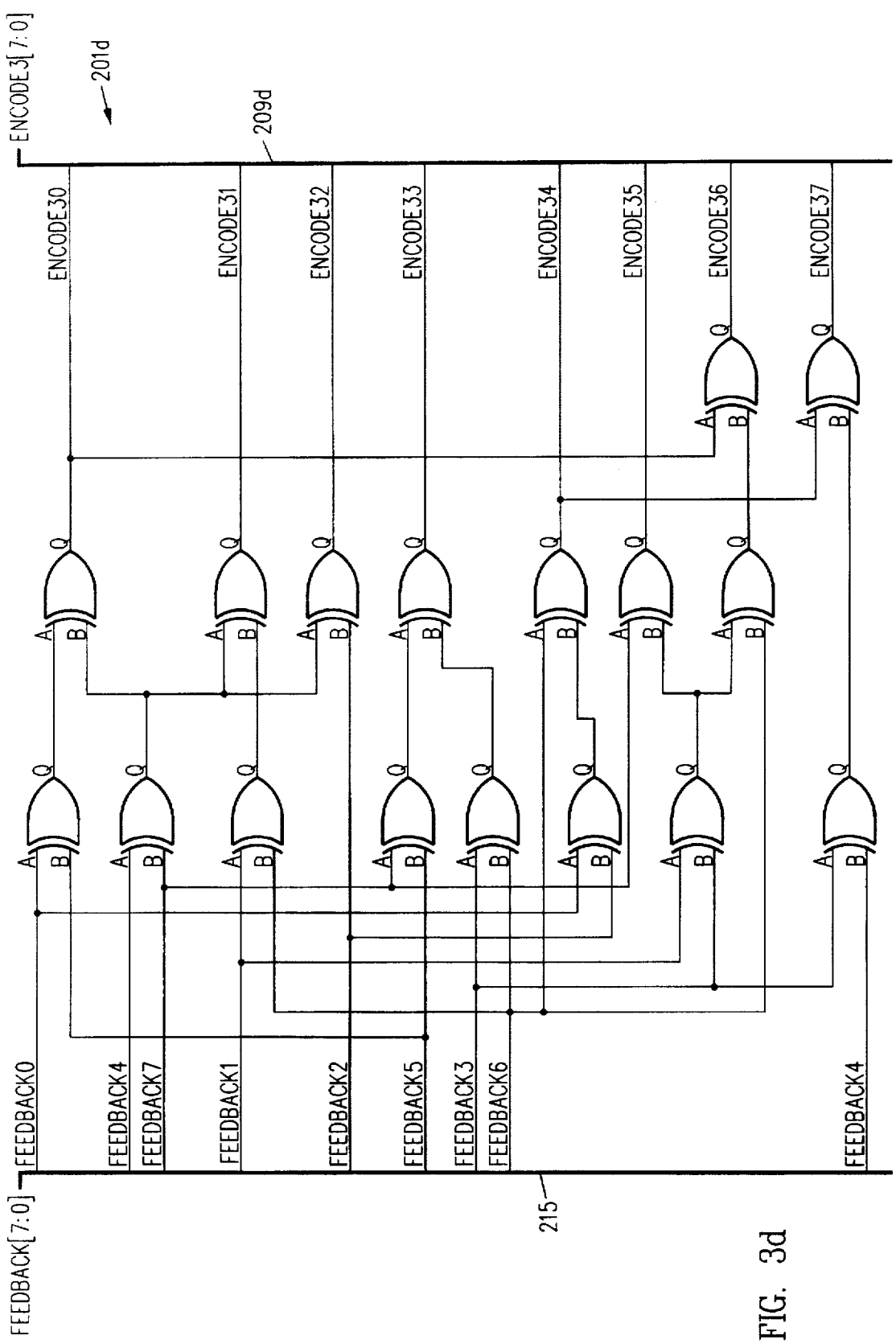

The present invention achieves computation in finite Galois fields using a full-quadratic tower representation approach ("tower representation"). As will be shown below, the circuits of the present invention under the tower representation are highly modular and carry out the multiplication, division, logarithm and solution of quadratic equation operations efficiently. Consequently, design of logic circuits in large finite Galois fields is thereby greatly simplified. Performance of such circuits are also made efficient thereby.

The present invention is applicable to Reed-Solomon codes represented by a number of bits which is a power of 2, e.g. 2, 4, 8 . . . . , $2^k$ bits, for $k \geq 1$. In the embodiment described below, 8-bit Reed-Solomon codes are used. The present invention can be, of course, extended to any Reed-Solomon Codes represented by $2^k$ bits, $k \geq 1$. In this description, a Galois field represented by m bits per element is denoted GF($2^m$). Thus, the present invention is applicable to Galois fields GF(2), GF(4), GF(16), GF(256), GF(65536), ... GF($2^{2k}$), for $k \geq 0$.

In the embodiment described below, the following Galois fields are used to illustrate the present invention:

$$GF'(2) = \{0,1\}; \quad (i)$$

$$GF'(4) = \{0,1,\beta,\beta+1\}, \quad (ii)$$

where $\beta$ is a basis element of the finite Galois field GF'(4) in which $\beta^2 + \beta + 1 = 0$;

$$GF'(16) = \{x | x = a\gamma + b; a, b \in GF'(4)\}, \quad (iii)$$

where $\gamma$ is a basis element of the finite Galois field GF'(16) in which $\gamma^2 + \gamma + \beta = 0$; and $$GF'(256) = \{x | x = c\delta + d; c, d \in GF'(16)\}, \quad (iv)$$

where $\delta$ is a basis element of the finite Galois field GF'(256) in which $\delta^2 + \delta + \epsilon = 0$, and $\epsilon = \beta\gamma + \gamma$;

In other words, using Galois fields defined in (i)–(iv) above, a GF'(4) value can be represented by two GF'(2) values, a GF'(16) value can be represented by two GF'(4) values, and a GF'(256) value can be represented by two GF'(16) values. Of course, this method of representing values in a higher order Galois field by two values of a lower Galois field can be extended ad infinitum.

FIG. 1 is a block diagram of an integrated circuit 100, which is an embodiment of the present invention. As shown in FIG. 1, integrated circuit 100 includes an encoder/decoder block 101, holding registers 105, control circuit 102, error evaluation and location block 104, and burstlimiter 103. Encoder/decoder block 101 includes an encoder which, during encoding, receives 8-bit data symbols on bus 110 to generate Reed-Solomon code words on buses 111a–111d. Encoder/decoder block 101 also includes a decoder which, during decoding, receives Reed-Solomon code words on bus 110 and provides both the decoded 8-bit data symbols and the 8-bit syndromes of the Reed-Solomon code words received. As explained above, the syndromes thus calculated are used for error detection and correction.

During decoding, after the final syndromes are computed and received into holding registers 105, circuits in error evaluation and location block 104 detects from the computed syndromes whether one or more errors have occurred and computes, when possible, the values and locations of such errors. In the present embodiment, to reduce the probability of miscorrection, not all detected errors are corrected. Burstlimiter 103, as described below, detects the occurrence of two burst errors and limits correction of errors to bursts of a predetermined length. The predetermined length is a programmable value, in accordance with the present invention.

For a three-interleve implementation, integrated circuit 100 of the present embodiment uses a generator polynomial of the form:

$$GP(X)=(X^3+1)(X^3+\alpha)(X^3+\alpha^2)(X^3+\alpha^3)$$

where $\alpha$ is a basis element of the finite Galois field over which the generator polynomial operates.

Generator polynomials and their used for generating Reed-Solomon codes are discussed in detail in copending patent application ("Copending Patent Application"), entitled "Global Parity Symbol for Interleaved Reed-Solomon Coded Data", by Frank S. Lee et al, Ser. No. 08/270,858, filed on Jul. 5, 1994, assigned to Adaptec, Incorporated, which is also the assignee of the present application. The disclosure of the Copending Patent Application is hereby incorporated by reference in its entirety. The generator polynomial of the present embodiment provides 512 data symbols and 12 check symbols. In the present embodiment, each sector is 1024 bytes. Therefore, in each 1024-byte sector, the present embodiment stores 259 undefined bytes, which is followed by 241 bytes of leading zeroes. The leading zeroes are, in turn, followed by 512 data symbols and 12 check symbols.

Encoder/decoder 101 is shown in further detail in FIG. 2. As shown in FIG. 2, encoder circuits 201a–201d each implement one factor of the generator polynomial GP shown above. During encoding, input data arrive on 8-bit data bus 110 and are selected by multiplexer 213 onto 8-bit data bus 212. Multiplexer 213 selects between data on data bus 110 and test bus 115a. Test bus 115a is provided for testing encoder/decoder circuit 101, when a test control signal on test bus 116 is asserted. During encoding, however, each 8-bit value of data bus 212 is the input data received on data bus 110, and multiplexers 205a–205d select the output data of the 8-bit values of busses 209a–209d, respectively. The 8-bit values of busses 209a–209d are, respectively, the output values of encoder 201a, and summers 203a–203c. The output values of summers 203a–203c are the sums (i.e. bitwise exclusive-ORs) of the 8-bit value on data bus 212 and each of the output 8-bit values of encoders 201b–201c, respectively. Registers 206a–206d each include three cascaded 8-bit component registers, thereby performing the task of delaying by three clock periods the output of the 8-bit value each register receives. Propagation of 8-bit values through each of registers 206a–206d is controlled by three clock signals on 3-bit bus 117. Each component register inside each of registers 206a–206d can be individually reset by a reset signal on 3-bit control bus 118.

Encoder 201a–201d each receive from data bus 215, for every clock transition on any of the three clock signals of 3-bit bus 117, the sum of the data on bus 212 and an output 8-bit value of register 206d. Encoder 201a–201d provide output 8-bit values on bus 209a and busses 213a–213c respectively, except when outputting check symbols, when the 8-bit input values to encoders 201a–201d on bus 215 are set to zero by the inactive control signal 214 ("datafield"). The output data symbols appear on 8-bit bus 211d, at every clock transition of the three clock signals of 3-bit bus 117. Each clock signal on 3-bit bus 117 corresponds to a data interleave. Multiplexers 207a–207d select the output values on busses 211a–211d respectively.

Figure 5A:
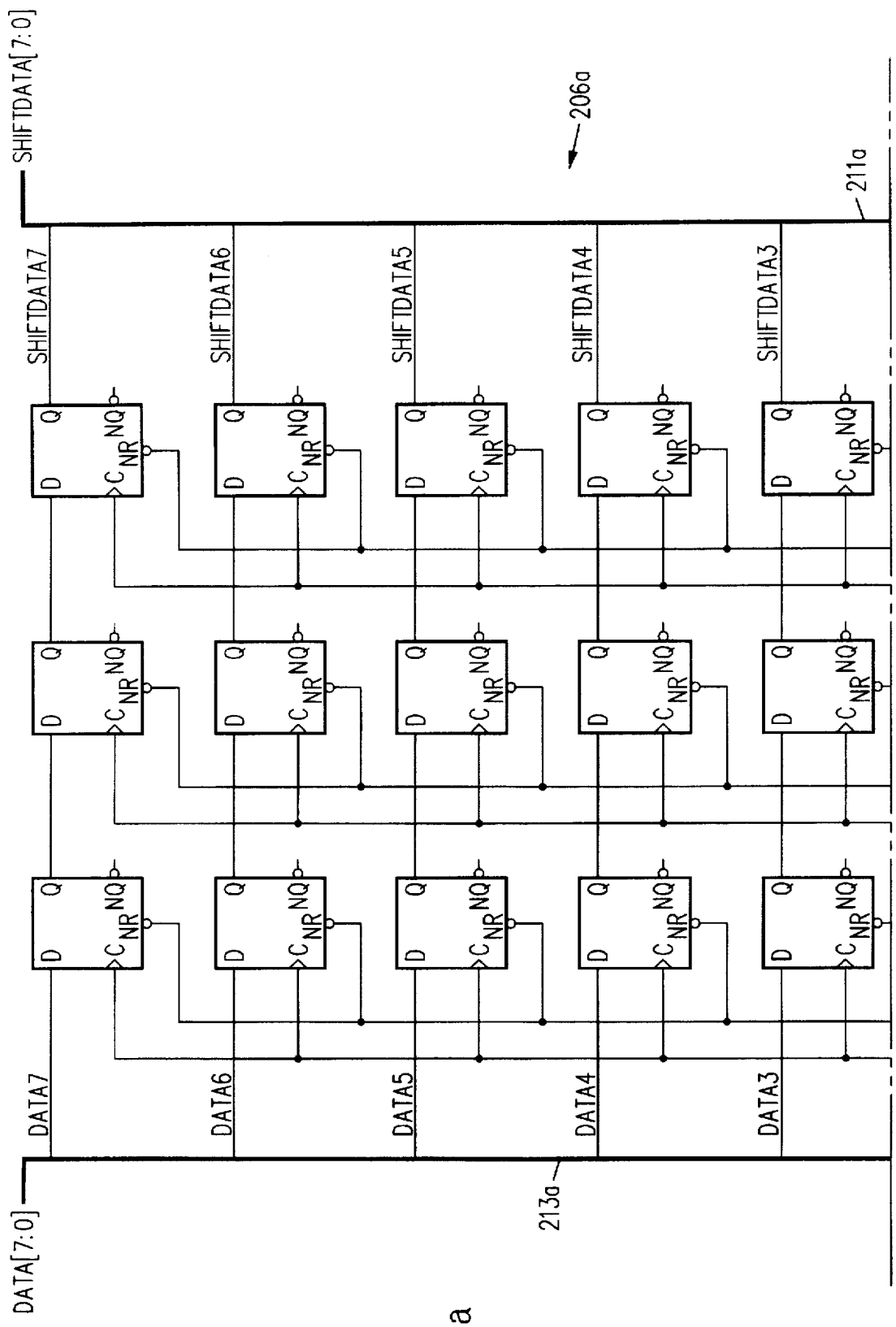
Figure 5B:
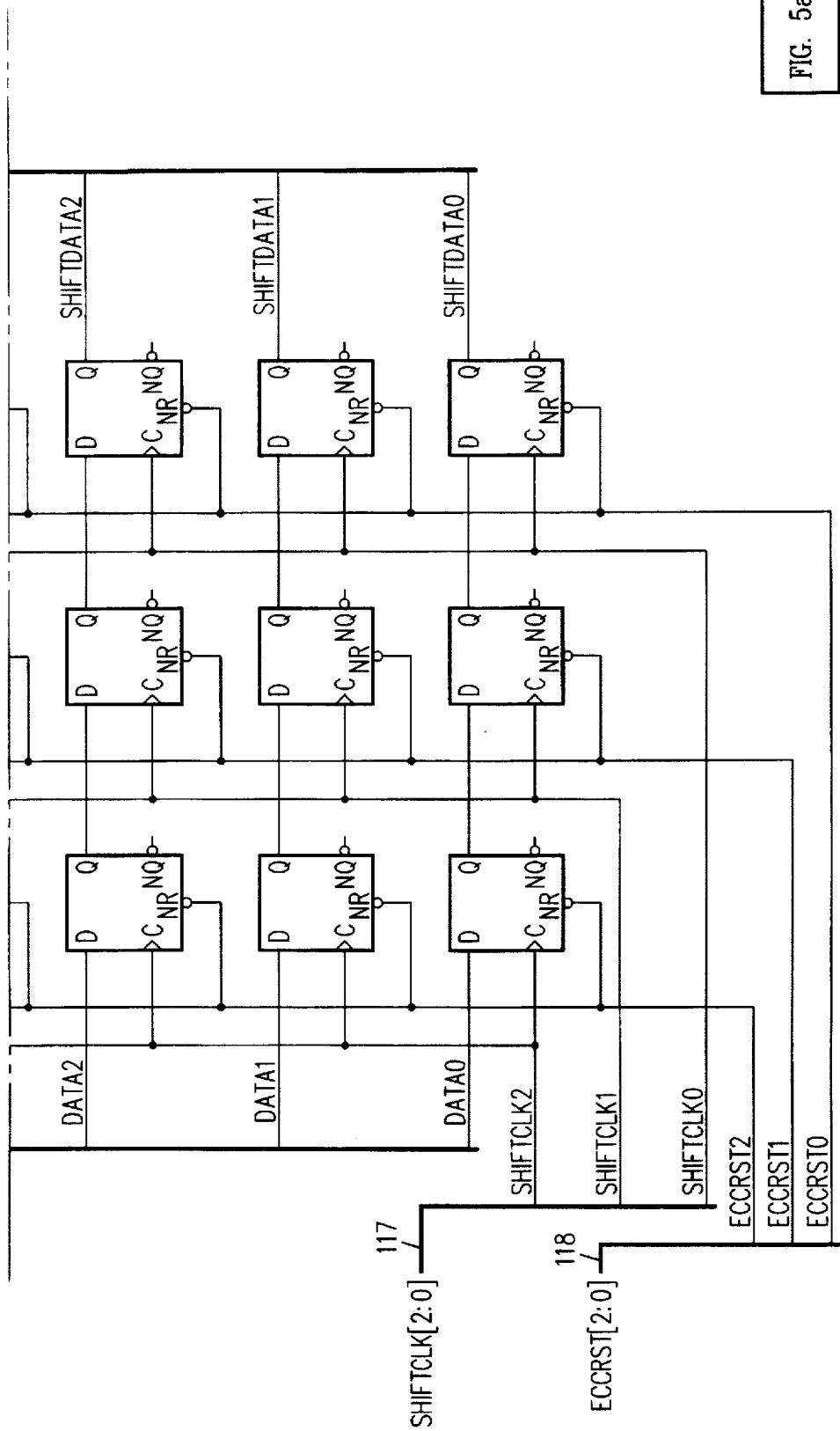
Figure 5B:
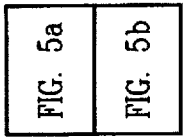

FIGS. 3a–3d provides, for this embodiment, the logic circuits implementing encoders 201a–201d, respectively. FIG. 5 shows a logic circuit for implementing register 206a. The logic circuits for implementing registers 206b–206d are each identical to the logic circuit of FIG. 5 for register 206a.

Figure 4:
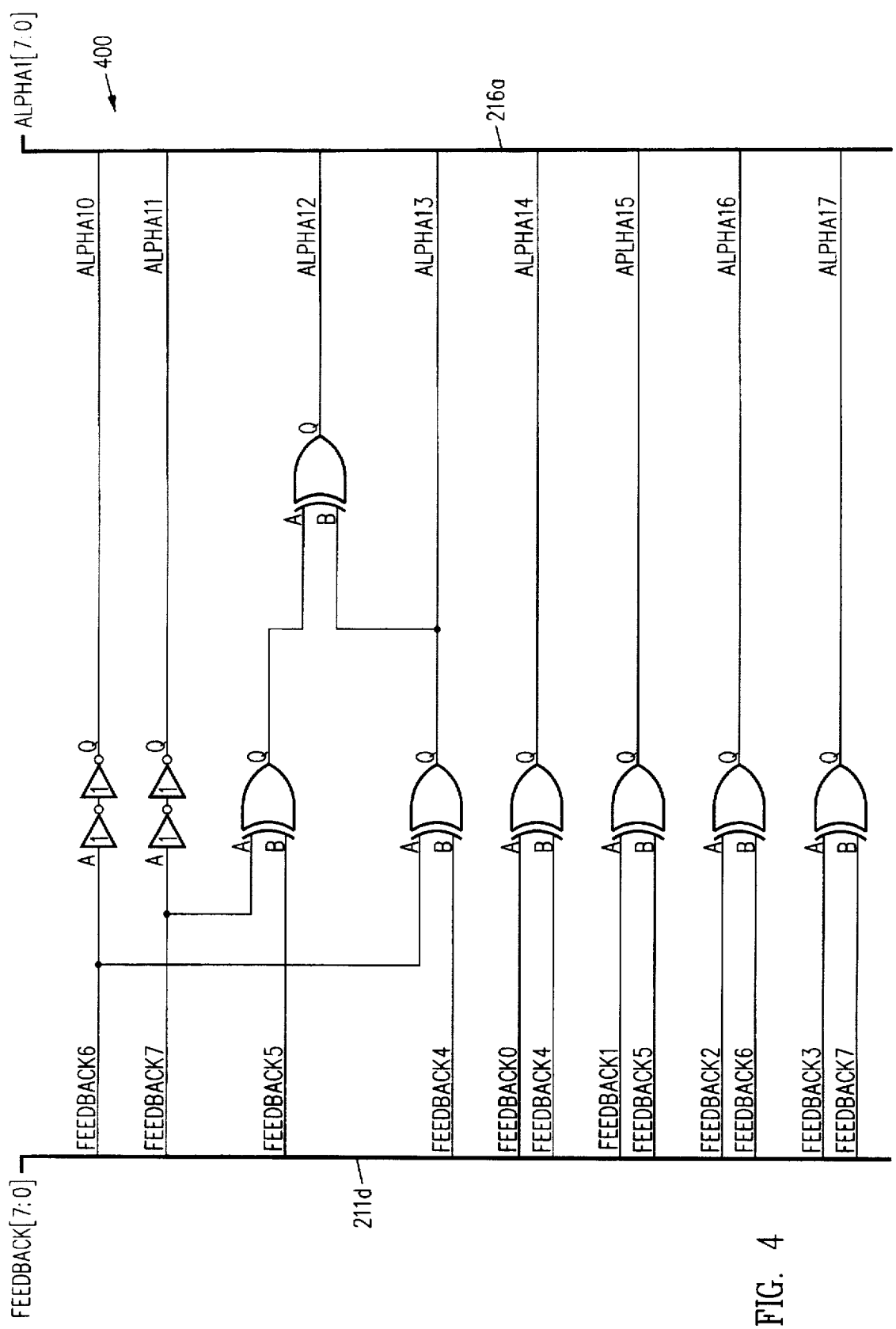
FIG. 4 shows a logic circuit of alpha module 201a for decoding.

Returning to FIG. 2, during decoding, multiplexers 205a–205d each select the 8-bit values on busses 210a–210d, respectively. The 8-bit value on bus 210a is the sum of the output value of register 206a and the input 8-bit encoded data symbol on bus 212. The 8-bit values on busses 210b–210d are the sums of the input encoded data symbol and a corresponding one of the 8-bit output values of alpha modules 202a–202c on busses 216a–216c respectively. Each of alpha modules 202a–202c multiplies its input 8-bit value, which is the output value of a corresponding register of registers 206a–206c, to a corresponding one of the values $\alpha,\alpha^2,\alpha^3$ provided in the generator polynomial GP(x) shown above. FIG. 4 shows a logic circuit 400 used to implement alpha module 202a. The logic circuits of alpha modules 202b and 202c are formed by cascading logic circuit 400 for alpha module 201a two and three times respectively.

Holding registers 105 include twelve 8-bit registers, and six 2-bit registers, which can be combined with six of the twelve 8-bit registers to form 10-bit registers for holding 10-bit values for error location. The logic circuit for implementing holding registers 105 is provided in FIG. 7. As shown in FIG. 7, the twelve 8-bit registers are 711a, 711b, 711c, 711d, 714a, 714b, 714c, 714d, 716a, 716b, 716c, and 716d. In addition, 2-bit registers 711b1, 711d1, 714b1, 714d1, 716b1 and 716d1 can be combined with 8-bit registers 711b, 711d, 714b, 714d, 716b and 716d to form six 10-bit registers for error location. Holding registers 105 receives 8-bit input values on busses 111a–111d from encoder/decoder block 101, 8-bit values on data busses 120–122 from error evaluation and location block 104 and 8-bit values on data busses 131, 138, 139, 702, and 703 from burstlimiter 103. Holding registers 105 also receives 2-bit values on data busses 702a and 703a from burstlimiter 103. The 2-bit values on data busses 702a and 703a are combined with the 8-bit values on data busses 702 and 703 to form 10-bit values for error location data. 6-bit control busses 132–137 are provided by burstlimiter 103 to control multiplexers 710a–710d, 712a–712d, and 715a–715d to select from the input data on the data busses at the input terminals of multiplexers 701a–701d, 712a–712d and 715a–715d to designated registers of holding registers 105. In addition to receiving input values during encoding and decoding, holding registers 105 are also used as sources of operands and destination of results in calculations performed by error evaluation and location block 104. For decoding, holding registers 105 are used to provide six error location registers and six error value registers.

Figure 6A:
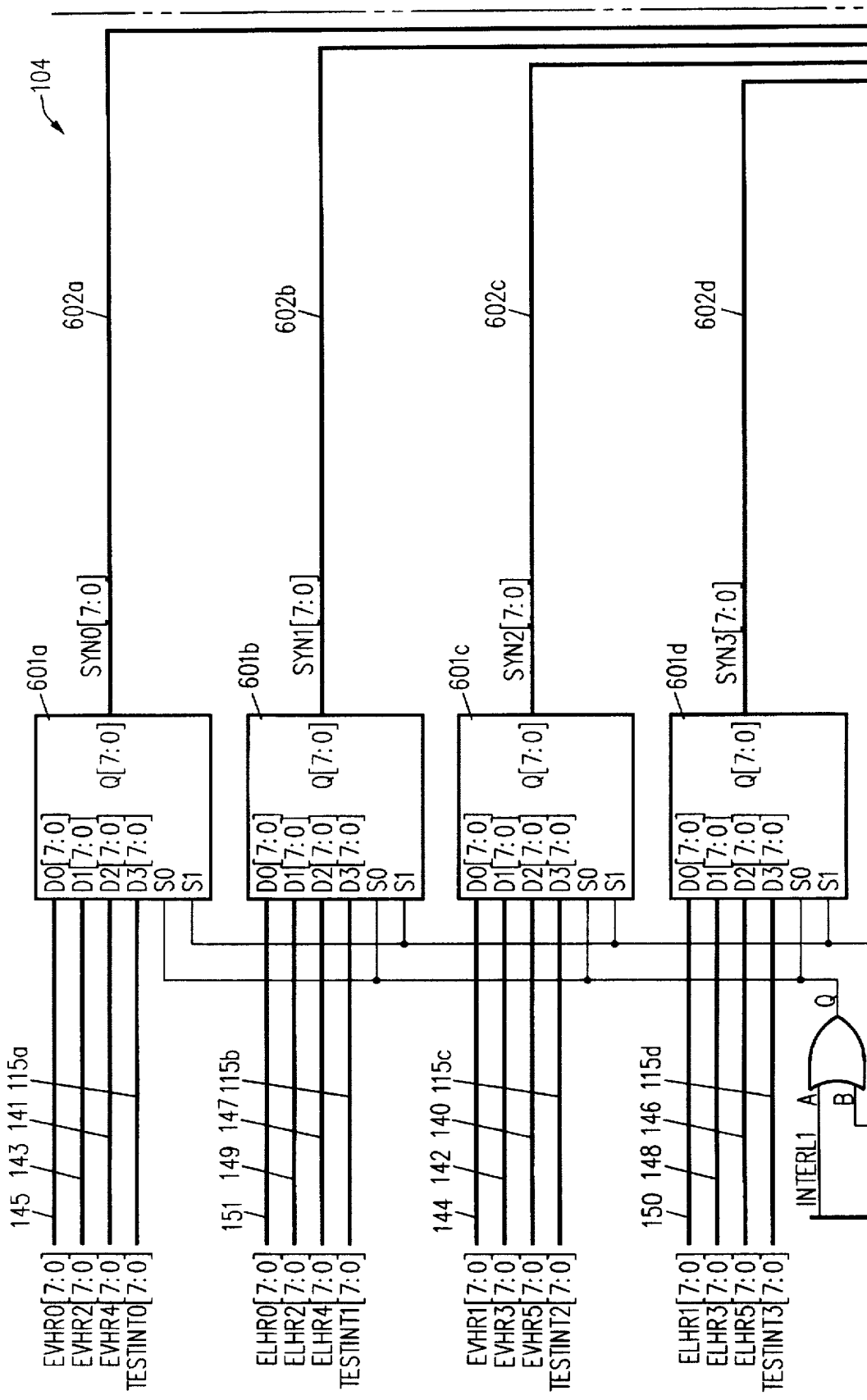
FIG. 6 is a block diagram showing the functional blocks of error evaluation and location block 104.
Figure 6B:
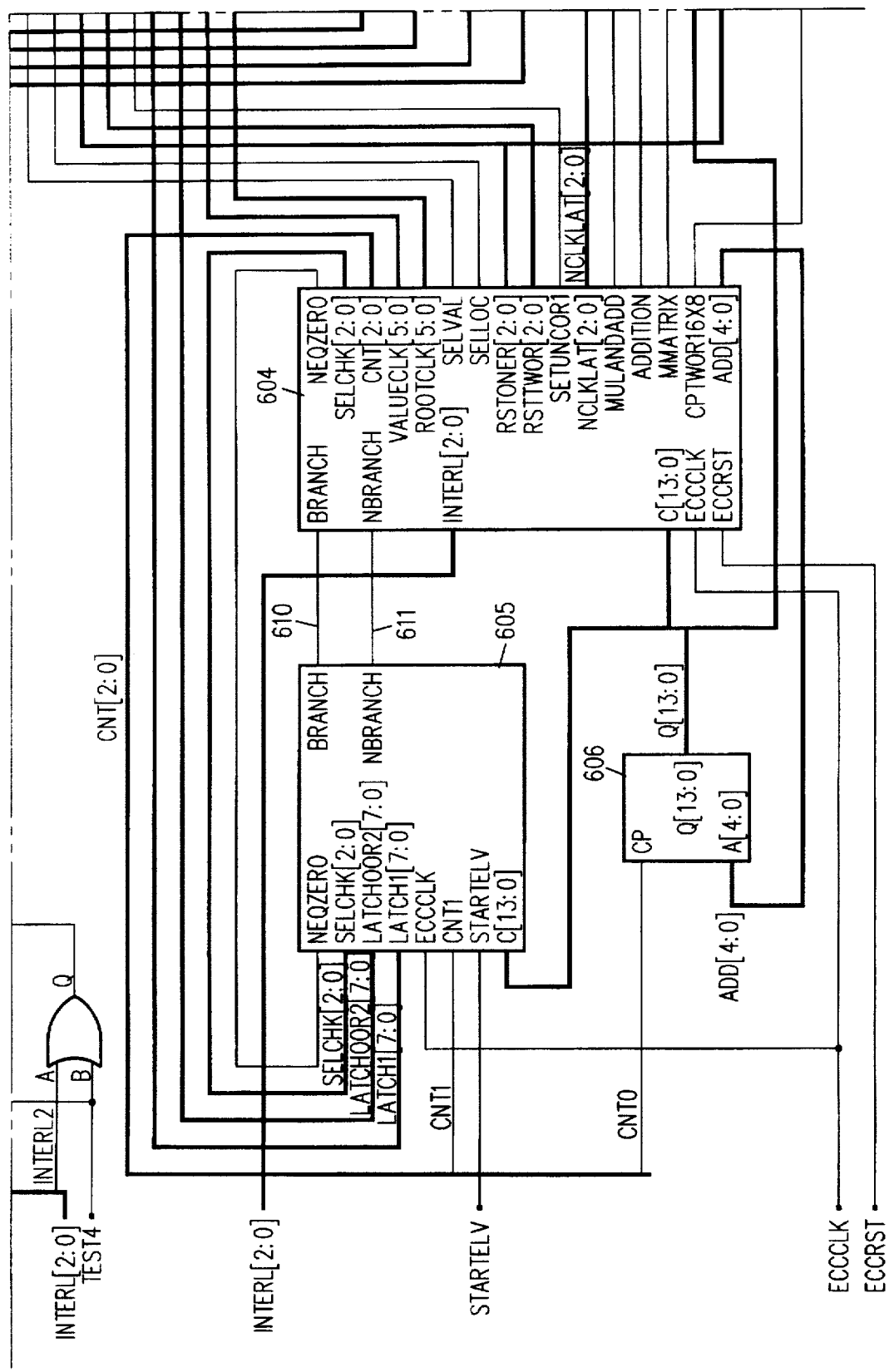
Figure 6C:
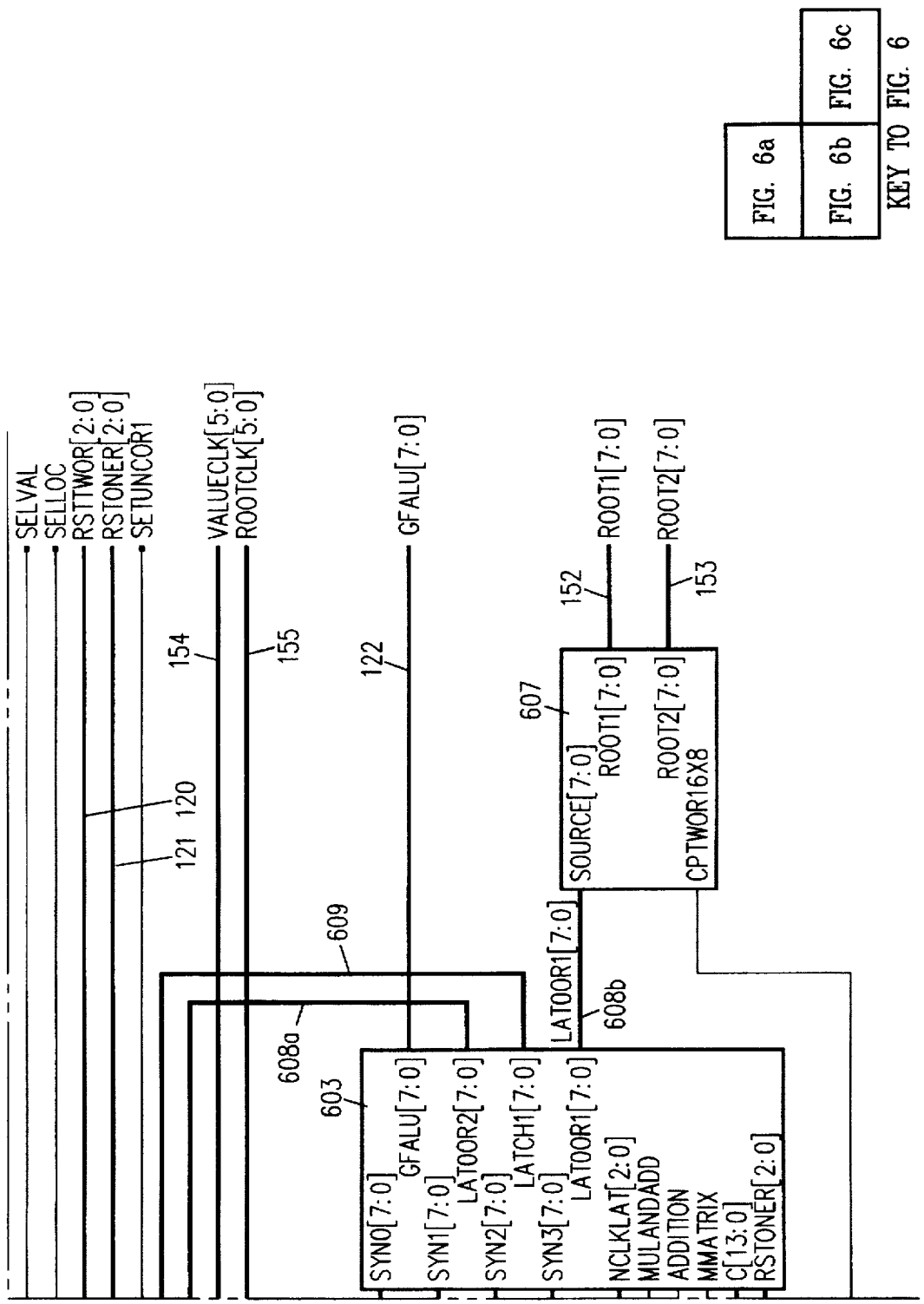
Figure 7A:
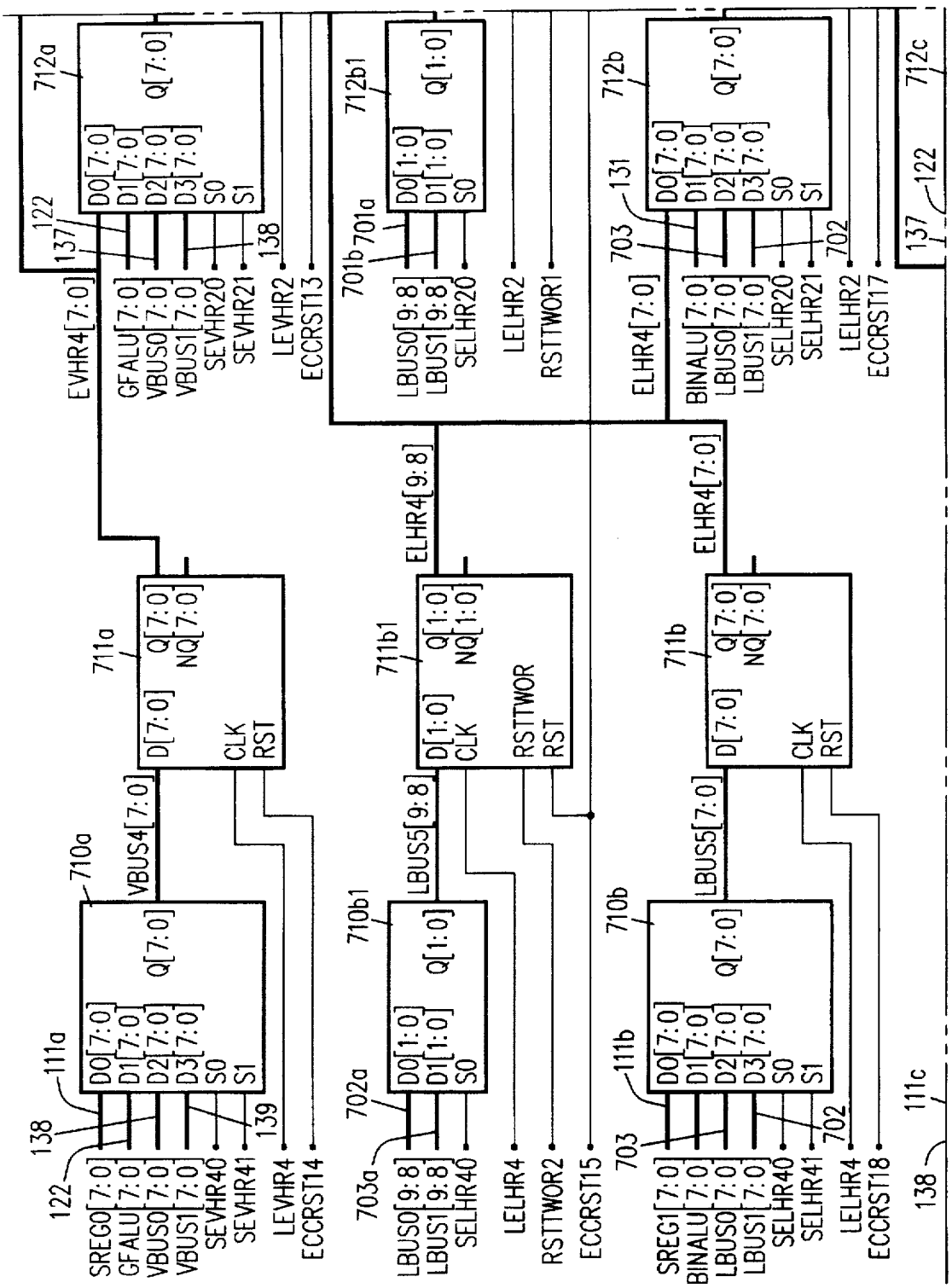
FIG. 7 shows a logic circuit which implements holding registers 105 in the embodiment of the present invention shown in FIG. 1.
Figure 7B:
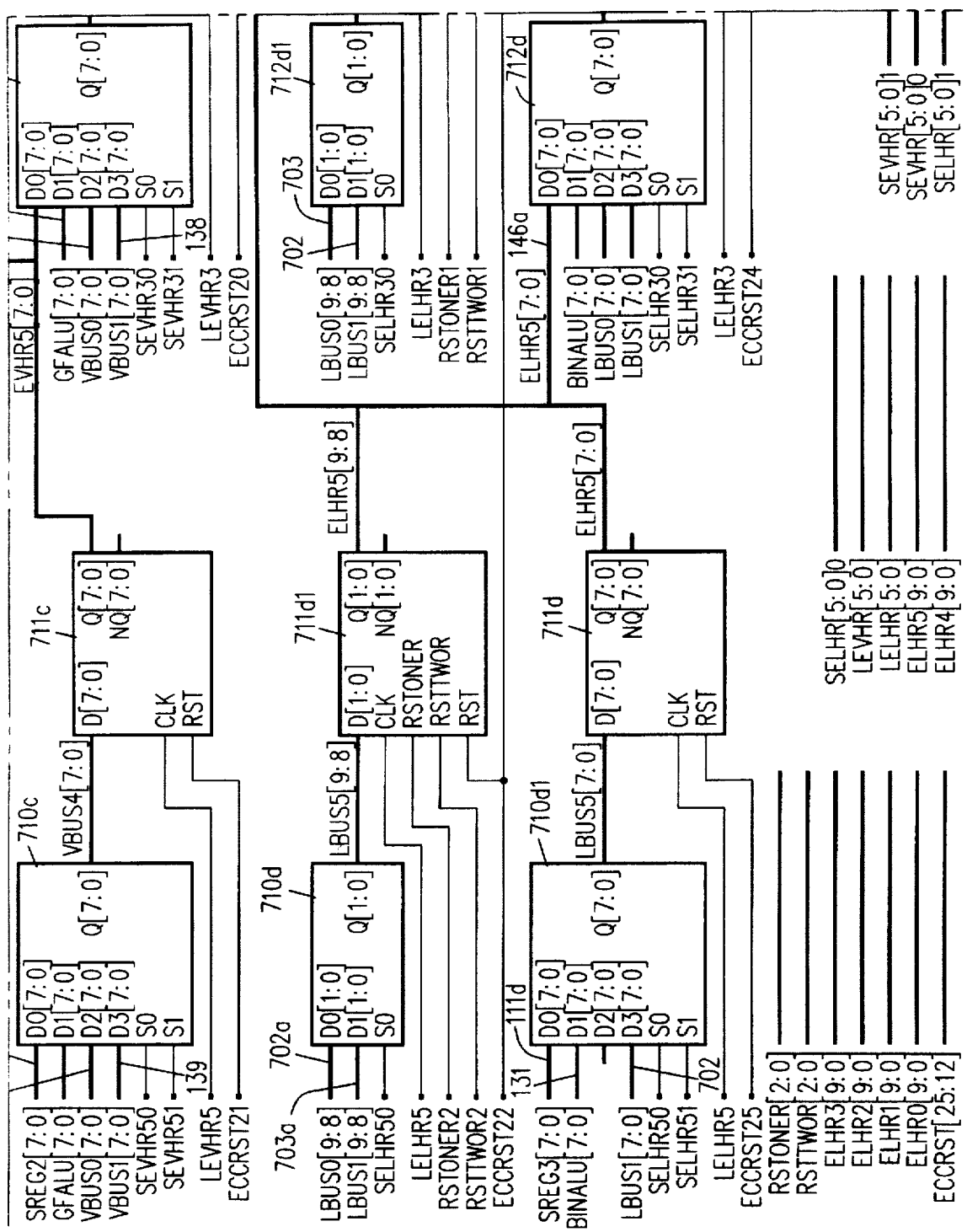
Figure 7C:
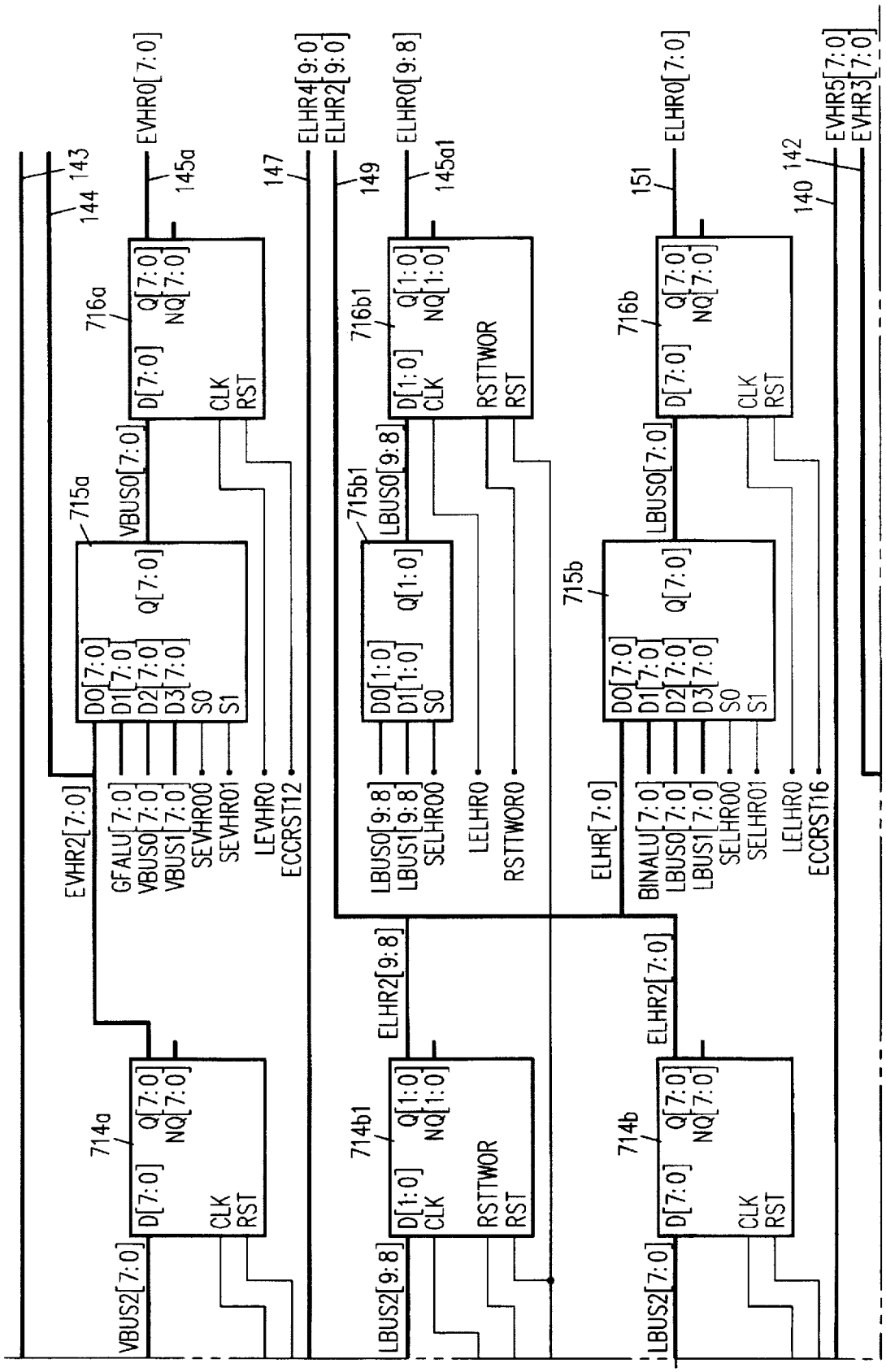
Figure 7D:
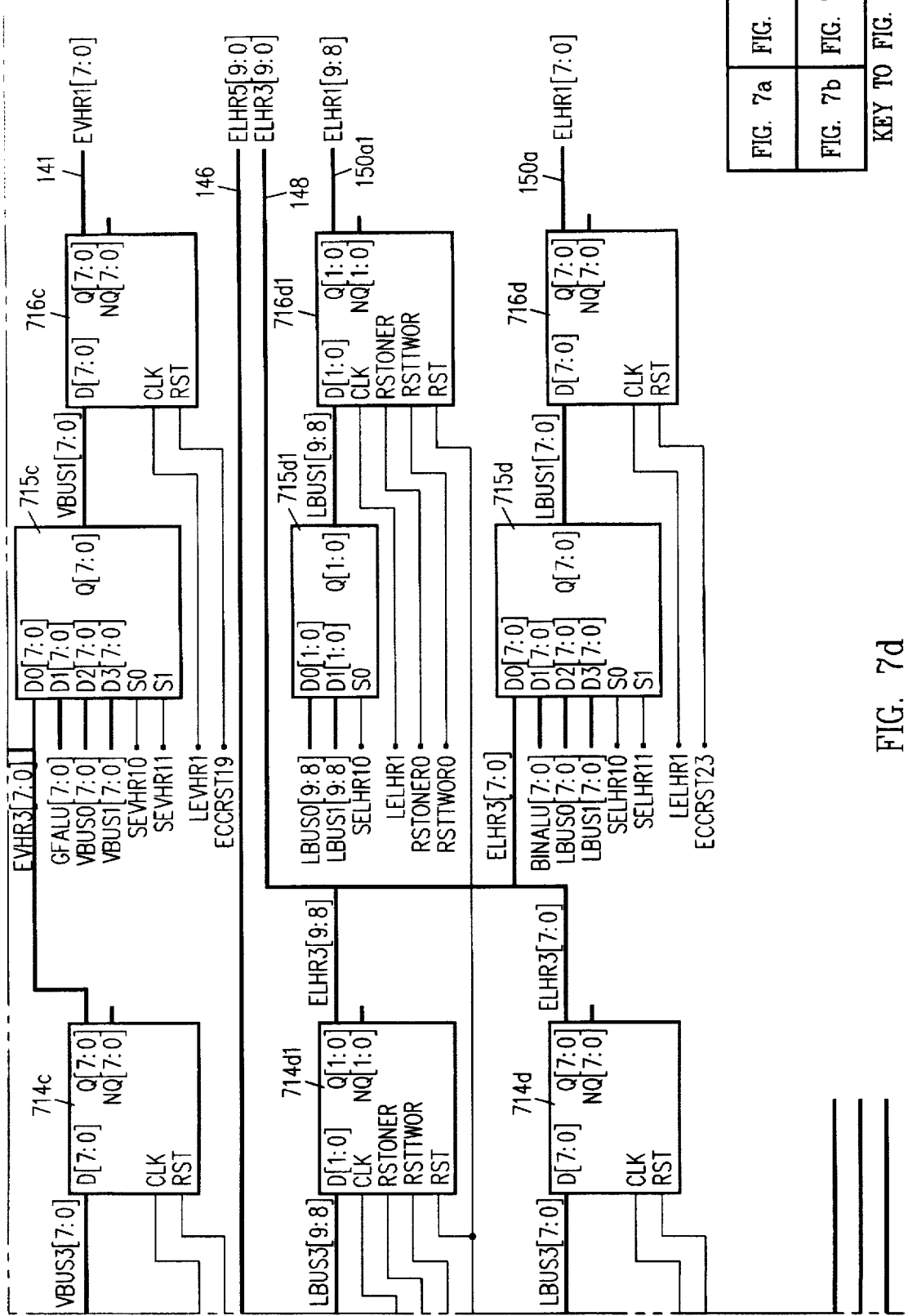
Figure 8A:
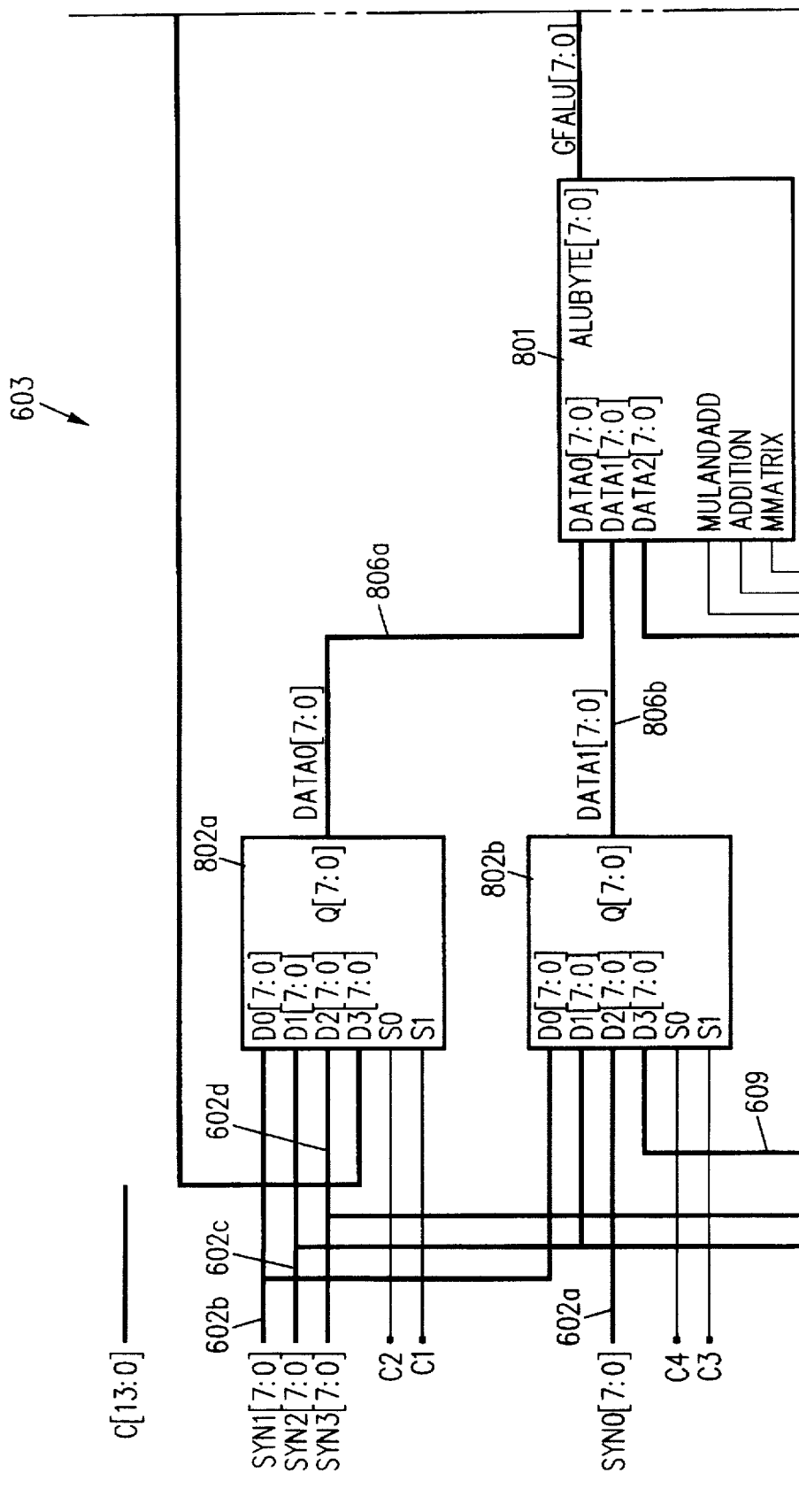
FIG. 8 is a block diagram of error value and location calculator 603.
Figure 8B:
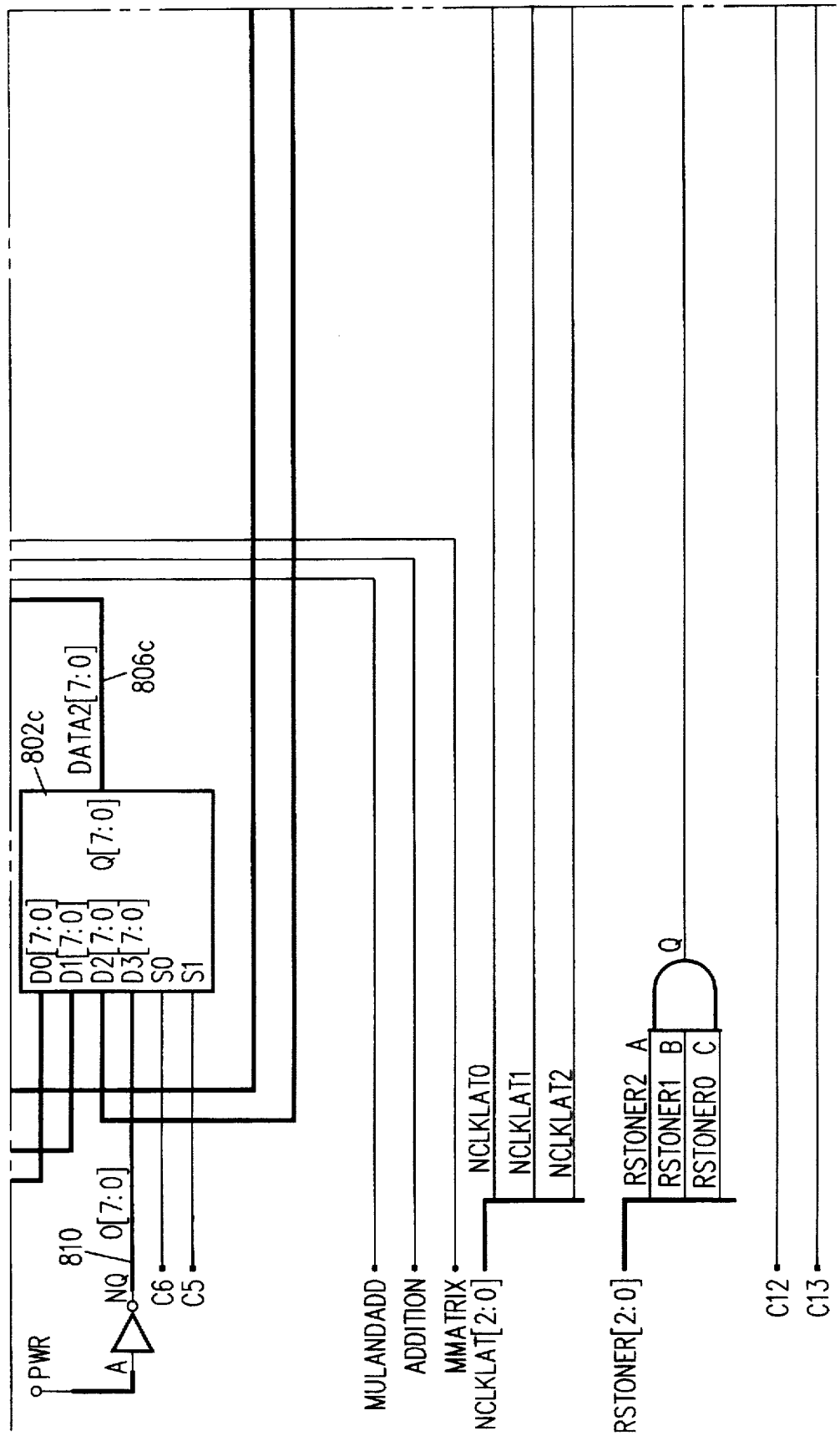
Figure 8C:
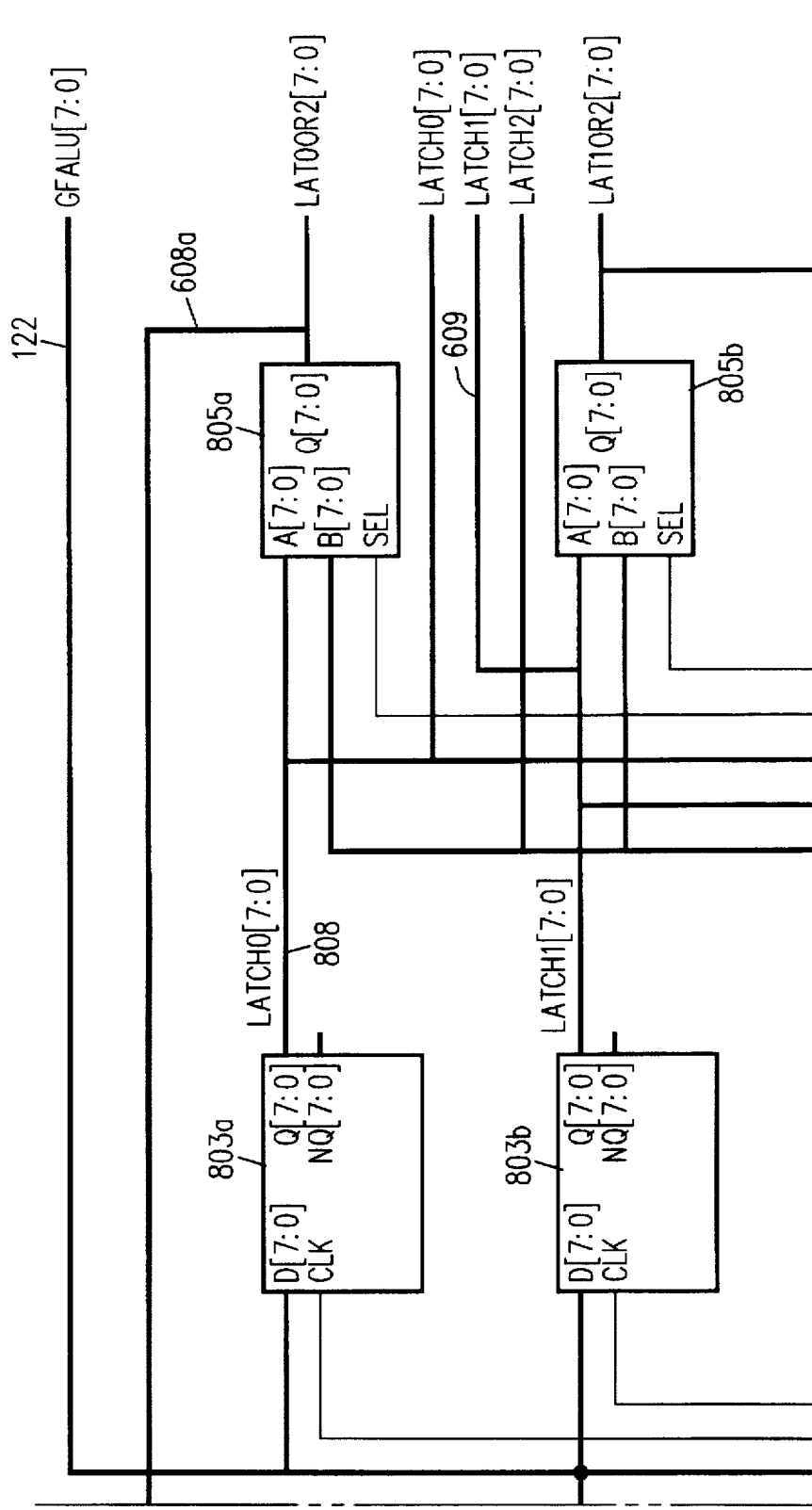
Figure 8D:
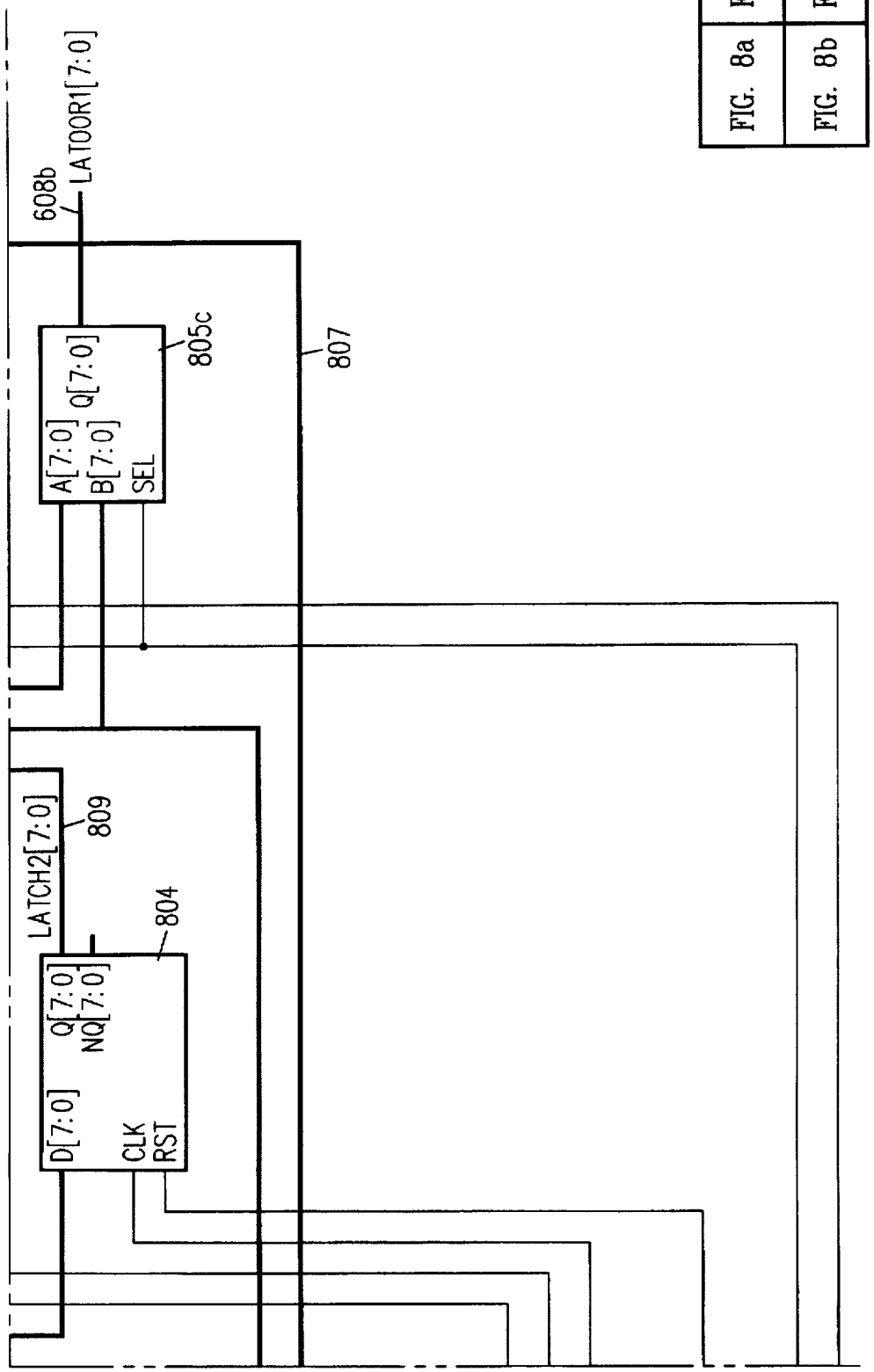

As mentioned above, error evaluation and location block 104 calculates error location and error values after the final four syndromes are computed. FIG. 6 is a block diagram showing the functional blocks of error evaluation and location block 104. As shown in FIG. 6, error evaluation and location block 104 receives six 8-bit data values from data busses 140–145, corresponding to error data values stored in registers 716a, 716c, 714a, 714c, 711a and 711c of holding registers 105. Error evaluation and location block 104 also receives 8-bit data from data busses 146–151, corresponding to error location values stored in registers 711d, 711b, 714d, 714b, 716d and 716b of holding registers 105. In addition, error evaluation and location block 104 also receives 8-bit data from test data busses 115a–115d. 4-to-1 Multiplexers 601a–601d, multiplexes 8-bit data from all data busses 115a–115d and data busses 151 onto data busses 602a–606d. As shown in FIG. 6, test data busses 115a–115d can be multiplexed onto data busses 602a–602d respectively. Error data values on data busses 141–145 can be each multiplexed onto a designated one of data busses 602a and 602c. Likewise, error location values on data busses 146–151 can be each multiplexed onto a designated one of data busses 602b and 602d. Data values on data busses 602a–602d are provided to an error value and location calculator 603, which calculates the error values and locations under the control of routines stored in a 32×14 bytes read-only memory (ROM) 606. Each routine in ROM 606 is a sequence of instructions decoded by instruction decode unit 604. The output values of error value and location calculator 603 can also affect the sequence of instruction executions in a routine of ROM 606 by conditional branching. Conditional branches are effectuated by a branch check unit 605, which tests the values on 8-bit busses 608a and 609 at the output terminals of error value and location calculator 603. Branch check unit 605 provides control signals "BRANCH" (branch) and "NBRANCH" (no branch) at terminal 610 and 611. ROM 606, branch check unit 605, and instruction decode unit 604 form a state machine to control the operations of error evaluation and location block 104.

Four types of instructions are provided from ROM 606: a) branch instructions, b) arithmetic and logic operations (including an instruction to take the logarithm of an 8-bit value), c) load instructions and d) an instruction to solve a quadratic equation.

Error evaluation and location block 104 also includes a logarithm unit 607 which takes the logarithmic value of an 8-bit value on data bus 608a output from error value and location calculator 603.

FIG. 8 is a block diagram of error value and location calculator 603. As shown in FIG. 8, multiplexers 802a, 802b and 802c multiplex input 8-bit data from data busses 602a–602d, 608a, 609, 807 and 810 onto data busses 806a–806b. The data busses 608a, 609, and 807 provide output data fed back from the output data of arithmetic logic unit 801. 8-bit values on data busses 806a–806b are provided as input values to arithmetic logic unit 801. The output values of arithmetic logic unit 801 are provided on 8-bit data bus 122. The output value of arithmetic logic unit 801 is also received by each of registers 803a, 803b and 804. Multiplexers 805a–805c multiplex the 8-bit output values of registers 803a, 803b and 804 onto data busses 608a, 608b and 807.

Figure 9A:
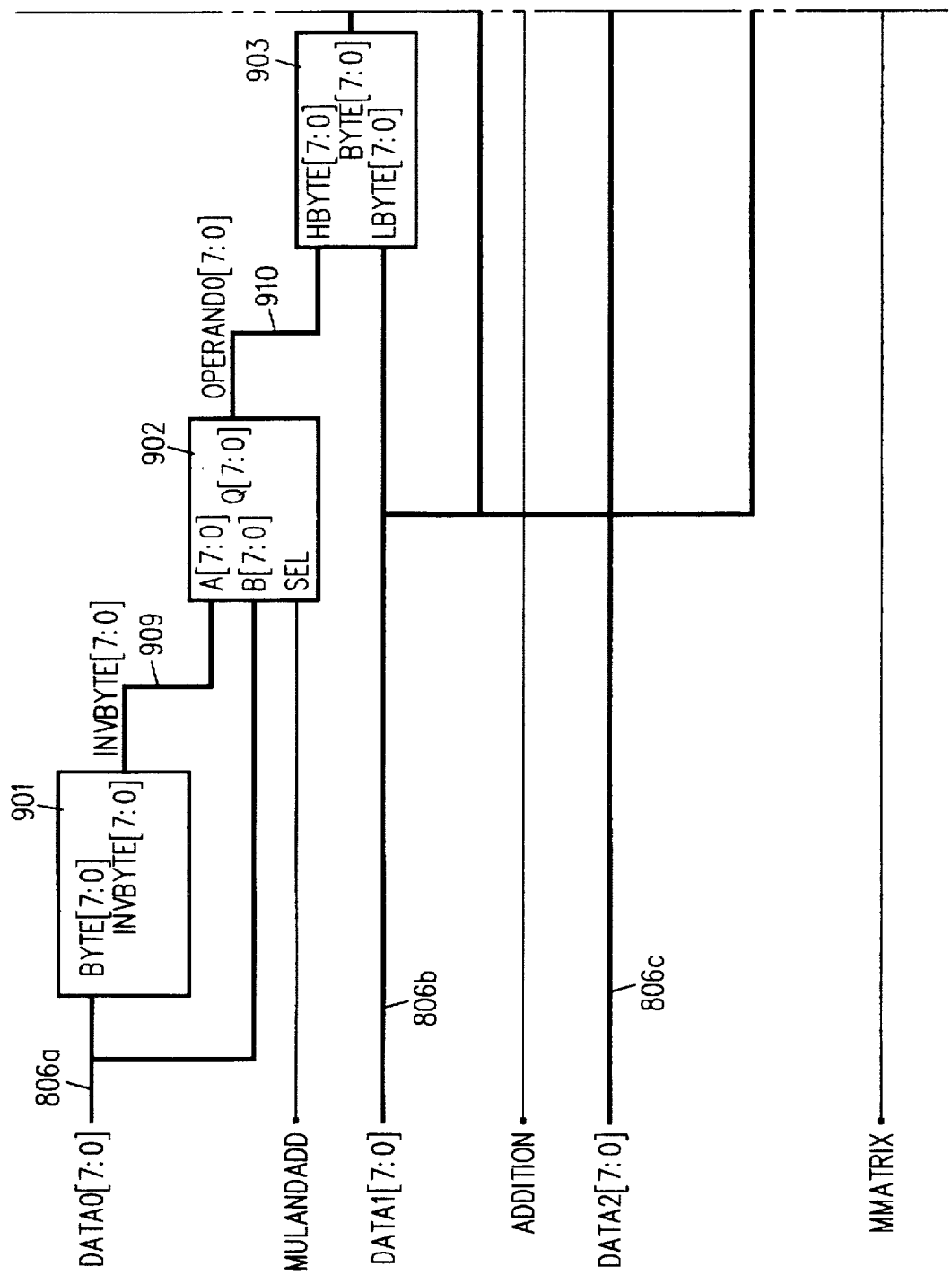
FIG. 9 is a block diagram of arithmetic logic unit 801.
Figure 9B:
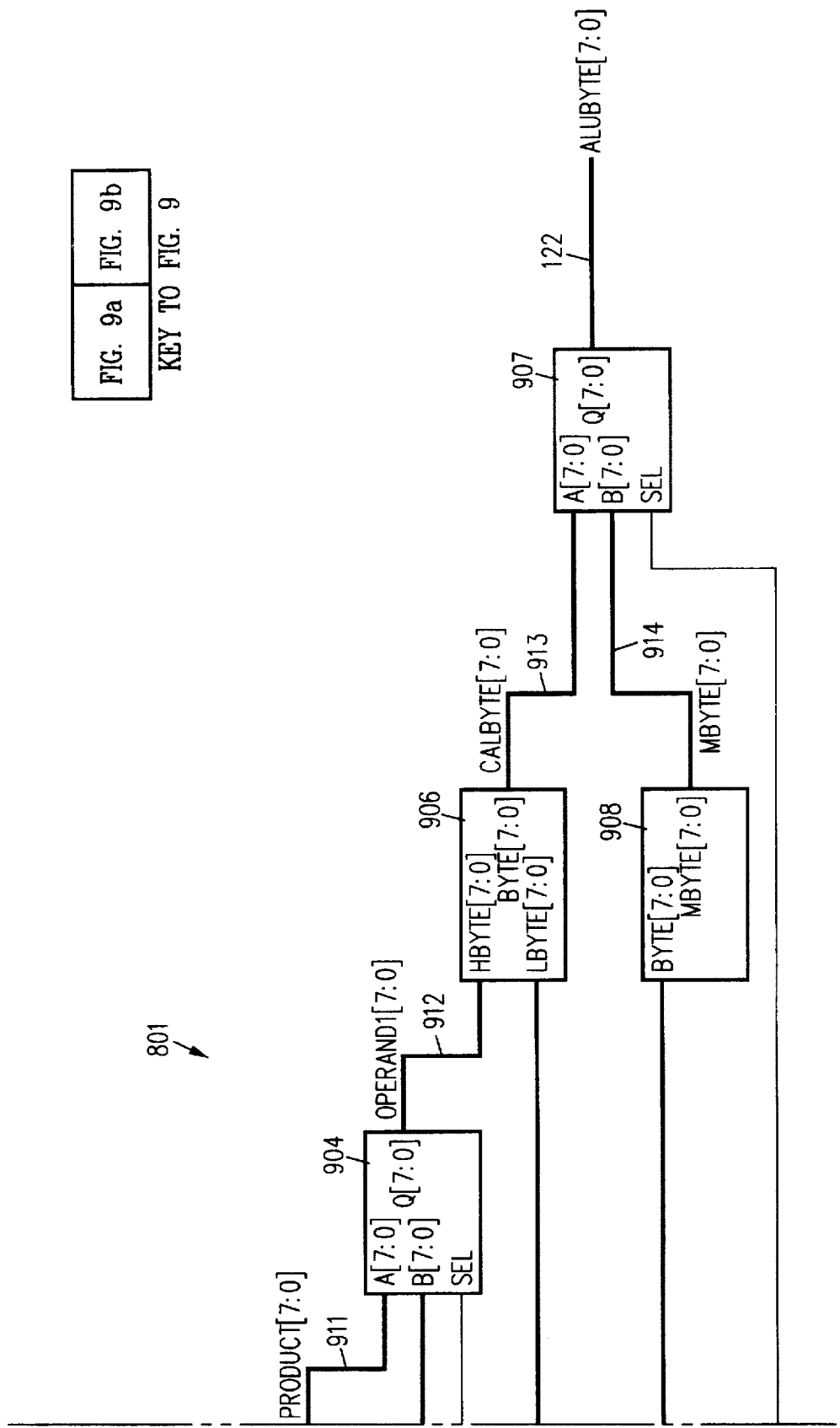

FIG. 9 is a block diagram of arithmetic logic unit 801. As shown in FIG. 9, arithmetic logic unit 801 includes a multiplicative inverse circuit 901, a multiplier 903, an adder 906, and a matrix multiplier 908. Arithmetic logic unit 801 operates over the finite Galois field GF(256). The operands for arithmetic logic unit 801 are taken from the 8-bit values on busses 806a–806c. Multiplicative inverse circuit 901 receives an 8-bit input datum on data bus 806a. Multiplier 903 receives operands from data busses 910 and 806a.

Multiplexers 902 selects between the 8-bit output value of multiplicative inverse circuit 901 and the 8-bit value on data bus 806a. The result value of multiplier 903 is provided on data bus 911. Multiplexer 904 selects between the 8-bit value on data bus 806b and the 8-bit output value of multiplier 903. The 8-bit output value of multiplexer 904 is provided on data bus 912. The 8-bit value on data bus 912 and the 8-bit value on data bus 806c are provided as operands to summer 906. Matrix multiplier 908 receives an 8-bit input value on data bus 806b and provides an 8-bit output value on data bus 914. Matrix multiplier 908 is used in a step for solving the quadratic equation $y^2+ay+b=0$. The value provided on data bus 806b is the value $b/a^2$, and the output value of matrix multiplier 908 is a value x, which is related to the roots $y_1$ and $y_2$ of equation $y^2+ay+b=0$ by the equations: $y_1=ax$; $y_2=ax+a$. Multiplexer 907 selects onto 8-bit output bus 122 either the 8-bit output datum of matrix multiplier 908 on data bus 914 and the 8-bit output datum of summer 906 on bus 913.

Under the present invention multiplication in GF'(256) can be performed by taking advantage of the hierarchical structure of these Galois fields. Multiplication in GF'(256) can be performed in GF'(16) with GF'(16) multipliers, which perform the multiplication in GF'(4) using GF'(4) arithmetic and logic operations. This approach can be, of course, easily extended to GF'(65536) to take advantage of GF'(256) multipliers. Clearly, the technique also can be extended to higher Galois fields.

In a multiplication involving two GF'(4) values P and R, where P can be represented by (pβ+q) and R can be represented by (rβ+s), p, q, r, s∈GF'(2), the following relation (1) holds:

$$P*R=(p\beta+q)(r\beta+s)=((p+q)(r+s)+qs)\beta+qs+pr$$

Thus, it can be seen that a multiplication in GF'(4) can be carried out by arithmetic operations (i.e. multiplication and addition) in GF'(2). Likewise, a multiplication in GF'(16), involving the values E and G, expressed as (eγ+f) and (gγ+h), respectively, where e, f, g, h∈GF'(4), can be calculated using GF'(4) arithmetic operations according to the relation (2):

$$E*G=(e\gamma+f)(g\gamma+h)=((e+f)(g+h)+fh)\gamma+fh+eg\beta$$

Furthermore, multiplying a GF'(4) value (fγ+h) with β can be accomplished in GF'(4) arithmetic using the relation (3):

$$(f\beta+h)\beta=(f+h)\beta+f$$

Similarly, a multiplication in GF'(256) can be performed in GF'(16) by representing the GF'(256) operands A and C respectively as (aδ+b) and (cδ+d), a, b, c, d∈GF'(16), and using the relation (4):

$$A*C=(a\delta+b)(c\delta+d)=((a+b)(c+d)+bd)\delta+bd+ac\epsilon$$

The multiplication by ε can also be performed in GF'(16) using the relation (5):

$$((r\beta+s)\gamma+(t\beta+u))\epsilon=((s+u)\beta+(r+s+t+u))\gamma+r\beta+s$$

where (s+u)β+(r+s+t+u) and rβ+s are in GF'(4) and r, s, t, u∈GF'(2). Multiplication by β can, of course be performed in GF'(4), in accordance with the relation (3) already provided above.

Figure 10A:
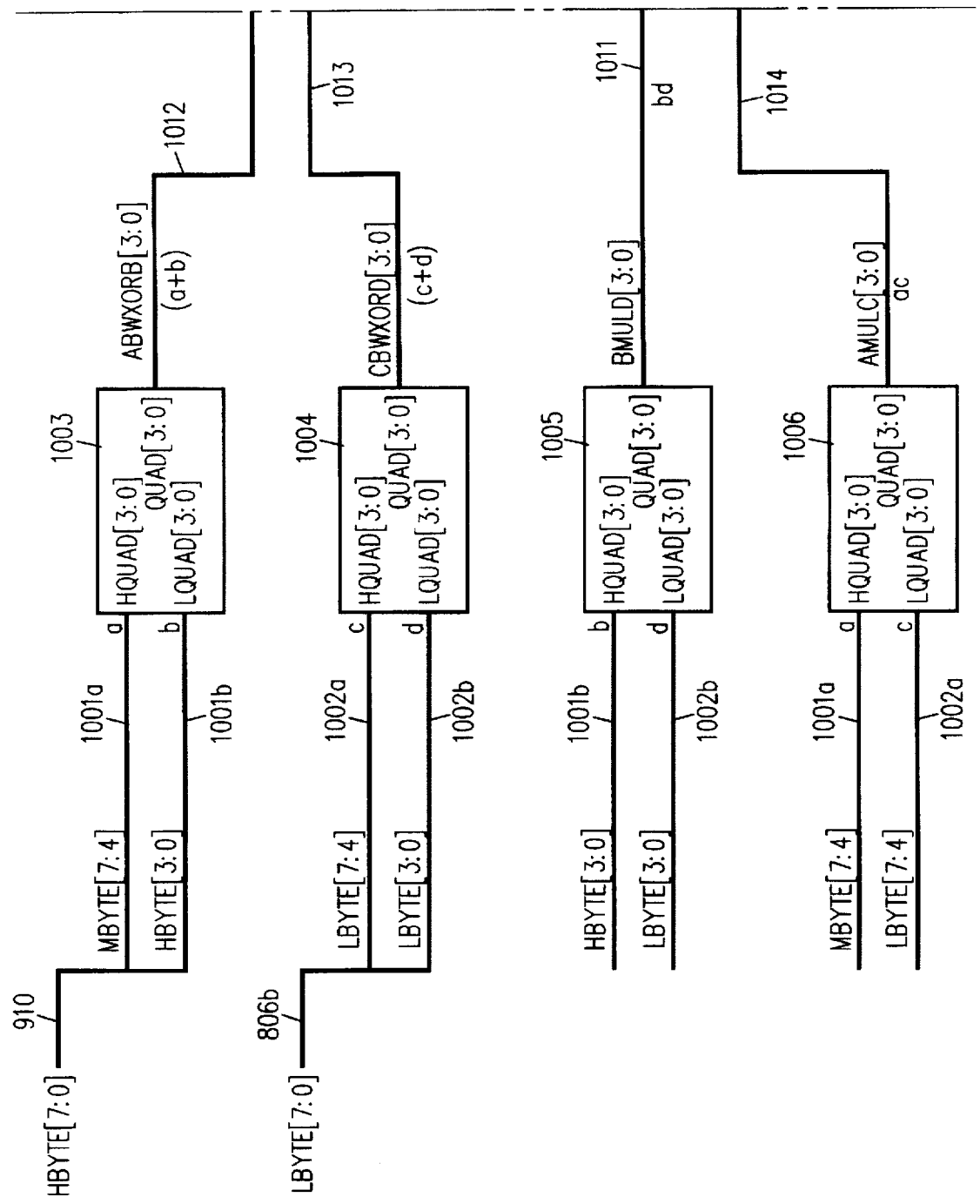
FIG. 10 is a block diagram of GF'(256) multiplier 903 in arithmetic logic unit 801, provided in accordance with the present invention.
Figure 10B:
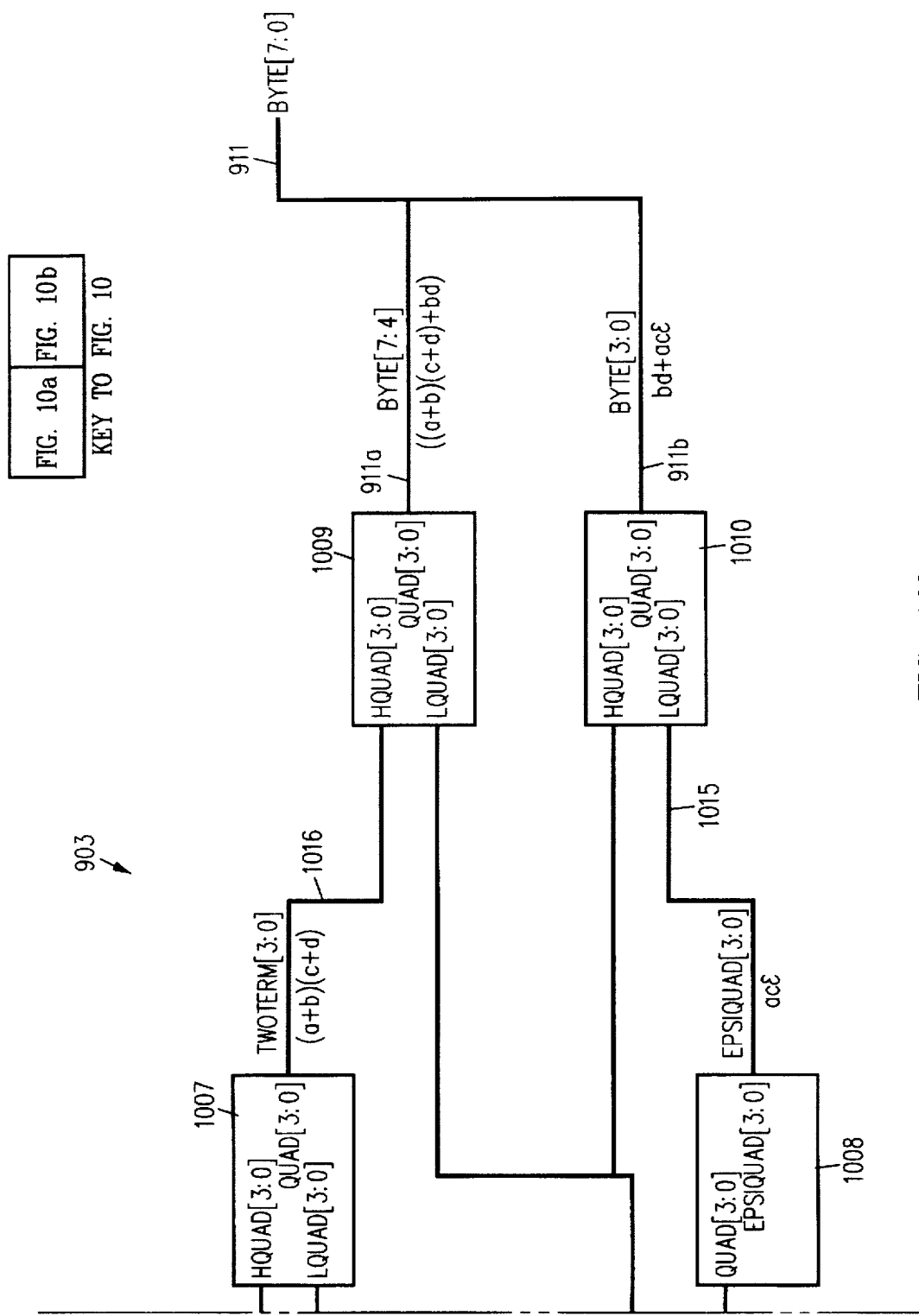

In accordance to the present invention, GF(256) multiplier 903 is provided by the logic circuit which block diagram is shown in FIG. 10. As shown in FIG. 10, an 8-bit input operand on bus 910 is separated into two 4-bit operands on 4-bit busses 1001a and 1001b, in accordance with the present invention. The higher order 4 bits, i.e. the value on bus 1001a, and the lower order 4 bits, i.e. the value on bus 1001b, form the two GF(16) values for representing the GF(256) value on bus 910. (The busses on FIG. 10 are annotated with the variables a, b, c, and d of relation (4) to assist the reader in following the data flow in multiplier 903). Likewise, the 8-bit operand on bus 806b is split into two 4-bit operands (i.e. GF(16)) on busses 1002a and 1002b. The 4-bit operands on busses 1001a and 1001b are summed (i.e. bitwise exclusive-ORed) in summer 1003 to provide a 4-bit value on bus 1012, and the 4-bit operands on busses 1002a and 1002b are similarly summed in summer 1004 to provide a 4-bit value on bus 1013. In addition, the 4-bit operand on bus 1001b is multiplied to the 4-bit operand on bus 1002b in GF(16) multiplier 1005 to provide a 4-bit value on bus 1011. Similarly, GF(16) multiplier 1006 multiplies the 4-bit operands on busses 1001a and 1002a to provide a 4-bit value on bus 1014.

The 4-bit results of summers 1003 and 1004 on busses 1012 and 1013 are multiplied in GF(16) multiplier 1007 to provide a 4-bit value on bus 1016. This 4-value on bus 1016 and the 4-bit result from GF(16) multiplier 1015 are summed in summer 1009 to provide a 4-bit result on bus 911a, providing thereby the higher 4 bits of bus 911. The 4-bit result of GF(16) multiplier 1006 on bus 1014 is "auxiliarily-multiplied" in auxiliary multiplier 1008 to provide a 4-bit result on bus 1015, which is summed in summer 1010 to the 4-bit result of GF(16) multiplier 1005 on bus 1011 to provide a 4-bit value on bus 911b. Any element of GF(16) having the bit value '1' as its most-significant bit can be chosen as auxiliary multiplier 1008.[3] The 4-bit result on bus 911b forms the lower 4 bits of bus 911. The 4-bit values on bus 911a and 911b, which are the two GF(16) components of a GF(256) value, form the 8-bit result of GF(256) multiplier 911.

[3] In general, going from GF(q) to GF(q$^2$), any element of GF(q) having a bit value of '1' in its most significant bit can be chosen as an auxiliary multiplier.

Figure 12:
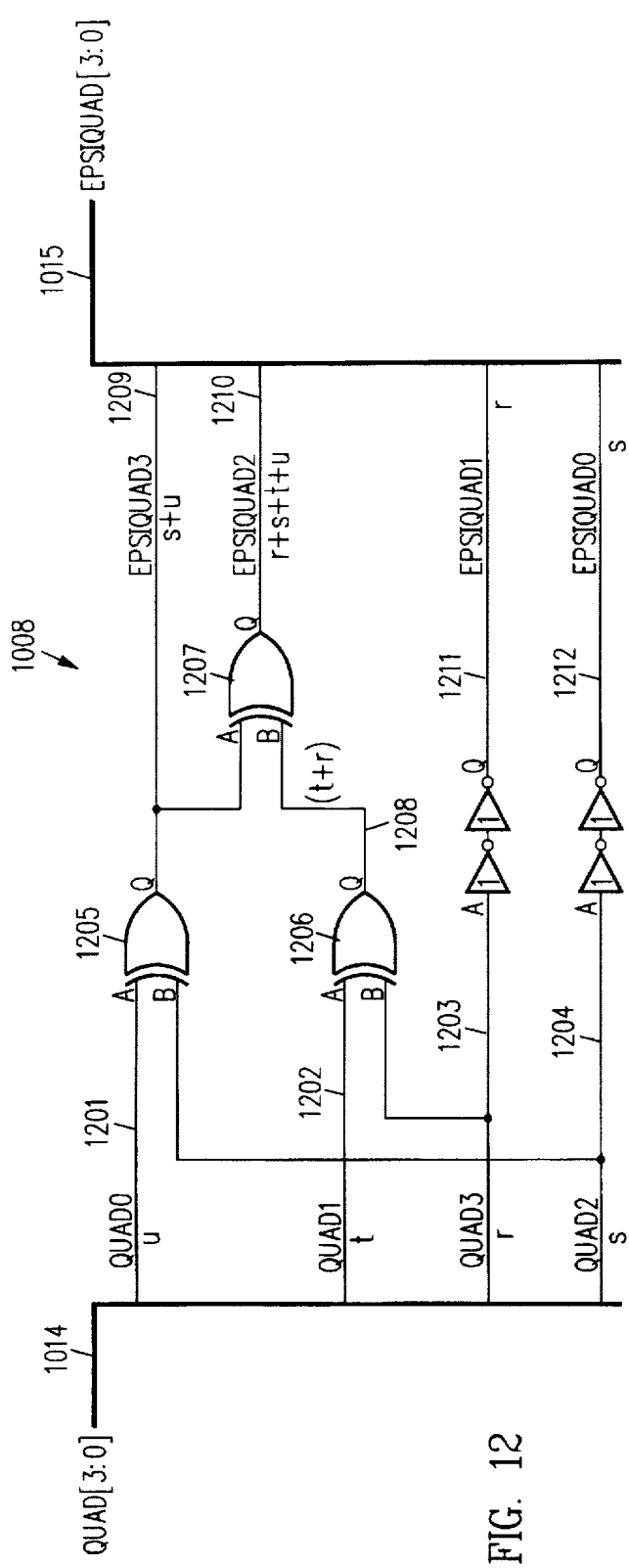
FIG. 12 shows auxiliary multiplier 1008 of GF'(256) multiplier 903 of FIG. 10.

A logic circuit for auxiliary multiplier 1008 is shown in FIG. 12. As shown in FIG. 12, the 4-bit value on bus 1014 is split into four 1-bit (i.e. GF(2)) values at terminals 1201–1204. The notations r, s, t and u of relation (5) used in the above description are annotated at the terminals shown in FIG. 12 to assist the reader to follow the data flow. The 1-bit values at terminals 1201 and 1204 are summed by exclusive-OR gate 1205 to provide a value at terminal 1209. Likewise, the 1-bit values at terminals 1202 and 1203 are summed by exclusive-provide a 1206 to provide a 1-bit value at terminal 1208. The 1-bit values at terminals 1208 and 1209 are summed at exclusive-OR gate 1207 to provide a 1-bit value at terminal 1210. The 1-bit values at terminal 1203 and 1204 are buffered to provide additional signal strength at terminals 1211 and 1212. The 1-bit values at terminals 1209, 1210, 1211 and 1212 form the GF(16) result on bus 1015.

Figure 11A:
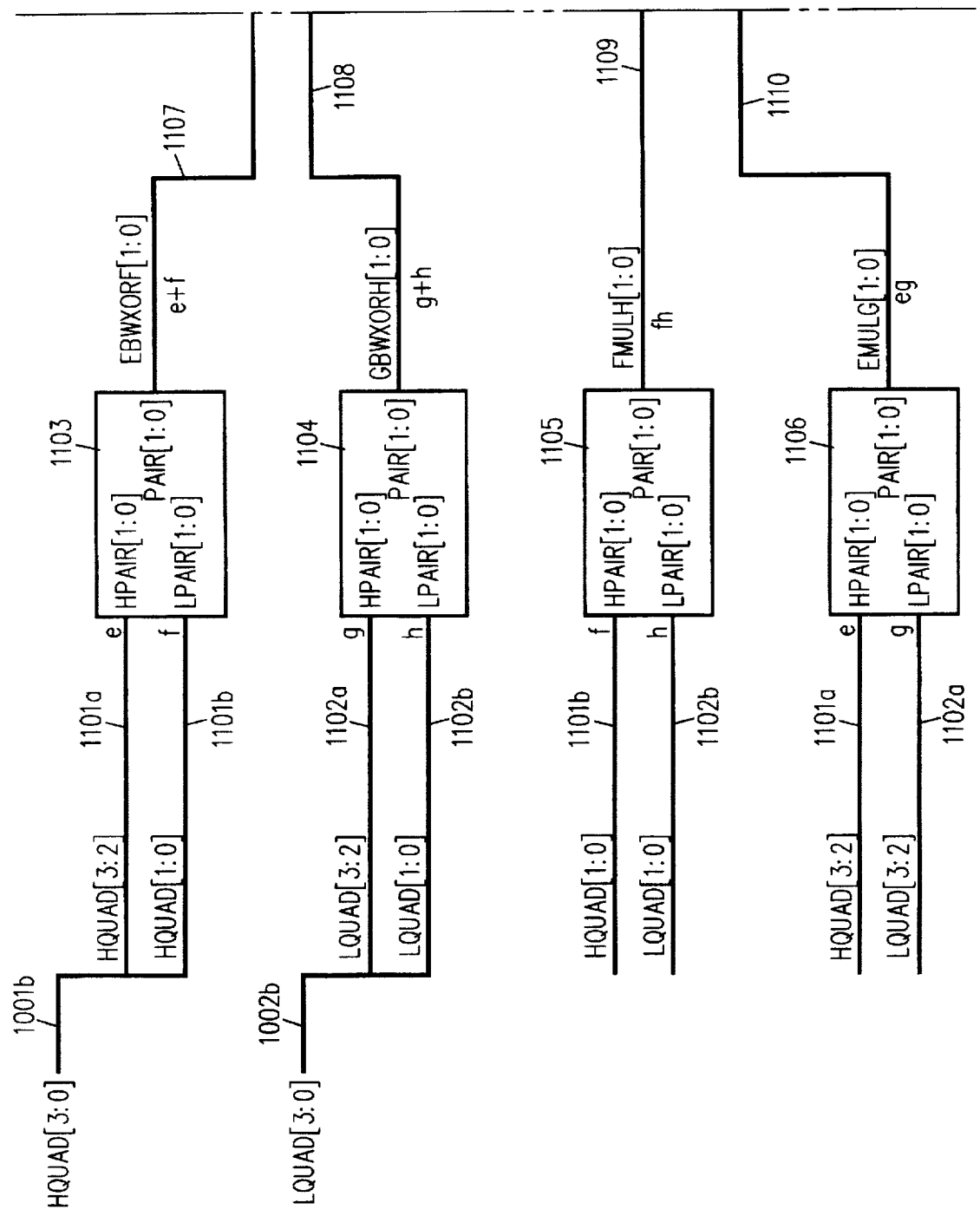
FIG. 11 shows a block diagram of GF'(16) multiplier 1005 of FIG. 10.
Figure 11B:
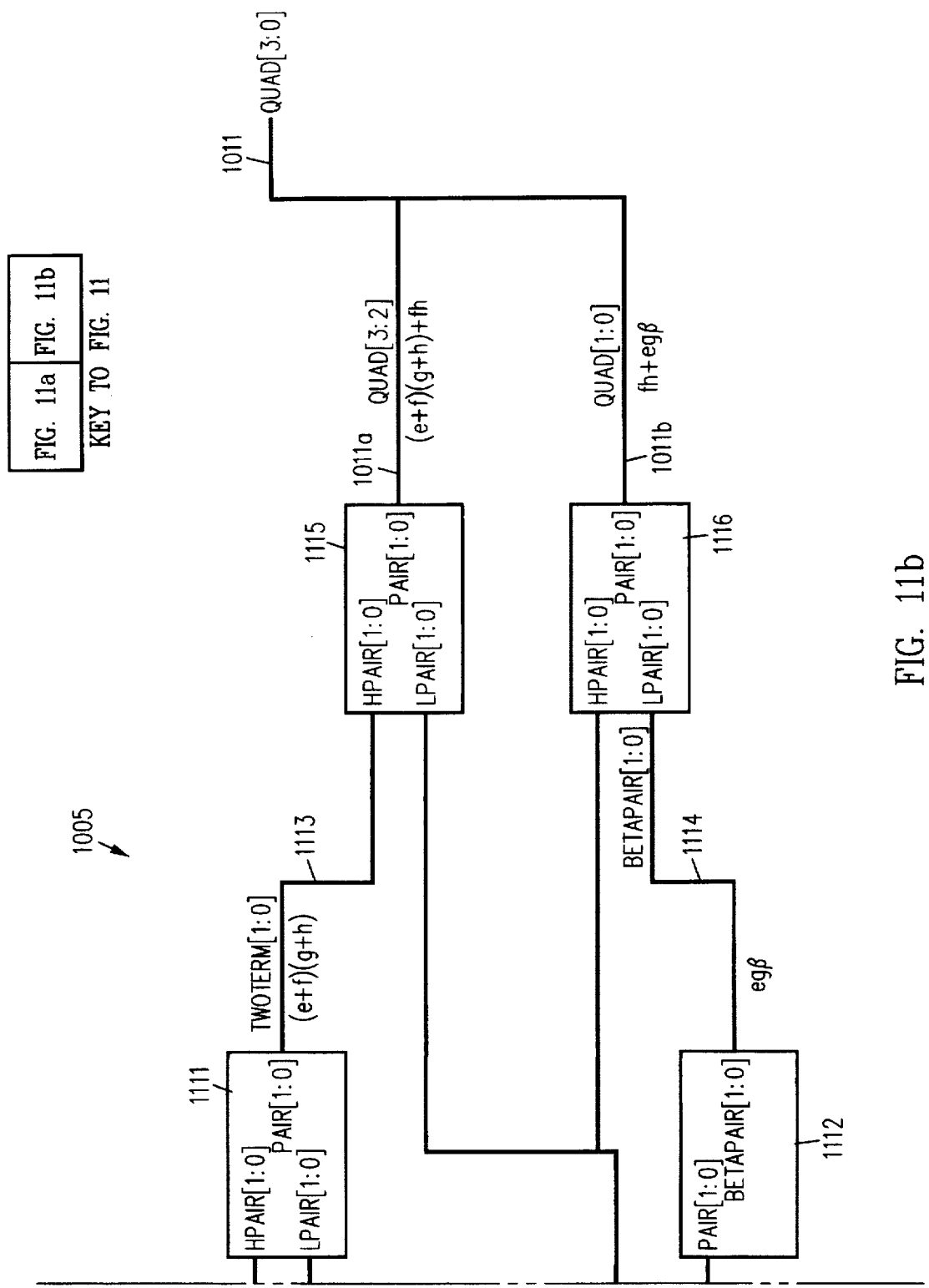

A GF(16) multiplier can be implemented using logic circuits and multipliers that operate in GF(4). FIG. 11 shows a block diagram of GF(16) multiplier 1005 of FIG. 10. The logic circuit for GF(16) multiplier 1005 also can be used to implement each of GF(16) multipliers 1006 and 1007.

In accordance to the present invention, GF(16) multiplier 1005 is provided by the logic circuit which block diagram is shown in FIG. 11. As shown in FIG. 11, a 4-bit input operand on bus 1001b is separated into two 2-bit operands on 2-bit busses 1101a and 1101b, in accordance with the present invention. The higher order 2 bits, i.e. the value on bus 1101a, and the lower order 2 bits, i.e. the value on bus 1101b, form the two GF(4) values for representing the GF(16) value on bus 1001b. (The busses on FIG. 11 are annotated with the variables e, f, g, and h of relation (5) to assist the reader in following the data flow). Likewise, the 4-bit operand on bus 1002b is split into two 2-bit operands (i.e. GF(4)) on busses 1102a and 1102b. The 2-bit operands on busses 1101a and 1101b are summed (i.e. bitwise exclusive-ORed) in summer 1103 to provide a 2-bit value on bus 1107, and the 2-bit operands on busses 1102a and 1102b are similarly summed in summer 1104 to provide a 2-bit value on bus 1108. In addition, the 2-bit operand on bus 1101b is multiplied to the 2-bit operand on bus 1102b in GF(4) multiplier 1105 to provide a 2-bit value on bus 1109. Similarly, GF(4) multiplier 1106 multiplies the 2-bit operands on busses 1101a and 1102a to provide a 2-bit value on bus 1110.

The 2-bit results of summers 1103 and 1104 on busses 1107 and 1108 are multiplied in GF(4) multiplier 1111 to provide a 2-bit value on bus 1113. This 2-value on bus 1113 is then summed to the 2-bit result from GF(4) multiplier 1105 in summer 1115 to provide a 2-bit result on bus 1011a, providing thereby the higher 2 bits of bus 1011. The 2-bit result of GF(4) multiplier 1106 on bus 1110 is "auxiliarily-multiplied" in auxiliary multiplier 1112 to provide a 2-bit result on bus 1114, which is summed in summer 1116 with the 2-bit result of GF(16) multiplier 1105 on bus 1109 to provide a 2-bit value on bus 1011b. The 2-bit result on bus 1011b forms the lower 2 bits of bus 1011. The 2-bit values on bus 1011a and 1011b, which are the two GF(4) components of a GF(16) value, form the 4-bit result of GF(4) multiplier 1005.

Figure 13:
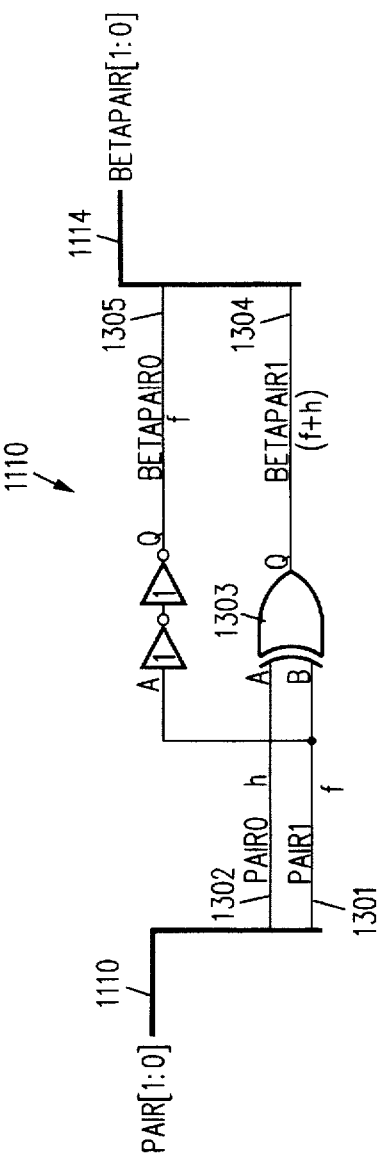
FIG. 13 shows a logic circuit for auxiliary multiplier 1112 in GF'(16) multiplier 1005 of FIG. 11.

A logic circuit for auxiliary multiplier 1112 is shown in FIG. 13. As shown in FIG. 13, the 2-bit value on bus 1110 is split into 2 1-bit (i.e. GF(2)) values at terminals 1301 and 1302. The notations f and h of relation (3) used in the above description are annotated at the terminals 1301 and 1302 shown in FIG. 13 to assist the reader to follow the data flow. The 1-bit values at terminals 1301 and 1302 are summed by exclusive-OR gate 1303 to provide a 1-bit value at terminal 1304. The 1-bit value at terminal 1302 is buffered to provide additional signal strength at terminal 1305. The 1-bit values at terminals 1304 and 1305 form the GF(4) result on bus 1114.

Figure 14:
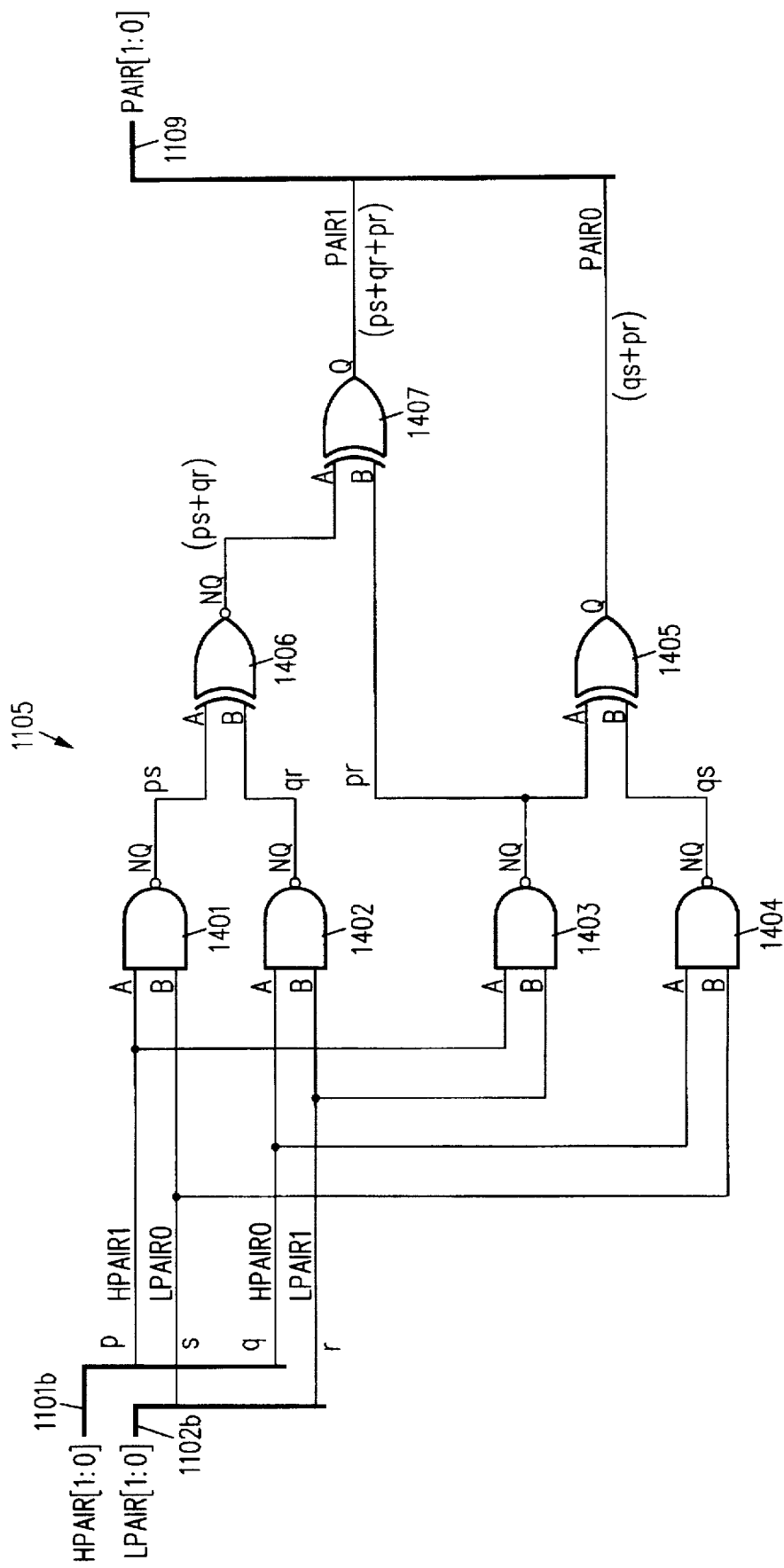
FIG. 14 shows a logic circuit of GF'(4) multiplier 1105 in GF'(16) multiplier 1005 of FIG. 11.

FIG. 14 shows a logic circuit of GF(4) multiplier 1105 in GF(16) multiplier 1005 of FIG. 11, in accordance with multiplicative equation in GF(2) disclosed above. Of course, other GF(4) multipliers, such as GF(4) multipliers 1106 and 1111 of FIG. 11, also can each be implemented by the logic circuit of GF(4) multiplier 1105.

GF(256) multiplicative inverse circuit 901 can also be provided by taking advantage of the hierarchical structure of the Galois fields of the present invention. Consider values A and G in GF(256) represented by (aδ+b) and (gδ+h), where a, b, g, h∈GF(16). Since $$A*G=(a\delta+b)(g\delta+h)=(ah+bg+ag)\delta+ag+bh$$

Thus, if (gδ+h) is the multiplicative inverse of (aδ+b), i.e. (aδ+b)$^{-1}$, then (ah+bg+ag)=0. Because a and b are independent, we obtain g=ka, h=k(a+b) for some k∈GF(16). Thus, the following relation (6) holds:

$$(a\delta+b)^{31\ -1}=(a\delta+(a+b))(b(a+b)+a^2\epsilon)^{-1}$$

Similarly, for a value C in GF(16), represented by (cγ+d), where c, d∈7 GF(4), the following relation (7) holds:

$$(c\gamma+d)^{-1}=(c\gamma+(c+d))(c^2\beta+d(c+d))^{-1}$$

and for GF(4), where e, f ∈GF(2), the following relation (8) holds:

$(e\beta+f)^{-1}=(e\beta+(f+e))(e^2+f(e+f))^{-1}$

Figure 15A:
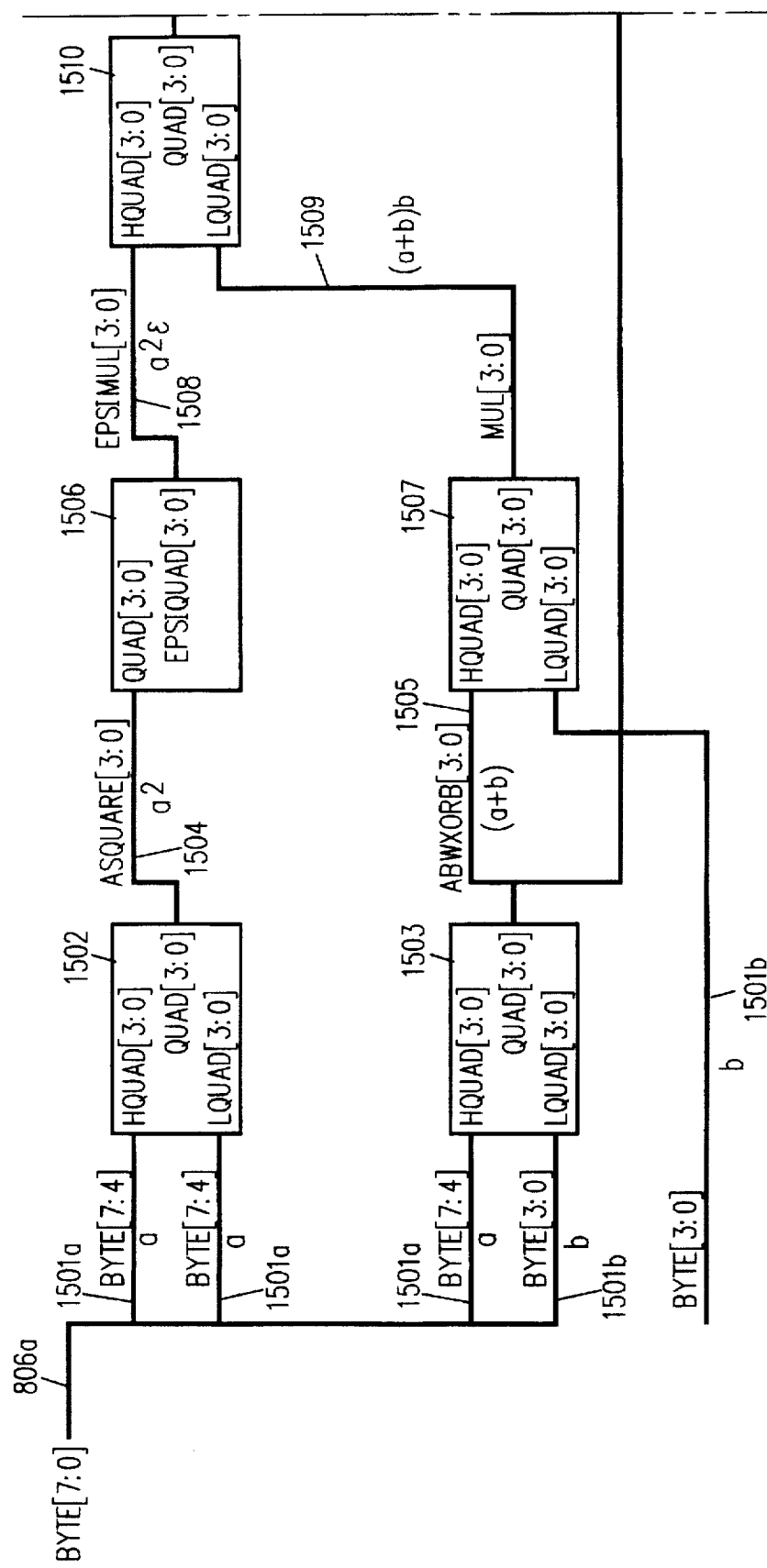
FIG. 15 is a block diagram of GF'(256) multiplicative inverse circuit 901, in accordance with the present invention.
Figure 15B:
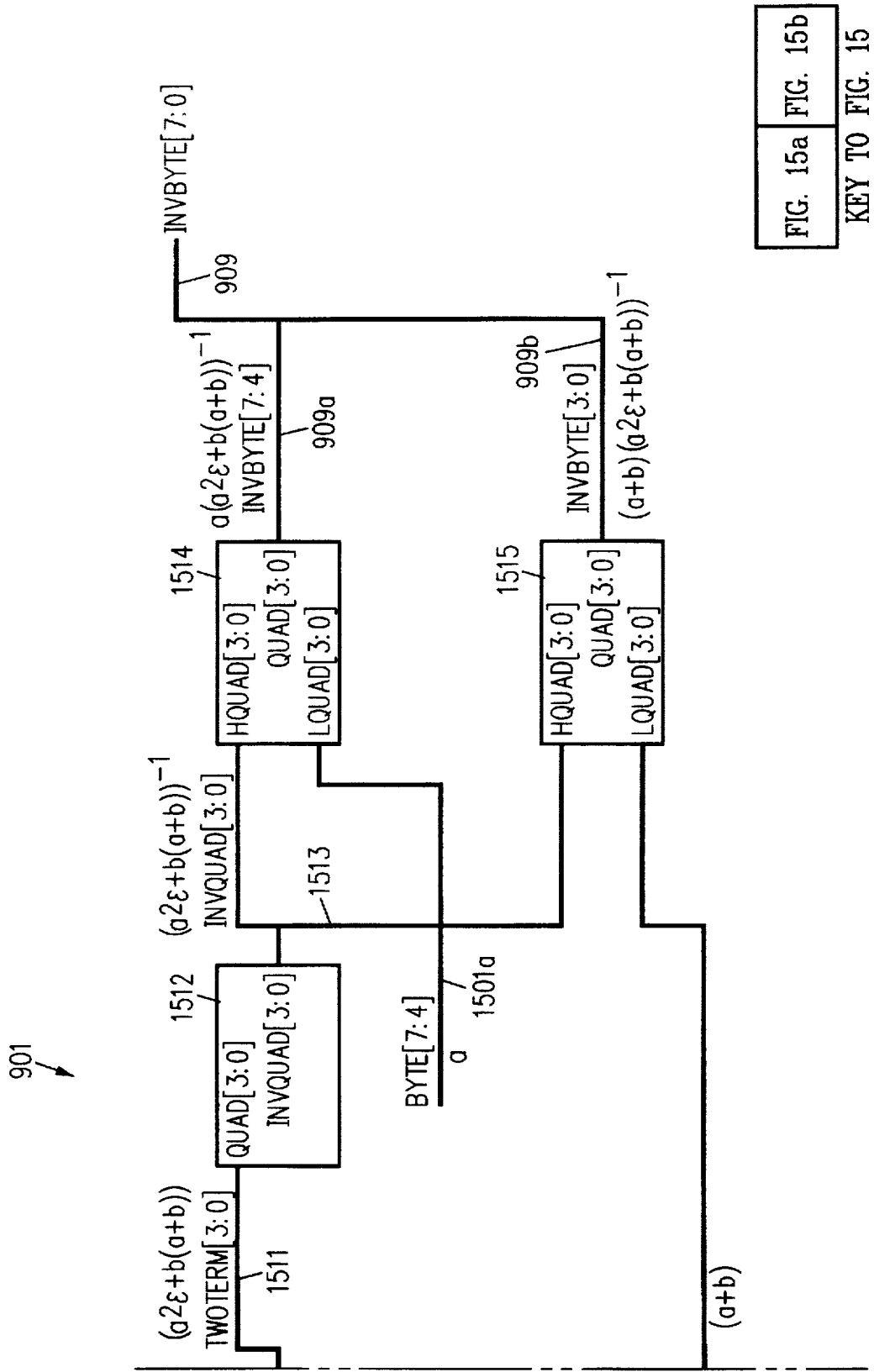

Using relations (6), (7) and (8), GF(256) multiplicative inverse circuit 901 can be implemented by the circuit shown in block diagram form in FIG. 15. As shown in FIG. 15, multiplicative inverse circuit 901 receives an 8-bit datum on bus 806a. The higher and lower 4-bits on bus 806a, which form the two GF(16) values to represent the 8-bit value on bus 806a, are provided on busses 1501a and 1501b. GF(16) multiplier 1502 squares the 4-bit value on bus 1501a to provide a 4-bit value on bus 1504, which is then auxiliarily-multiplied in auxiliary multiplier 1506 to yield a 4-bit result on bus 1508. The logic circuits for an auxiliary multiplier and an GF(16) multiplier are already described above with respect to auxiliary multiplier 1008 of FIG. 12 and GF(16) multiplier 1005 of FIG. 11.

Concurrently, the 4-bit value on bus 1501a, i.e. the higher order 4-bit of bus 806a, is summed in summer 1503 with the 4-bit value on bus 1501b, i.e. the lower order 4-bit of bus 806a, to provide a 4-bit result on bus 1505. The 4-bit result on bus 1505 is then multiplied in GF(16) multiplier 1507 with the 4-bit input value on bus 1501b, to provide a 4-bit value on bus 1509. The 4-bit values on busses 1508 and 1509 are then summed in summer 1510, to provide a 4-bit value on bus 1511. The 4-bit multiplicative inverse of the 4-bit value on bus 1511 is then found by GF(16) multiplicative inverse circuit 1512. This 4-bit multiplicative inverse is provided on bus 1513, which is then multiplied to the input value on bus 1501a to provide an output value on 909a. Simultaneously, the 4-bit values on busses 1513 and 1505 are multiplied in GF(16) multiplier 1515, to provide a 4-bit value on bus 909b. The two 4-bit GF(16) values of busses 909a and 909b form the 8-bit GF(256) value output on bus 909. Again, to assist the reader to follow the data flow, the notations a and b, a, b∈GF(16), used above in relation (6), are provided on the busses and terminals of GF(256) multiplicative inverse circuit 901.

Figure 16A:
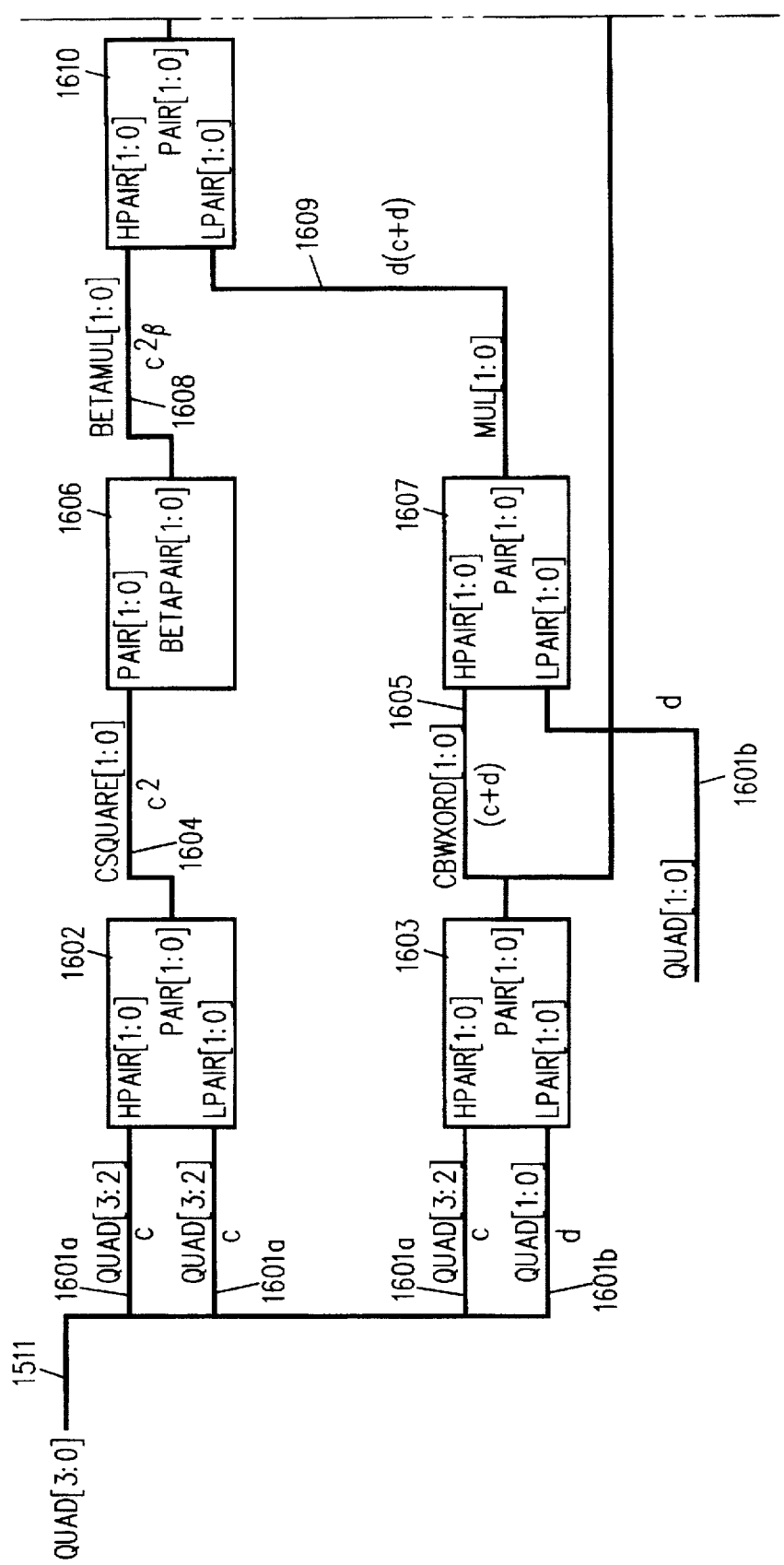
FIG. 16 is a block diagram of GF'(16) multiplicative inverse circuit 1512 in GF'(256) multiplicative inverse circuit 901 of FIG. 15, in accordance with the present invention.
Figure 16B:
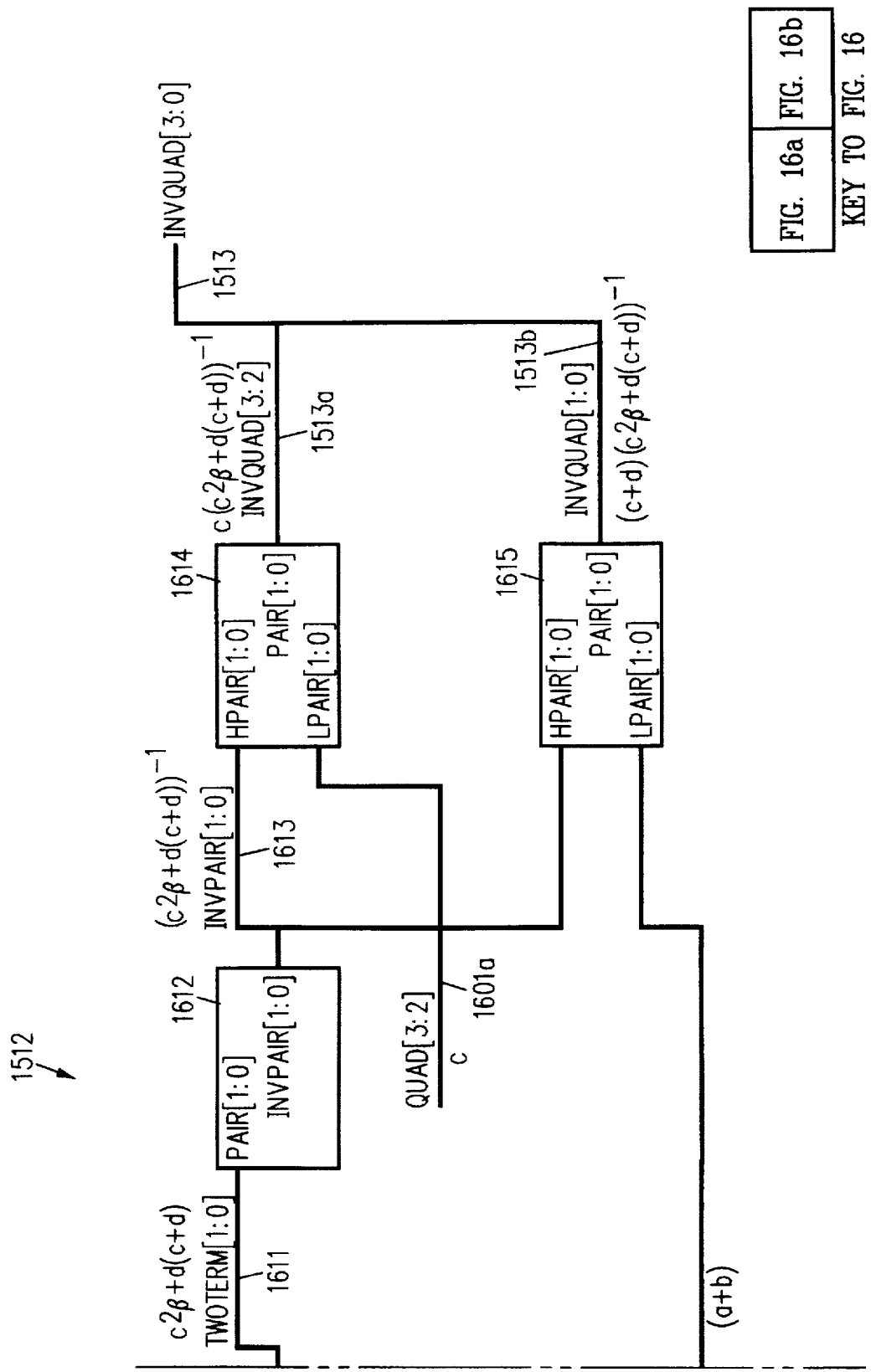

FIG. 16 is a block diagram of GF(16) multiplicative inverse circuit 1512 in GF(256) multiplicative inverse circuit 901 of FIG. 15, in accordance with the present invention. As shown in FIG. 16, GF(16) multiplicative inverse circuit 1512 receives a 4-bit datum on bus 1511. The higher and lower two bits on bus 1511, which form the two GF(4) values to represent the 4-bit value on bus 1511, are provided on busses 1601a and 1601b. GF(4) multiplier 1602 squares the 2-bit value on bus 1501a to provide a 2-bit value on bus 1604, which is then auxiliarily multiplied in auxiliary multiplier 1606 to yield a 2-bit result on bus 1608. The internal structures of an auxiliary multiplier and a GF(16) multiplier are already described above with respect to auxiliary multiplier 1110 of FIG. 13 and GF(4) multiplier 1105 of FIG. 14.

Concurrently, the 2-bit value on bus 1601a, i.e. the higher order two bits of bus 1511, is summed in summer 1603 with the 2-bit value on bus 1601b, i.e. the lower order two bits of bus 1511, to provide a 2-bit result on bus 1605. The 2-bit result on bus 1605 is then multiplied in GF(4) multiplier 1607 with the 2-bit input value on bus 1501b, to provide a 2-bit value on bus 1609. The 2-bit values on busses 1608 and 1609 are then summed in summer 1610, to provide a 2-bit value on bus 1611. The 2-bit multiplicative inverse of the 2-bit value on bus 1611 is then found by GF(4) multiplicative inverse circuit 1612. This 2-bit multiplicative inverse is provided on bus 1613, which is then multiplied to the input value on bus 1601a to provide an output value on 1513a. Simultaneously, the 2-bit values on busses 1613 and 1605 are multiplied in GF(4) multiplier 1615, to provide a 2-bit value on bus 1513b. The two 2-bit GF(4) values of busses 1513a and 1513b form the 4-bit GF(16) value output on bus 1513. Again, to assist the reader to follow the data flow, the notations c and d, c, d∈GF(4), used above in relation (7), are provided on the busses and terminals of GF(16) multiplicative inverse circuit 1512.

Figure 17:
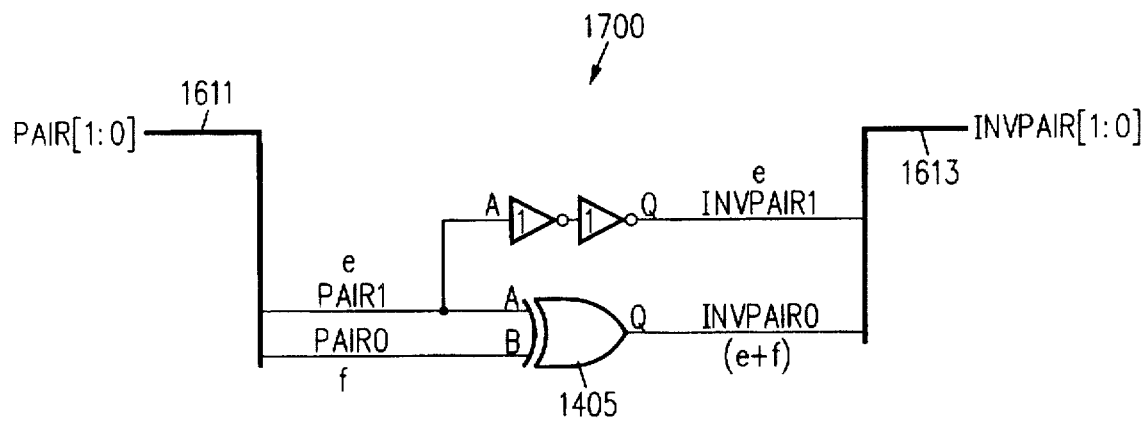
FIG. 17 is a logic circuit 1700 for GF'(4) multiplicative inverse circuit 1612 in GF'(16) multiplicative inverse circuit 1512 of FIG. 16, in accordance with the present invention.

FIG. 17 is a logic circuit 1700 for GF(4) multiplicative inverse circuit 1612 in GF(16) multiplicative inverse circuit 1512 of FIG. 16. Logic circuit 1700 is optimized by inspection of the four element Galois field GF(4).

Figure 18:
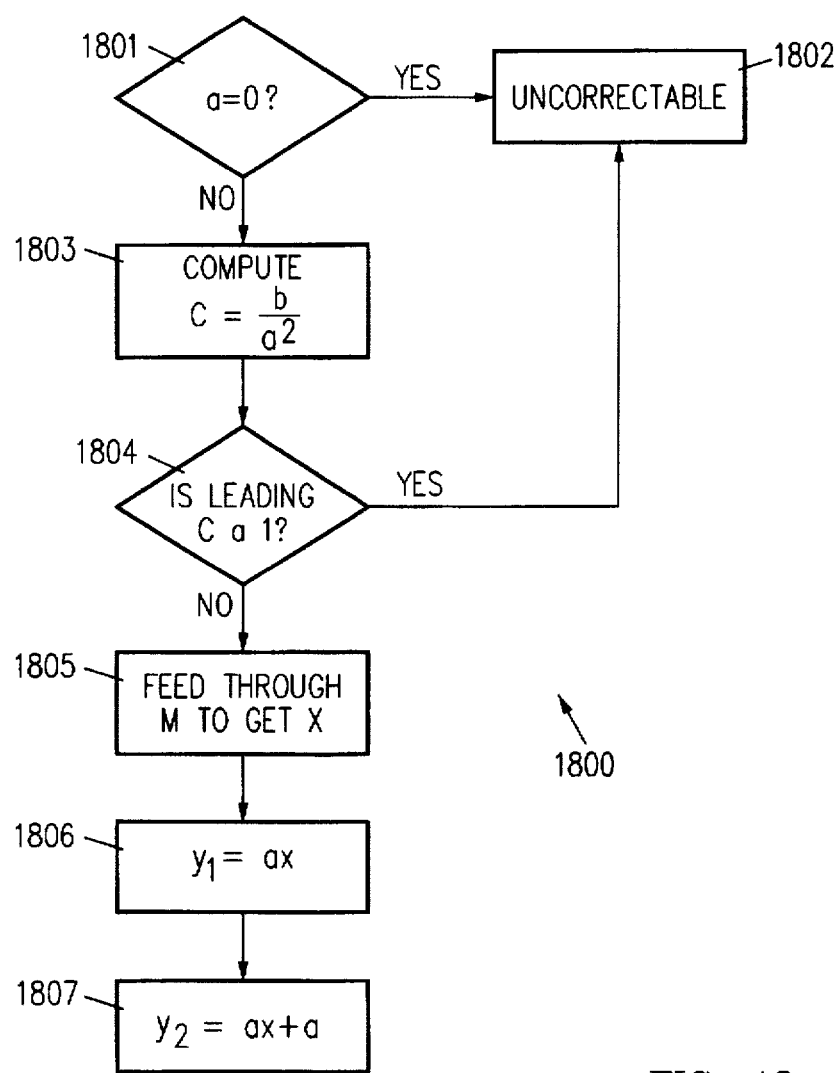
FIG. 18 is a flow diagram illustrating a method for solving a quadratic equation.

Included in arithmetic logic unit 801 is a matrix multiplier 908, which is used in a step for solving the quadratic equation $y^2+ay+b=0$. As described below, quadratic equations are solved to evaluate error values and error locations. It can be shown that the roots of the quadratic equation are $ax_0$ and $ax_0+a$, for some $x_0$. $x_0$ can be found by a table look-up method, using the 8-bit value $c=b/a^2$. Under the present embodiment, using the Galois field GF(256) of the tower representation, quadratic equation $y^2+ay+b=0$ does not have roots in the Galois field GF(256) for all values of c. In particular, if the leading bit of 8-bit value c is 1, no solution to the quadratic equation $y^2+ay+b=0$ exists in GF(256). To solve the quadratic equation $y^2+ay+b=0$, the process illustrated by FIG. 18 is used. The steps illustrated in FIG. 18 can be accomplished using the instructions in ROM 606, with the necessary arithmetic or logic operations performed by arithmetic logic unit 801. As shown in FIG. 18, at decision point 1801, the value a is tested to determine if it is a zero. If a is non-zero, then the error is determined to be uncorrectable, and procedure 1800 terminates at step 1802. Otherwise, the value c is calculated at step 1803. (As discussed above, in this embodiment, if the most significant bit of c is non-zero, a solution to quadratic equation $y^2+ay+b=0$ does not exist in GF(256)). Otherwise, the 8-bit value c is multiplied in step 1805 with a precomputed an 8×8 matrix M, implemented by matrix multiplier 908, to provide an 8-bit value $x_0$. In this multiplication, the 8-bit values $X_0$ and c are treated as 1×8 vectors (i.e. matrix multiplier 908 implements MC=X, where C and X are the 1×8 vectors, in which each element is a bit of the 8-bit value c or $x_0$). The roots $y_1$ and $y_2$ of quadratic equation $y^2+ay+b=0$ are then computed in steps 1806 and 1807, using GF(256) multiplier 903 and GF(16) summer 906.

Figure 19:
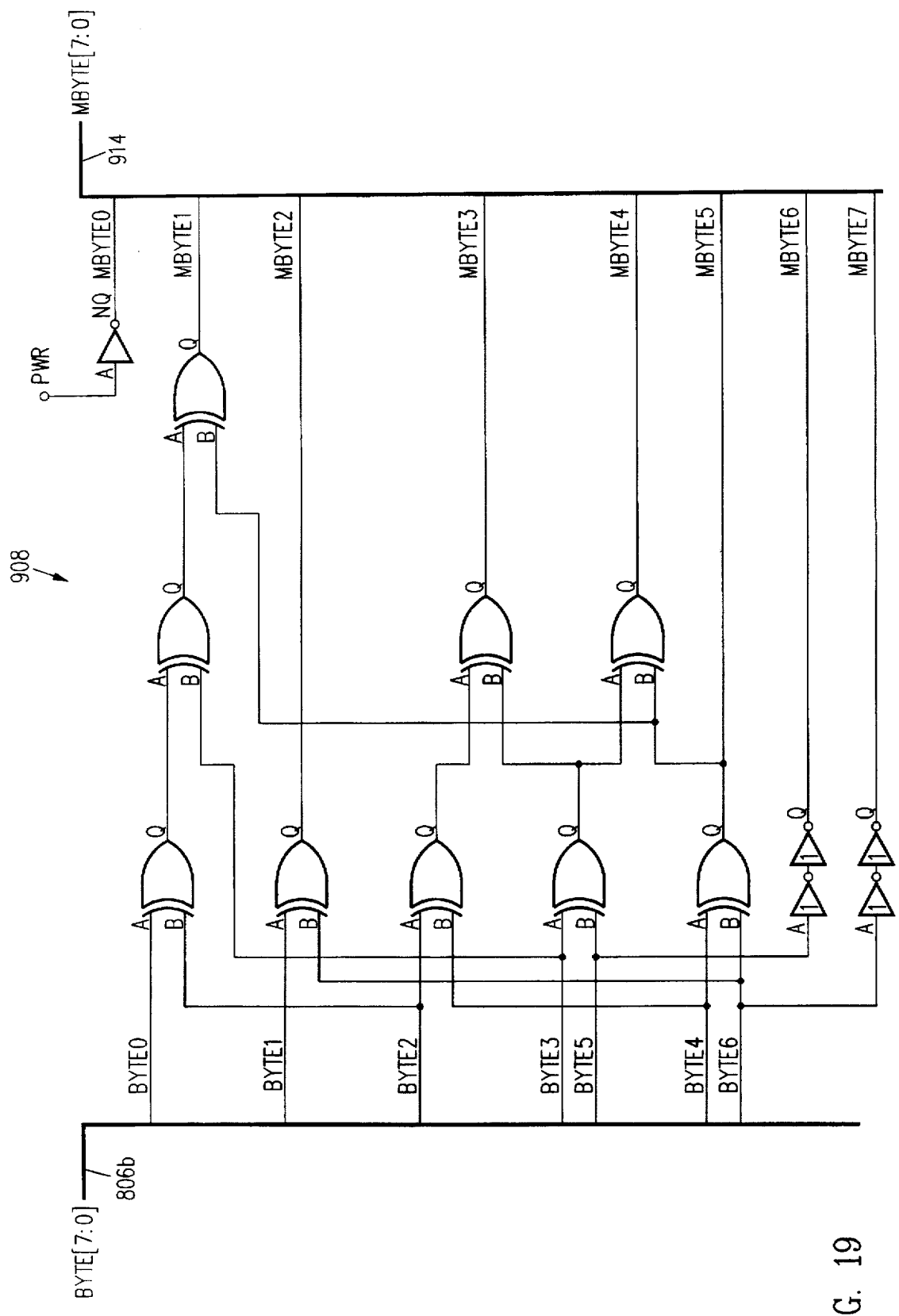
FIG. 19 is a logic circuit implementing matrix multiplier 908 of arithmetic and logic unit 801 of FIG. 8.

FIG. 19 is a logic circuit implementing matrix multiplier 908 of arithmetic and logic unit 801 of FIG. 8.

Logarithm unit 607 (FIG. 6) provides a logarithm of a GF(256). The method of logarithm unit 607 is also applicable to Galois fields under the tower representation. Logarithm unit 607 takes advantage of the following identity (9):

$$\log(a,b)=\log(a)+\log(\alpha+b/a)$$

where (a,b) ∈GF($q^2$); a, b∈GF(q), q being a power of 2, and α is a basis element of GF(16). Instead of storing a value for each (a,b) ∈GF($q^2$), only the values of log(a) and log(α+b/a) are stored. Thus, instead of a logarithm table for values in GF($q^2$), which would normally require a memory with $2^{2q}$ locations, only $2^{q+1}$ locations are necessary. The logarithm of (a,b) is provided by summing the values log(a) and log(α+b/a) in GF($q^2$). A block diagram of logarithm circuit 607 is shown in FIG. 20.

Figure 20A:
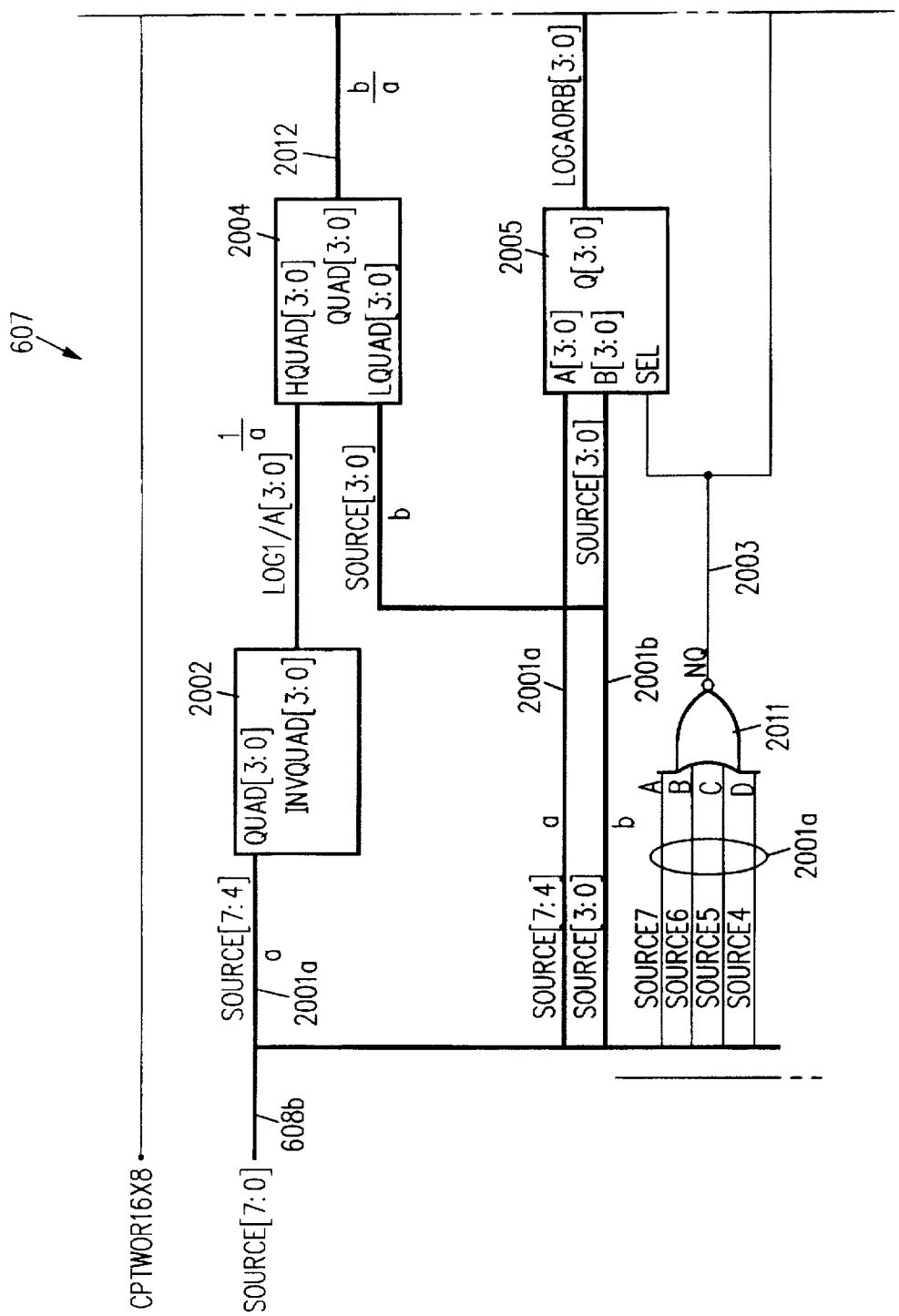
FIG. 20 is a block diagram of logarithm unit 607 of error evaluation and location unit 104.
Figure 20B:
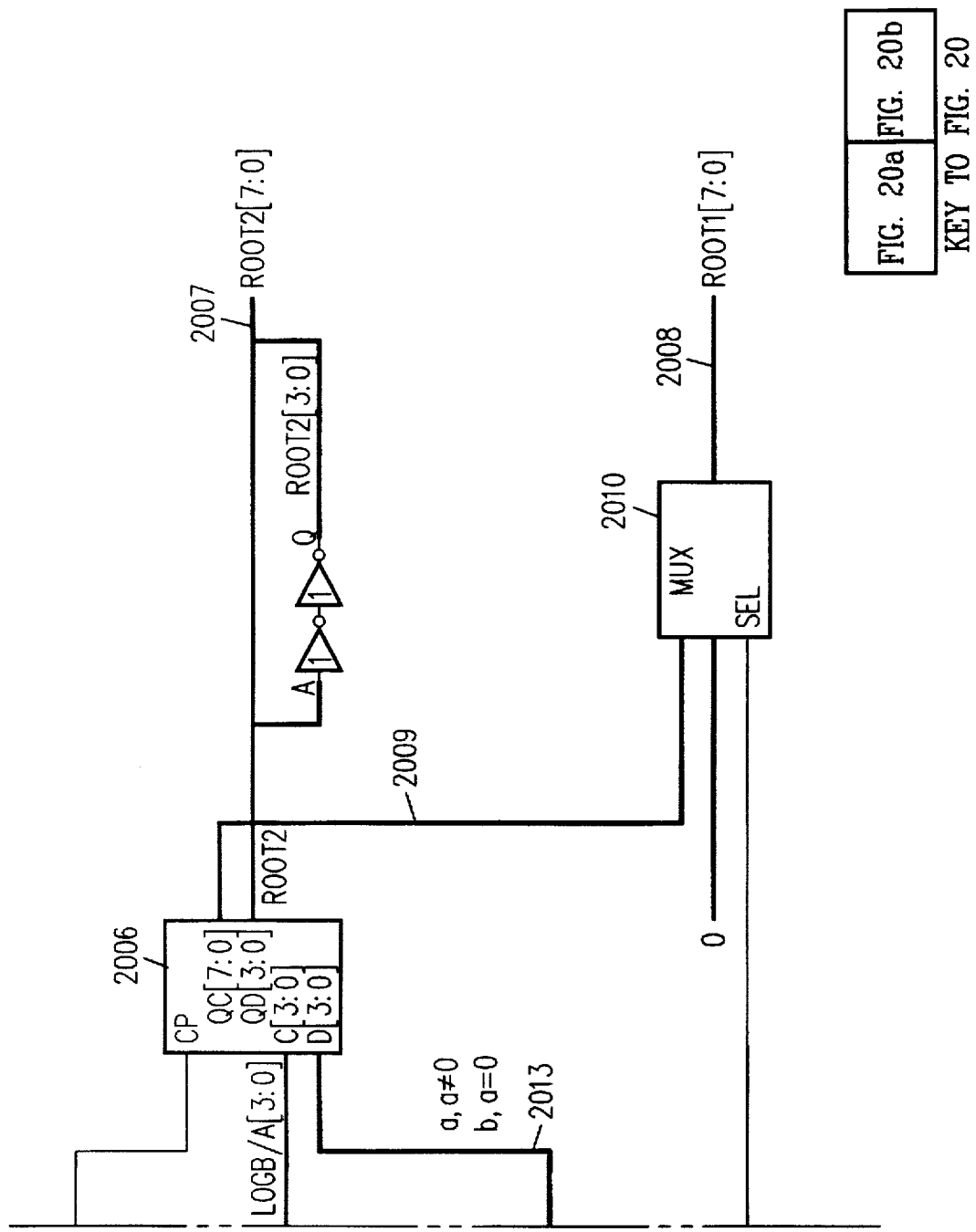

As shown in FIG. 20, logarithm circuit 607 receives an 8-bit GF(256) value on bus 608b. The most significant four bits of bus 608b are provided as 4-bit bus 2001a, and the remaining four bits are provided as 4-bit bus 2001b. The two 4-bit values on busses 2001a and 2001b are the GF(4) values representing the 8-bit GF(256) value on bus 608a. The value on bus 2001a is provided as an input value to a GF(16) multiplicative inverse circuit 2002 to provide an 4-bit output value, which is then multiplied in GF(16) multiplier 2004 to the 4-bit value of bus 2001b to provide a 4-bit output value on bus 2012. Multiplexer 2005 selects between the 4-bit values on bus 2001a and 2001b, according to the control signal at terminal 2003 output from NOR gate 2011. If the 4-bit value on bus 2001a is zero, multiplexer 2005 outputs the 4-bit value of bus 2001b onto 4-bit bus 2013. Otherwise, multiplexer 2005 outputs the 4-bit value of bus 2001b onto bus 2013. Both 4-bit values of busses 2012 and 2013 are provided to ROM 2006 to access their respective GF(256) logarithmic values, provided on output busses 2008 and 2007, respectively. The 8-bit logarithmic values on busses 2007 and 2008 are then summed (mod 256) in a GF(256) adder (not shown) to provide the logarithm value of the 4-bit value received on bus 608a. When the 4-bit value on bus 2001a is zero, multiplexer 2010 places a zero value on bus 2008. In this embodiment, since the most significant four bits of each logarithmic value is the same as its least significant four bits, only four bits of the logarithmic values are stored in ROM 2006.

Figure 21:
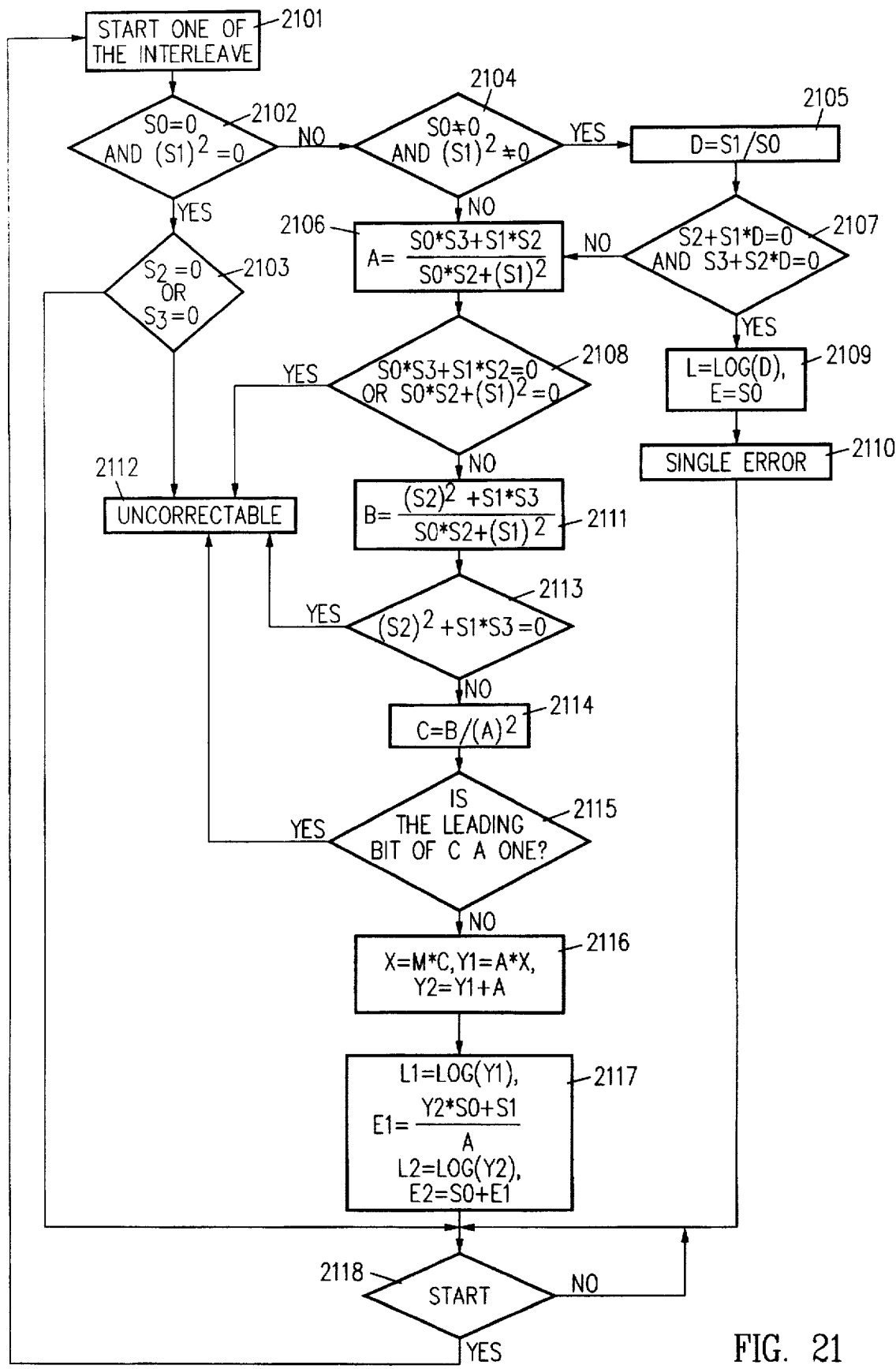
FIG. 21 is a flow diagram of the operation of error evaluation and location block 104.

To evaluate error values and locations, four syndromes $S_0$, $S_1$, $S_2$, and $S_4$ are computed per interleave. Thus, a total of twelve syndromes are provided for each Reed-Solomon code word. FIG. 21 is a flow diagram of the operation of error evaluation and location block 104. As shown in step 2101 of FIG. 21, for each interleave, the values of syndrome $S_0$ and the square of syndrome $S_1$ are tested if they are each zero. If both the values of syndrome $S_0$ and the square of syndrome $S_1$ are zero, the values of $S_2$ and $S_3$ are then checked at step 2103. If both $S_2$ and $S_3$ are then found to be zero, no error is found in the interleave and the syndromes of the next interleave are checked (i.e. returning to step 2101 via step 2118). The process continues until all interleaves are checked. At step 2102, if either the value $S_0$ or the value $S_1^2$ are non-zero, step 2104 checks if both $S_0$ and $S_1^2$ are non-zero. If both $S_0$ and $S_1^2$ are non-zero, at step 2105, the value $D=S_1/S_0$ is computed. If either $S_0$ or $S_1^2$ is zero, then step 2106 is taken. At step 2105, the computed value D is then used to check, at step 2107, if the conditions $S_2+S_1*D=0$ and $S_3+S_2*D=0$ are satisfied. If the conditions at step 2107 are satisfied, a single error is encountered. Error location is then provided by the value log(D), and the corresponding error value of this error is $S_0$. Otherwise, if the conditions at step 2107 are not satisfied, step 2106 is taken.

At step 2106, a value "a" is computed according to the equation:

$$a = \frac{S_0*S_3 + S_1*S_2}{S_0*S_2 + (S_1)^2}$$

At step 2108, if the values of $S_0$–$S_3$ satisfy either one of the following equations, an uncorrectable error has occurred:

$$S_0*S_3+S_1*S_2=0$$
$$S_0*S_2+(S_1)^2=0$$

A value of "b" is then computed at step 2111 according to:

$$b = \frac{(S_2)^2 + S_1*S_3}{S_0*S_2 + (S_1)^2}$$

At step 2113, the value $(S_2)^2+S_1*S_3=0$ is checked if it is equal to zero. If the value is zero, a value "c" defined by the following equation is computed at step 2114:

$$c=b/a^2$$

At step 2115, the leading bit of the value c is then tested. If this leading bit is non-zero, in accordance with our data representation, an uncorrectable error is detected. Otherwise, as discussed above, matrix multiplier 908 is used to obtain the value of $x_0$, and the roots $y_1$ and $y_2$ of the quadratic equation $y^2+ay+b=0$. At step 2117, the error locations corresponding to roots are provided by $L_1=\log(y_1)$ and $L_2=\log(y_2)$ and the corresponding error values are provided by $$E_1 = \frac{y_2*S_0 + S_1}{a}$$

and $E_2=S_0+E_1$. The steps of the process of FIG. 21 are performed until all error values and locations of all interleaves are computed. The error values and error locations are stored in holding registers 105.

After the error values and locations are computed, burst-limiting and error corrections are performed. Burstlimiting and error corrections are performed by burstlimiter 103. Burstlimiter 103 includes a binary arithmetic unit, which is controlled by a state machine provided by a ROM and an instruction decode unit. The state machine of burstlimiter 103 operates under the processes described below in conjunction with the flow diagrams of FIGS. 22, 23a and 23b. The state machine and the binary arithmetic unit in burstlimiter 103 are provided by random logic circuits.

Figure 22:
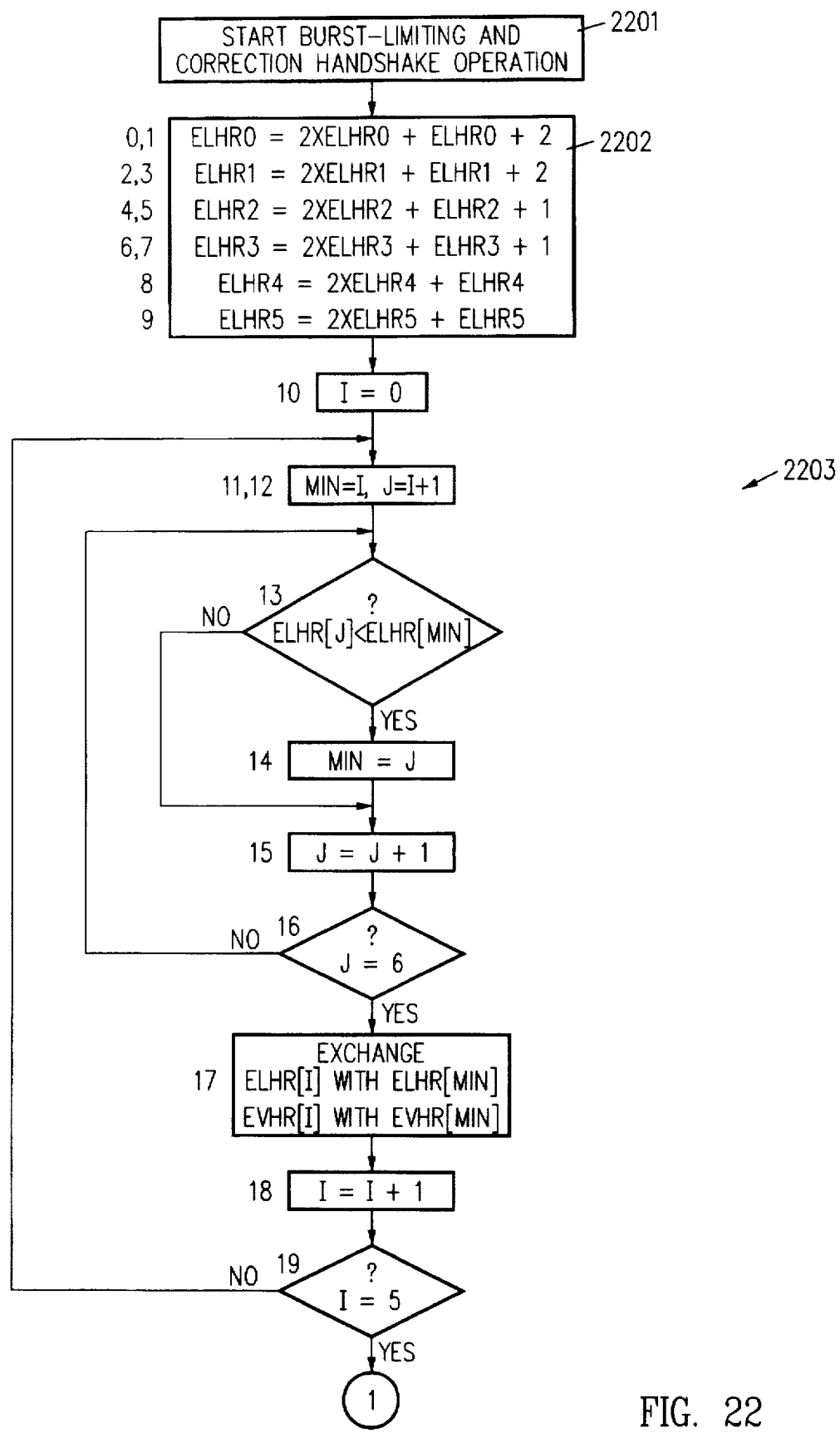
FIG. 22 is a flow diagram showing a process for (a) converting error locations within each interleave to error locations relative to the beginning of the check symbol field in a 1024-byte sector; and (b) sorting the error locations in ascending order.
Figure 23A:
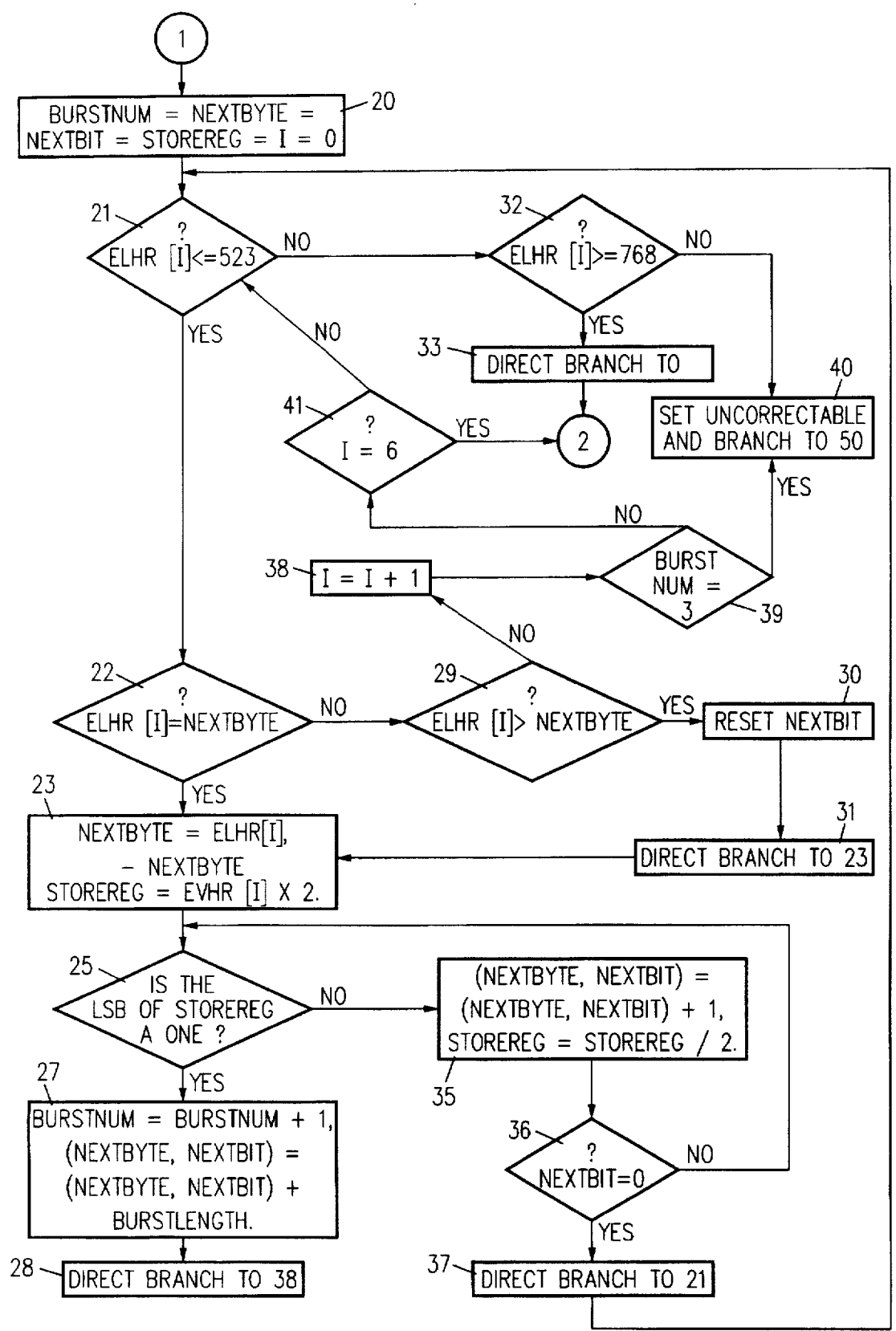
FIG. 23a and 23b together form a flow diagram showing a process for the burstlimiting and error correction operations of burstlimiter 103.
Figure 23B:
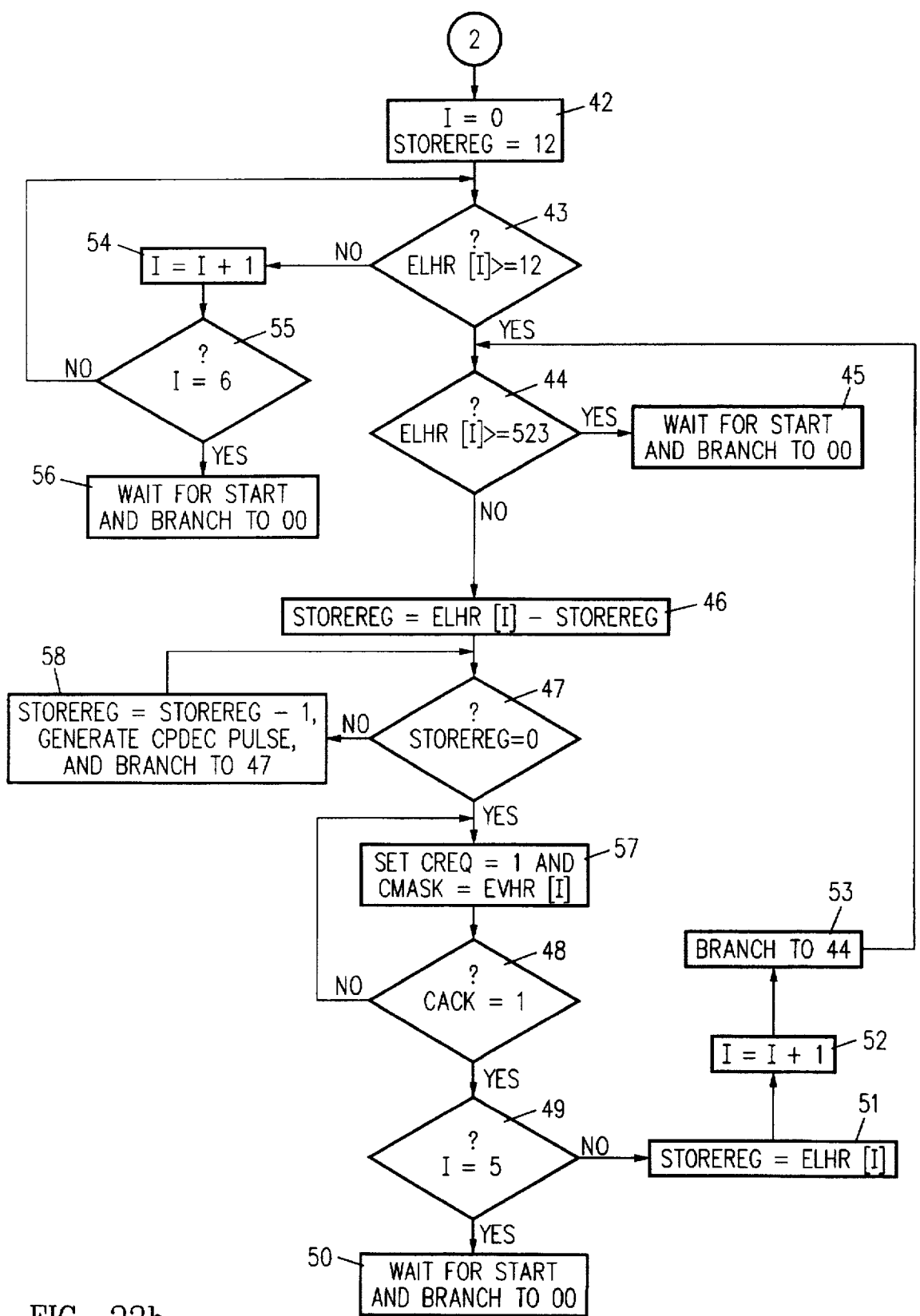
Figure 24:
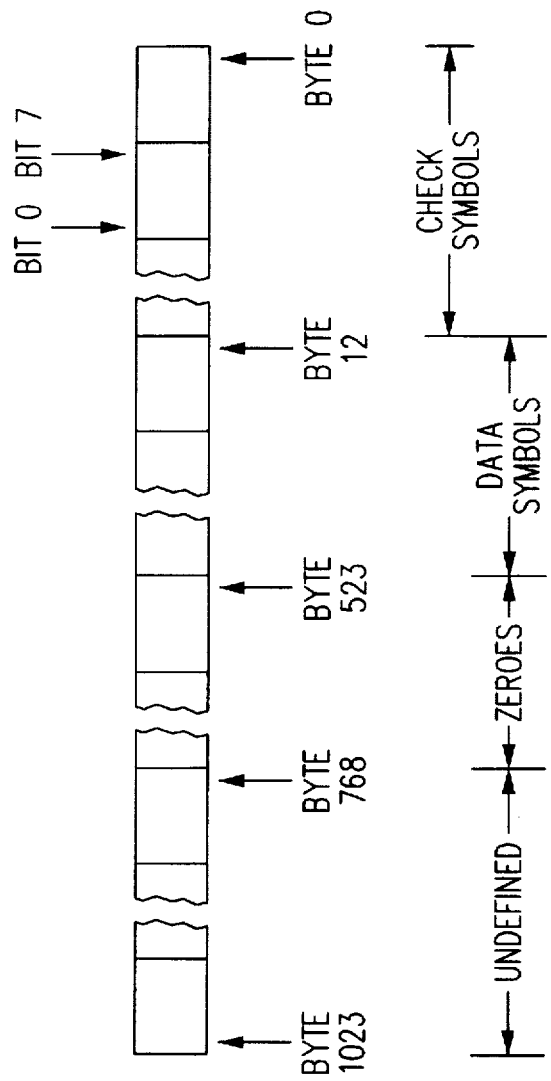
FIG. 24 shows byte positions and bit positions as numbered in the descriptions of the processes shown in FIGS. 23a and 23b.

Error locations computed in accordance of the process of FIG. 21 are provided as locations within each interleave. FIG. 22 is a flow diagram showing a process for (a) converting error locations within each interleave to error locations relative to the beginning of the check symbol field in a 1024-byte sector; and (b) sorting the error locations in ascending order. The process of FIG. 2 prepares the data for the burstlimiting functions of burstlimiter 103. As shown in FIG. 22, to provide such error locations with respect to the 1024-byte sector, as enumerated from the beginning of the check symbol field, each error location is multiplied by three and an appropriate offset (i.e. 0, 1 or 2) is added to each error location, according to the interleave in which the error is located (step 2202). (See FIG. 24 regarding the position enumeration scheme used in this description). The error locations are then sorted in ascending order for the application of the burstlimiting and error correction procedures discussed below with respect to FIGS. 23a and 23b. The error locations can be sorted by any sorting algorithm. FIG. 23 shows, for example, as indicated generally by reference numerals 2203, a conventional "bubble sort" algorithm.

FIGS. 23a and 23b together form a flow diagram showing the burstlimiting and error correction operations of burstlimiter 103. As shown in FIG. 23a, at step 20, the variables BURSTNUM, NEXTBYTE and NEXTBIT, STOREREG and I are initialized to zero. BURSTNUM is a running count of the number of burst errors found. NEXTBYTE is a running pointer to the next error location. NEXTBIT is a running pointer pointing to a bit within an 8-bit data symbol. The combination of NEXTBYTE and NEXTBIT identifies the bit in the 1024-byte sector currently being examined. STOREREG is a temporary variable for error location computation. I is a index pointer pointing to one of the six error location registers in holding registers 105. Prior to step 1 of the process shown in FIG. 23a, the error locations have been provided in ascending order of index pointer I by the sorting step 2203 of FIG. 22. In the description below, byte positions and bit positions are numbered in the manner shown in FIG. 24.

Returning to FIG. 23a, at step 21, the value in the next error location (i.e. the value in the error location register in holding registers 105, which is pointed to by index pointer I), is compared to the value 523. In this embodiment, in a 1024-byte sector, bytes 0 to 523 are the data and check symbols of the Reed-Solomon code word, and bytes 524 to 768 are provided zeroes. If the next error location is greater than 523, then step 23 examines if this next error location is greater than 768. If this next error location is greater than 768, which is a preset value to signal that the current error location register does not contain an error location, the error correction procedure, beginning at step 2 of FIG. 23b, can begin (step 33). Otherwise, the next error location, which is a value between 523 and 768, indicates an uncorrectable error has occurred. An alternative error handling procedure, such as re-reading the 1024-byte sector, can then be initiated by the disk-drive controller, which incorporates integrated circuit 100 of the present embodiment, to remedy the uncorrectable error. Step 40 indicates a jump to step 50 (FIG. 23b), which is a termination of the present burstlimiting and error correction procedure.

If the next error location is less than 523, as determined by step 21, the next error location is compared to the NEXTBYTE variable (steps 22 and 23). If the next error location is less than NEXTBYTE (i.e. the current byte), a condition which is explained below, index pointer I is incremented so as to set the next error location to the value in the next higher error location register. The variable BURSTNUM is then checked if the maximum allowable number of burst errors, which is two in the present embodiment, is exceeded. An uncorrectable error is deemed to have occurred if BURSTNUM exceeds two. Otherwise, if the index pointer I equals 6, indicating that all error locations have been examined, the process jumps to step 2 of FIG. 23b. Step 2 is the beginning of the error correction process.

At step 23, if the NEXTBYTE variable is at the error location, the process jumps to step 23. If the NEXTBYTE variable is less than the next error location, the variable NEXTBIT is reset to zero (step 30) and the process jumps (step 31) to step 23. At step 23, the variable NEXTBYTE is set to the next error location, and the STOREREG variable receives the error value at the next error location right-shifted by the value of the variable NEXTBIT. At step 25, the least significant bit (LSB) of the variable STOREREG is tested. If this LSB is set, representing an error at the NEXTBIT position of NEXTBYTE, a burst error is deemed to have occurred. At step 27, the variable BURSTNUM is incremented, and the variables NEXTBYTE and NEXTBIT are set to the position offset from the current position by the programmable single burst length. In the present invention, the single burst length is a user-programmable value from 1 to 17. If another error occurs within this burst length, the condition that NEXTBYTE is greater than the error location pointed to by the next higher value of index pointer I is created. From step 27, the process jumps to step 38 to increment index pointer I.

At step 25 above, if the LSB of STOREREG is not set, i.e. the current bit is not an error bit, the next error bit is searched by incrementing the variable NEXTBIT (step 35) and right-shifting the variable STOREREG. If NEXTBIT is incremented to zero, the variable NEXTBYTE is incremented, so that (NEXTBYTE, NEXTBIT) points to the most significant bit at the new value of NEXTBYTE. The process then branches to step 21 to allow examination of the next error location. If NEXTBIT is not zero, the search for an error bit at NEXTBYTE is continued by the process returning to step 25.

After all error locations are examined, i.e. at step 2, the error correction process begins. At this time, the data field of the Reed-Solomon code word is read into a buffer, with a buffer pointer pointing to the beginning of the data field. From step 2, the process proceeds to step 42 where the index pointer I is zeroed and variable STOREREG is initialized to position 12 to point to the beginning of the data field (see FIG. 24). If the next error location is found to be between 12 and 523 (steps 43 and 44), i.e. within the data field of the current Reed-Solomon code word, the buffer pointer is reset to point to the next error location (steps 46, 47 and 58). If the next error location is found to be less than 12, the error is ignored and the index pointer I is incremented (step 54) to point to the next error location, unless index pointer I equals 6 (step 55), which indicates that all errors in the data field of the current Reed-Solomon code word have been corrected. The process then terminates (step 56) until the next 1024-sector is accessed. Likewise, when the next error location is found to be outside of the data field (step 45), the process of FIG. 23b terminate.

When the buffer pointer is set to the next error location (i.e. after completing steps 46, 47 and 58), the error value corresponding to the error location is exclusive-ORed into the value pointed to by the buffer pointer to correct the error at the error location (steps 48, 57). In this embodiment, a control signal CREQ is asserted to initiate an error correction (step 57). Acknowledgement signal CACK is asserted when the correction is completed (step 48). The process of FIG. 23b terminates when the value at the last error location is corrected (step 50). Otherwise, the variable STOREREG is set to the next error location, index pointer I is incremented (step 52) and the process returns to step 44 (step 53).

The above detailed description is provided to illustrate the specific embodiments of the present invention and is not intended to be limiting. Numerous variations and modifications within the scope of the present invention are possible. The present invention is defined by the claims set forth below.

We claim:

1. A system for encoding and decoding data using Reed-Solomon code, comprising:

a decoding circuit receiving a stream of encoded data, said stream of encoded data including Reed-Solomon code words encoded over a $GF(q^4)$ finite Galois field, where q can be expressed as $2^n$, n being an integer which is a power of 2, and wherein each element of said $GF(q^4)$ is representable by a first element and a second element of a $GF(q^2)$ finite Galois field, said $GF(q^2)$ finite Galois field being encoded over a $GF(q)$ finite Galois field, and wherein each element of said $GF(q^2)$ is representable by a first element and a second element of a $GF(q)$ finite Galois field, said decoding circuit computing a plurality of syndromes corresponding to said Reed-Solomon code words;

an error value and location circuit, coupled to said decoding circuit to receive said plurality of syndromes, said error value and location circuit computing an error value and an error location from said plurality of syndromes; and a control circuit, coupled to said decoding unit and said error value and location circuit, said control circuit including a state machine for controlling operations of said decoding circuit and said error value and location circuit.

2. A system as in claim 1, further including a burstlimiter circuit for limiting computation of said error value and error location to a predetermined number of burst errors and a user-programmable burst length.

3. A system as in claim 1, wherein said error value and location circuit performs arithmetic operations over said $GF(q^2)$ finite Galois field using logic circuits for arithmetic operations over said GF(q) finite Galois field.

4. A system as in claim 3, said error value and location circuit comprising a multiplier over said $GF(q^2)$ finite Galois field which includes a multiplier over said GF(q) finite Galois field.

5. A system as in claim 3, said error value and location circuit comprising a multiplicative inverse circuit over said $GF(q^2)$ finite Galois field which includes a multiplicative inverse circuit over said GF(q) finite Galois field.

6. A system as in claim 3, said error value and location circuit comprising a $GF(q^2)$ logarithm circuit over said $GF(q^2)$ finite Galois field which includes a circuit for obtaining logarithm values of said GF(q) finite Galois field.

7. A system as in claim 3, wherein q equals 256, such that said $GF(q^2)$ finite Galois field can be represented by $GF(16)=\{x|x=a\gamma+b;a,b\in GF(4)\}$, where $\delta$ is a basis element of said GF(256) finite Galois field in which $\delta^2+\delta+\epsilon=0$, and $\epsilon=\beta\gamma+\gamma$, for some $\gamma$ and $\beta$ belonging to a GF(16) finite Galois field and a GF(4) finite Galois field respectively.

8. A system as in claim 7, wherein said error value and location circuit comprising a multiplier over said GF(256) finite Galois field which includes a multiplier over said GF(16) finite Galois field.

9. A system as in claim 4, wherein said multiplier over said $GF(q^2)$ finite Galois field receives first and second operands to provide a $GF(q^2)$ product, both of said first and second operands being elements of said $GF(q^2)$ finite Galois field, said multiplier over said $GF(q^2)$ finite Galois field comprises:

a first GF(q) summer, receiving said first operand, providing a first sum, said first sum being a sum of said first and second elements of said first operand;

a second GF(q) summer, receiving said second operand, providing a second sum, said second sum being a sum of said first and second elements of said second operand;

a first GF(q) multiplier, receiving said second element of said first operand and said second element of said second operand, providing a first GF(q) multiplicative result, said GF(q) multiplicative result being the product of said second element of said first operand and said second element of said second operand;

a second GF(q) multiplier, receiving said first element of said first operand and said first element of said second operand, providing a second GF(q) multiplicative result, said second GF(q) multiplicative result being the product of said first element of said first operand and said first element of said second operand;

an auxiliary multiplier, receiving said second multiplicative result, for providing a third multiplicative result;

a third GF(q) multiplier, receiving said first and second sum, providing a fourth multiplicative result, said fourth multiplicative result being a product of said first and second sum;

a third GF(q) summer, receiving said first and third multiplicative results, providing a third sum, said third sum being a sum of said first and third multiplicative results; and a fourth GF(q) summer, receiving said third and fourth multiplicative results, providing a fourth sum, said fourth sum being a sum of said third and fourth multiplicative results, said fourth sum and said third sum being said first and second elements, respectively, of said $GF(q^2)$ product.

10. A system as in claim 9, wherein said q is 256, and wherein said auxiliary multiplier has a '1' as its most significant bit.

11. A system as in claim 9, wherein said q is 16, and wherein said auxiliary multiplier has a bit value of '1' as its most significant bit.

12. A system as in claim 5, wherein said $GF(q^2)$ multiplicative inverse circuit receives an operand and provides a $GF(q^2)$ multiplicative inverse of said operand, said $GF(q^2)$ multiplicative inverse circuit comprises:

a first GF(q) multiplier, receiving said first element of said operand, providing a first multiplicative result, said first multiplicative result being a square of said first element of said operand;

an auxiliary multiplier, receiving said first multiplicative result, for providing a second multiplicative result;

a first GF(q) summer, receiving said first and second elements of said operand, providing a first sum, said first sum being a sum of said first and second elements of said operand;

a second GF(q) multiplier, receiving said first sum and said second element of said operand, providing a third multiplicative result, said third multiplicative result being a product of said second element of said operand and said first sum;

a second GF(q) summer, receiving said second and third multiplicative result, providing a second sum, said second sum being a sum of said second and third multiplicative results;

a GF(q) multiplicative inverse circuit, receiving said second sum, providing a GF(q) multiplicative inverse of said second sum;

a third GF(q) multiplier, receiving said GF(q) multiplicative inverse of said second sum and said first element of said operand, providing a fourth multiplicative result, said fourth multiplicative result being a product of said GF(q) multiplicative inverse of said second sum and said first element of said operand; and a fourth GF(q) multiplier, receiving said first sum and said GF(q) multiplicative inverse of said second sum, to provide a fifth multiplicative result, said fifth multiplicative result being a product of said first sum and said GF(q) multiplicative inverse of said second sum, said fourth multiplicative inverse and said fifth multiplicative inverse form said first and second elements of said $GF(q^2)$ multiplicative inverse of said operand.

13. A system as in claim 12, wherein said q is 256, and wherein said auxiliary multiplier has a bit value of '1' as its most significant bit.

14. A system as in claim 12, wherein said q is 16, and wherein said auxiliary multiplier has a bit value of '1' as its most significant bit.

15. A system as in claim 6, said $GF(q^2)$ logarithm circuit receiving said first and second elements of said operand to provide a $GF(q^2)$ logarithm of said operand, said $GF(q^2)$ logarithm circuit comprising:

a GF(q) multiplicative inverse circuit, receiving said first element of said operand, providing a GF(q) multiplicative inverse of said first element of said operand;

a GF(q) multiplier, receiving said GF(q) multiplicative inverse of said first element of said operand and said second element of said operand, providing a multiplicative result, said multiplicative result being a product of said GF(q) multiplicative inverse of said first element of said operand and said second element of said operand;

a GF(q) logarithmic circuit, receiving said multiplicative result and second element of said operand, for providing a first GF(q) logarithm value, corresponding to the logarithmic value of a sum of said multiplicative result and a basis element of said GF(q) finite Galois field, and a second GF(q) logarithmic value, corresponding to the logarithmic value of said second element of said operand, said first and second GF(q) logarithmic values being said first and second element of said GF($q^2$) logarithmic value, respectively.

16. A system as in claim 15, wherein said GF(q) logarithm circuit comprises a look-up table of precomputed values of said first and second GF(q) logarithmic values.

17. A system as in claim 15, wherein said GF($q^2$) logarithm circuit provides said first and second GF(q) values zero and the logarithmic value of said second element of said operand.

18. A system as in claim 3, further comprising a quadratic equation solver for a quadratic equation $y^2+ay+b=0$ in a finite Galois field, where a and b are elements of said finite Galois field, said quadratic equation solver comprises:

a first logic circuit, said first logic circuit calculating a characteristic value equal to $b/a^2$; and a second logic circuit, receiving said characteristic value, said second logic circuit mapping said characteristic value to an output value $x_0$, wherein $ax_0$ and $ax_0+a$ are roots of said quadratic equation.

19. A system as in claim 18, said quadratic equation solver further comprising a circuit for testing the most significant bit of said characteristic value, said circuit asserting a signal to indicate that a solution for said quadratic equation does not exist when the most significant bit of said characteristic value is non-zero.

* * * * *